US012752315B2

(12) United States Patent
Taniguchi et al.

(10) Patent No.: US 12,752,315 B2
(45) Date of Patent: Oct. 6, 2026

(54) SUBSTRATE PROCESSING SYSTEM

(71) Applicant: SCREEN Holdings Co., Ltd., Kyoto (JP)

(72) Inventors: Shinichi Taniguchi, Kyoto (JP); Akihiro Iwasaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 70 days.

(21) Appl. No.: 18/961,980

(22) Filed: Nov. 27, 2024

(65) Prior Publication Data

US 2025/0170619 A1 May 29, 2025

(30) Foreign Application Priority Data

Nov. 29, 2023 (JP) ................................ 2023-202102

(51) Int. Cl.
*B08B 3/04* (2006.01)
*H10P 72/00* (2026.01)
*H10P 72/30* (2026.01)

(52) U.S. Cl.
CPC .......... *B08B 3/041* (2013.01); *H10P 72/0416* (2026.01); *H10P 72/32* (2026.01)

(58) Field of Classification Search
CPC .................................................. H10P 72/0416
See application file for complete search history.

(56) References Cited

U.S. PATENT DOCUMENTS

2010/0215461 A1 8/2010 Kamikawa et al.
2020/0135501 A1 4/2020 Hsu et al.
2022/0172966 A1 6/2022 Choi et al.
2023/0015936 A1 1/2023 Hamashima et al.
2024/0234160 A1 7/2024 Magara
2024/0234189 A1 7/2024 Takahashi
2025/0054783 A1 2/2025 Nagamatsu et al.

FOREIGN PATENT DOCUMENTS

CN 111477561 A 7/2020
JP 2021-064654 A 4/2021
JP 2023-012604 A 1/2023
(Continued)

OTHER PUBLICATIONS

Office Action dated Aug. 26, 2025, issued in corresponding Korean Patent Application No. 10-2024-0172006.
(Continued)

*Primary Examiner* — Jason Y Ko
(74) *Attorney, Agent, or Firm* — OSTROLENK FABER LLP

(57) ABSTRACT

A substrate processing system including a rotation mechanism that controls a lifter to collectively immerse a plurality of substrates whose orientation has been changed into a vertical orientation in a batch processing tank to perform first batch processing, controls the lifter to collectively immerse the plurality of substrates whose orientation has been changed into the vertical posture in the batch processing tank to perform second batch processing, and rotates the substrates about a normal line of the substrates, wherein, after the first batch processing and before the second batch processing, the rotation mechanism is controlled such that the second batch processing is performed with the orientation of the substrates being vertically inverted with respect to the orientation of the substrates in the first batch processing.

15 Claims, 40 Drawing Sheets

(56) References Cited

FOREIGN PATENT DOCUMENTS

| | | | |
|---|---|---|---|
| JP | 2023-142023 | A | 10/2023 |
| KR | 10-2022-0076279 | A | 6/2022 |
| KR | 10-2022-0112438 | A | 8/2022 |
| TW | 202301454 | A | 1/2023 |
| TW | 202303735 | A | 1/2023 |
| TW | 202331909 | A | 8/2023 |
| WO | WO 2023/120229 | A1 | 6/2023 |

OTHER PUBLICATIONS

Extended European Search Report dated Jun. 6, 2025 issued in corresponding European Patent Application No. 24215586.9.
Office Action dated Sep. 4, 2025, issued in corresponding Taiwan Patent Application No. 113146202.
Notice of Allowance dated May 4, 2026 for corresponding Korean Patent Application No. 10-2024-0172006.

SUBSTRATE PROCESSING SYSTEM

BACKGROUND OF THE INVENTION

The present invention relates to a substrate processing system for processing various substrates such as semiconductor substrates, substrates for flat panel displays (FPD) including liquid crystal displays and organic electroluminescence (EL) display devices, glass substrates for photomasks, and substrates for optical disks.

DESCRIPTION OF THE RELATED ART

As this type of device, there has conventionally been a device including a batch type module and a single wafer type module (see, for example, JP 2021-64654 A). The batch type module collectively performs predetermined processing on a plurality of substrates. The single wafer type module performs predetermined processing on substrates one by one. Each of the batch type module and the single wafer type module has unique advantages. The substrate processing device including the batch type module and the single wafer type module have both the advantages, and thus, a configuration having advantages over a batch type substrate processing device or a single wafer type substrate processing device is realized.

LIST OF DOCUMENTS

JP2021-64654

However, the above configuration has a problem in the batch type module. The batch type module has a configuration in which substrates in a vertical orientation are immersed in a batch processing tank. With this configuration, a difference is formed in the batch processing between a lower portion of the substrate positioned at a bottom of the batch processing tank and an upper portion of the substrate positioned at the water surface portion of the batch processing tank, and unevenness is formed in the substrates.

The present invention has been made in view of such circumstances, and an object thereof is to provide a substrate processing system capable of producing a high-quality substrate.

SUMMARY OF THE INVENTION

To solve the above problem, the present invention has the following configurations.

That is, the present invention is a substrate processing system that performs substrate processing, the substrate processing system including: a batch processing device that performs batch processing of collectively processing a plurality of substrates; a single wafer processing device that performs single wafer processing of processing the substrates one by one; a relay device that conveys the substrates for which the batch processing has been completed from the batch processing device to the single wafer processing device; and a controller that controls the batch processing device, the single wafer processing device, and the relay device, wherein the batch processing device includes: at least one batch processing tank; a first placement unit capable of placing a carrier that stores the plurality of substrates in a horizontal orientation at predetermined intervals in a vertical direction; a substrate acquisition and conveyance mechanism that takes out the substrates from the carrier placed on the first placement unit; a first orientation changing mechanism that changes an orientation of the substrates taken out from the carrier by the substrate acquisition and conveyance mechanism from the horizontal orientation to a vertical orientation; and a lifter that can collectively immerse, in the batch processing tank, the plurality of substrates whose orientation has been changed into the vertical orientation by the first orientation changing mechanism, the single wafer processing device includes: a single wafer drying unit that can dry, one by one, the substrates in the horizontal orientation for which the batch processing has been completed; a second placement unit on which the carrier can be placed; and a storage and conveyance mechanism that loads the substrates in the horizontal orientation into the carrier placed on the second placement unit, the relay device includes: a second orientation changing mechanism that changes the orientation of the substrates received from the batch processing device from the vertical orientation to the horizontal orientation; and a relay conveyance mechanism capable of conveying the substrates whose orientation has been changed into the horizontal orientation by the second orientation changing mechanism to the single wafer processing device one by one, the controller: (1) controls the substrate acquisition and conveyance mechanism to take out the substrates from the first carrier placed on the first placement unit; (2) controls the first orientation changing mechanism to change the orientation of the substrates taken out from the first carrier from the horizontal orientation to the vertical orientation; (3) controls the lifter to collectively immerse, in the batch processing tank, the plurality of substrates whose orientation has been changed into the vertical orientation and perform first batch processing; (4) controls the second orientation changing mechanism to change the orientation of the substrates for which the first batch processing has been performed from the vertical orientation to the horizontal orientation; (5) controls the relay conveyance mechanism to convey the substrates whose orientation has been changed into the horizontal orientation from the batch processing device to the single wafer processing device; (6) controls the storage and conveyance mechanism to load the substrates in the horizontal orientation conveyed to the single wafer processing device into a second carrier placed on the second placement unit; (7) when the second carrier storing the substrates for which the first batch processing has been performed is placed on the first placement unit of the batch processing device, controls the substrate acquisition and conveyance mechanism to take out the substrates from the second carrier placed on the first placement unit; (8) controls the first orientation changing mechanism to change the orientation of the substrates taken out from the second carrier from the horizontal orientation to the vertical orientation; (9) controls the lifter to collectively immerse, in the batch processing tank, the plurality of substrates whose orientation has been changed into the vertical orientation and perform second batch processing; (10) controls the second orientation changing mechanism to change the orientation of the substrates for which the second batch processing has been performed from the vertical orientation to the horizontal orientation; (11) controls the relay conveyance mechanism to convey the substrates whose orientation has been changed into the horizontal orientation from the batch processing device to the single wafer processing device; (12) controls the single wafer drying unit to dry, one by one, the substrates in the horizontal orientation conveyed to the single wafer processing device; and (13) controls the storage and conveyance mechanism to perform a series of operations of loading the substrates in the horizontal orientation for which the drying processing has been performed into a third carrier placed on the second placement unit, the substrate processing system further includes a rotation mechanism that rotates the substrates around a normal line of the substrates, and the controller controls, after the first batch processing and before the second batch processing, the rotation mechanism to perform the second batch processing with the orientation of the substrates being vertically inverted with respect to the orientation of the substrates in the first batch processing.

[Operation and Effect] According to the above configuration, the controller controls the storage and conveyance mechanism to store the substrates for which the first batch processing has been completed in the second carrier. Then, the controller controls the substrate acquisition and conveyance mechanism to take out the substrates from the second carrier and perform the second batch processing. At this time, the controller controls the rotation mechanism to vertically invert the substrates before the second batch processing. With this configuration, the difference in the batch processing occurring between the lower portion of the substrate positioned at the bottom of the batch processing tank and the upper portion of the substrate positioned at the water surface portion of the batch processing tank is homogenized, and thus it is possible to provide a substrate processing system capable of producing a high-quality device.

In the substrate processing system described above, it is preferable that the batch processing tank includes a jetting port that jets a fluid at a bottom, and in the first batch processing and the second batch processing, the controller controls the batch processing tank to jet the fluid from the bottom and stir a processing liquid held in the batch processing tank up and down.

[Operation and Effect] According to the above configuration, since the batch processing is performed while the processing liquid is stirred up and down, efficient batch processing can be performed. With the substrate processing system according to the present invention, even when the configuration in which the batch processing is performed while the processing liquid is stirred up and down is adopted, the unevenness of the substrate processing occurring during the batch processing is homogenized, and thus a high-quality device can be produced.

The substrate processing system described above preferably further includes a carrier conveyance mechanism that conveys the second carrier from the second placement unit to the first placement unit.

[Operation and Effect] According to the above configuration, the conveyance mechanism that conveys the second carrier from the second carrier placement unit to the first carrier placement unit is provided. With this configuration, the conveyance of the second carrier in the second carrier placement unit to the first carrier placement unit can be performed by the substrate processing system. With this configuration, the second carrier can be conveyed without depending on manual conveyance or conveyance by a carrier conveyance crane provided in the plant.

In the substrate processing system described above, it is preferable that the controller controls the single wafer drying unit to dry, one by one, the substrates whose orientation has been changed into the horizontal orientation after the first batch processing, the substrates having been conveyed to the single wafer processing device.

[Operation and Effect] According to the above configuration, the single wafer drying unit dries the substrates whose orientation has been changed into the horizontal orientation after the first batch processing conveyed to the single wafer processing device, one by one. With this configuration, in the same manner as in the second batch processing, the substrate can be mildly dried even after the first batch processing, and thus a high-quality device can be produced.

In the substrate processing system described above, it is preferable that the batch processing device includes a batch drying unit that collectively dries the substrates for which the first batch processing has been completed, and the controller: controls the batch drying unit to collectively dry the substrates after the first batch processing; and controls the second orientation changing mechanism to change the orientation of the substrates that have been collectively subjected to the drying processing from the vertical orientation to the horizontal orientation.

[Operation and Effect] According to the above configuration, the batch drying unit that collectively dries the substrates for which the first batch processing has been completed is provided. With this configuration, it is possible to collectively dry the substrates for which the first batch processing has been completed, and it is possible to provide a substrate processing system with improved throughput.

In the substrate processing system described above, the relay conveyance mechanism preferably includes a first hand that acquires a dried substrate and a second hand that acquires a substrate before drying.

[Operation and Effect] According to the above configuration, the relay conveyance mechanism includes the first hand that acquires the substrate after drying and the second hand that acquires the substrate before drying. According to such a configuration, it is possible to realize a configuration in which both the substrate after drying and the substrate before drying pass through the relay device. Since the first hand is always in a dried state, the substrate does not get wet because of the first hand. When the substrate before drying is conveyed by the second hand different from the first hand, the substrate before drying can also be reliably conveyed in the relay device.

In the substrate processing system described above, it is preferable that the rotation mechanism is configured by a spin chuck of a single wafer processing chamber provided in the single wafer processing device, and the spin chuck delivers the substrates in the horizontal orientation that have been received by the spin chuck to the storage and conveyance mechanism by half-rotating the substrates in the horizontal orientation about a vertical axis.

[Operation and Effect] According to the above configuration, the rotation mechanism is configured by the spin chuck of the single wafer processing chamber, and the substrate in the horizontal orientation received by the spin chuck is half-rotated about the vertical axis and delivered to the storage and conveyance mechanism. With this configuration, the rotation mechanism can be realized using the existing configuration. That is, the present invention can be realized by changing the control of an existing device configuration.

In the substrate processing system described above, it is preferable that the single wafer drying unit is configured by a single wafer processing chamber provided in the single wafer processing device, and the single wafer processing chamber dries the substrates by spin drying.

[Operation and Effect] According to the above configuration, the single wafer drying unit is configured by the single wafer processing chamber, and the substrate is dried by spin drying. With this configuration, the single wafer drying unit can be configured using a device that has been operated for a long time and has past results.

In the substrate processing system described above, it is preferable that the rotation mechanism is provided at an unloading position of the relay device, and the rotation mechanism half-rotates the substrates in the horizontal orientation conveyed to the unloading position about a vertical axis.

[Operation and Effect] According to the above configuration, the rotation mechanism is provided at an unloading position of the relay device, and the rotation mechanism half-rotates the substrates in the horizontal orientation conveyed to the unloading position about a vertical axis. With this configuration, the present invention can be implemented without changing the control method of the single wafer drying unit. In addition, such a configuration is suitable for a substrate processing system equipped with a single wafer drying unit having no spin chuck.

In the substrate processing system described above, the single wafer drying unit preferably dries the substrates using a supercritical fluid.

[Operation and Effect] According to the above configuration, the single wafer drying unit dries the substrate using a supercritical fluid. With this configuration, since the substrate can be dried without damaging the circuit formed on the device surface, a substrate processing system capable of generating a high-quality device can be provided.

In the substrate processing system described above, it is preferable that the rotation mechanism is provided at the batch processing device, and the rotation mechanism vertically inverts the plurality of substrates in the vertical orientation by half-rotating the plurality of the substrates about a horizontal axis.

[Operation and Effect] According to the above configuration, the rotation mechanism is provided at the batch processing device, and the rotation mechanism vertically inverts the plurality of substrates in the vertical orientation by half-rotating the plurality of the substrates about a horizontal axis. With this configuration, the time required to half-rotate the substrate can be shortened, and thus a substrate processing system with improved throughput can be provided.

In the substrate processing system described above, it is preferable that the single wafer processing device includes a path on which the substrates in the horizontal orientation can be placed, the storage and conveyance mechanism includes: a first robot capable of accessing an unloading position of the relay device, the single wafer drying unit, and the path; and a second robot capable of accessing the path and the second placement unit, and the first robot is provided at a position surrounded by the substrate drying unit.

[Operation and Effect] According to the above configuration, the single wafer processing device includes a path on which the substrates in the horizontal orientation can be placed. The above configuration also includes the first robot that can access the path, the unloading position of the relay device, and the single wafer drying unit. The first robot is provided at a position surrounded by the substrate drying unit. According to the above configuration, since the layout of the substrate processing system is optimized, it is possible to provide a substrate processing system capable of quickly executing substrate processing based on efficient substrate conveyance.

In the substrate processing system described above, it is preferable that the first placement unit and the batch processing tank in the batch processing device are disposed in a front-back direction, a loading position in the relay device and an unloading position in the relay device are disposed in a left-right direction orthogonal to the front-back direction, and the second placement unit and the single wafer drying unit in the single wafer processing device are disposed in the front-back direction.

[Operation and Effect] According to the above configuration, the first carrier placement unit and the batch processing tank in the batch processing device are disposed in the front-back direction, the loading position and the unloading position in the relay device are disposed in the left-right direction, and the second carrier placement unit and the single wafer drying unit in the single wafer processing device are disposed in the front-back direction. According to the above configuration, since the layout of the substrate processing system is optimized, it is possible to provide a substrate processing system capable of quickly executing substrate processing based on efficient substrate conveyance.

In the substrate processing system described above, it is preferable that the first placement unit, the batch drying unit, and the batch processing tank in the batch processing device are disposed in a front-back direction, a loading position in the relay device and an unloading position in the relay device are disposed in a left-right direction orthogonal to the front-back direction, and the second placement unit and the single wafer drying unit in the single wafer processing device are disposed in the front-back direction.

[Operation and Effect] According to the above configuration, the first carrier placement unit, the batch drying unit, and the batch processing tank in the batch processing device are disposed in the front-back direction, the loading position in the relay device and the unloading position in the relay device are disposed in the left-right direction, and the second carrier placement unit and the single wafer drying unit in the single wafer processing device are disposed in the front-back direction. According to the above configuration, since the layout of the substrate processing system is optimized, it is possible to provide a substrate processing system capable of quickly executing substrate processing based on efficient substrate conveyance.

In the substrate processing system described above, it is preferable that the first placement unit, the rotation mechanism, and the batch processing tank in the batch processing device are disposed in a front-back direction, a loading position in the relay device and an unloading position in the relay device are disposed in a left-right direction orthogonal to the front-back direction, and the second placement unit and the single wafer drying unit in the single wafer processing device are disposed in the front-back direction.

[Operation and Effect] According to the above configuration, the first carrier placement unit, the rotation mechanism, and the batch processing tank in the batch processing device are disposed in the front-back direction, the loading position in the relay device and the unloading position in the relay device are disposed in the left-right direction, and the second carrier placement unit and the single wafer drying unit in the single wafer processing device are disposed in the front-back direction. According to the above configuration, since the layout of the substrate processing system is optimized, it is possible to provide a substrate processing system capable of quickly executing substrate processing based on efficient substrate conveyance.

The present invention can provide a substrate processing system capable of producing a high-quality substrate.

BRIEF OF DESCRIPTION OF THE DRAWINGS

DESCRIPTION OF THE PREFERRED EMBODIMENTS

Hereinafter, an embodiment of the present invention will be described with reference to the drawings. A substrate processing system of the present invention continuously performs batch processing of collectively processing a plurality of substrates W and single wafer processing of processing the substrates W one by one, having a configuration in which a batch processing device related to the batch processing and a single wafer processing device related to the single wafer processing are coupled by a relay device.

The substrate processing system according to the present invention performs, for example, each processing such as chemical processing, cleaning processing, and drying processing on the substrate W. The substrate processing system adopts a processing method in which both a batch type processing method of collectively processing a plurality of substrates W and a single wafer type processing method of processing substrates W one by one are used in combination (so-called hybrid method). The batch type processing method is a processing method for collectively processing a plurality of substrates W arrayed in a vertical orientation. The single wafer processing method is a processing method of processing the substrates W in a horizontal orientation one by one. The substrate processing system of the present invention continuously performs batch processing of collectively processing a plurality of substrates and single wafer processing of processing substrates one by one. The substrate processing system of the present invention includes a batch processing device and a single wafer processing device. The batch processing device performs batch processing of collectively processing substrates. The single wafer processing device performs single wafer processing of processing substrates one by one.

EMBODIMENT

1. Overall Configuration

Figure 1:
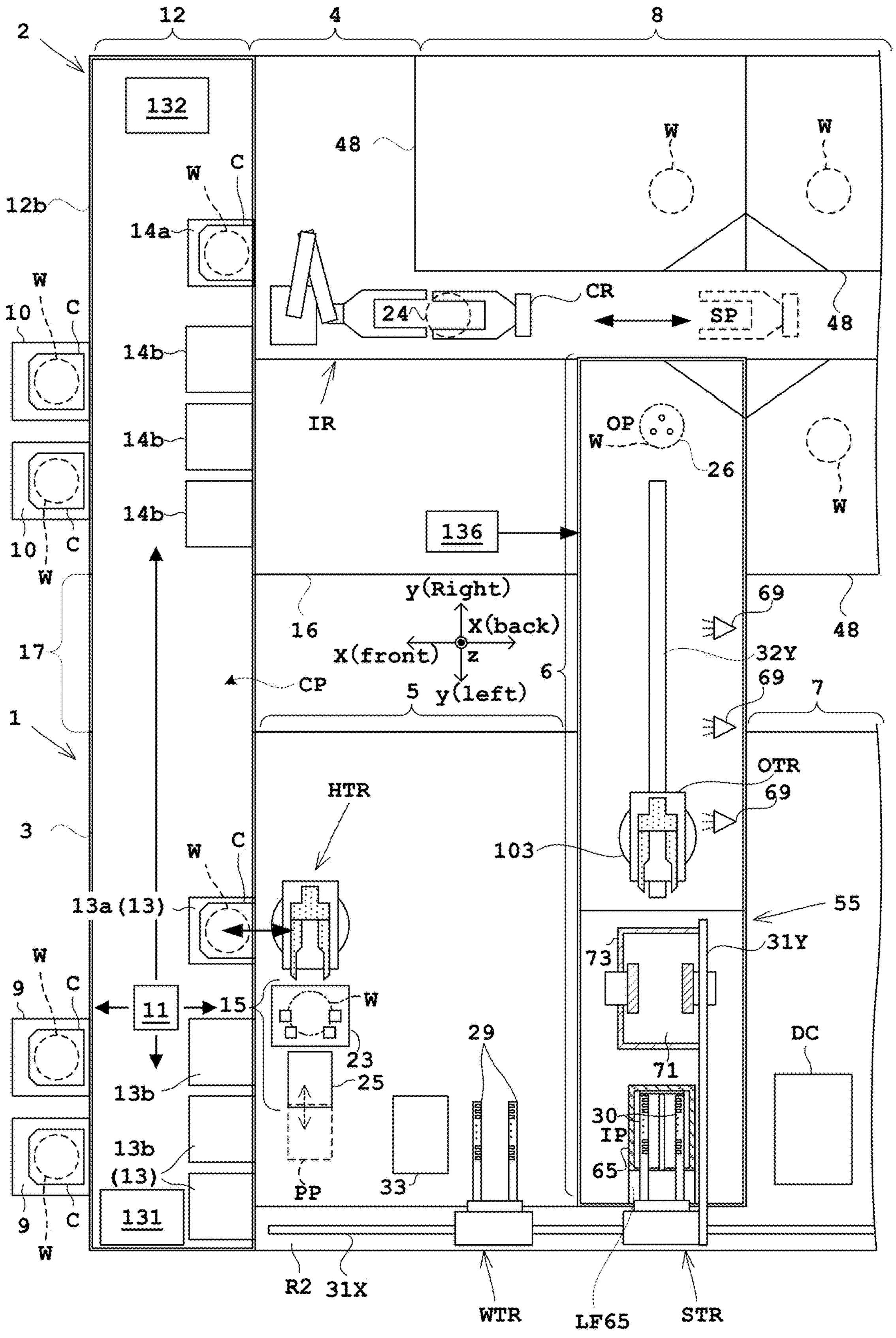
FIG. 1 is a plan view for describing an overall configuration of a substrate processing system according to an embodiment.

As illustrated in FIG. 1, the substrate processing system includes a batch processing device 1 and a single wafer processing device 2 that are individually configured, and a relay device 6 that connects the devices 1 and 2. The batch processing device 1 relates to batch processing of collectively processing a plurality of substrates, and the single wafer processing device 2 relates to single wafer processing of processing substrates one by one. The relay device 6 is configured to convey the substrates for which the batch processing has been completed from the batch processing device 1 to the single wafer processing device 2, having a bridging structure provided at a position interposed between the batch processing device 1 and the single wafer processing device 2.

Figure 2:
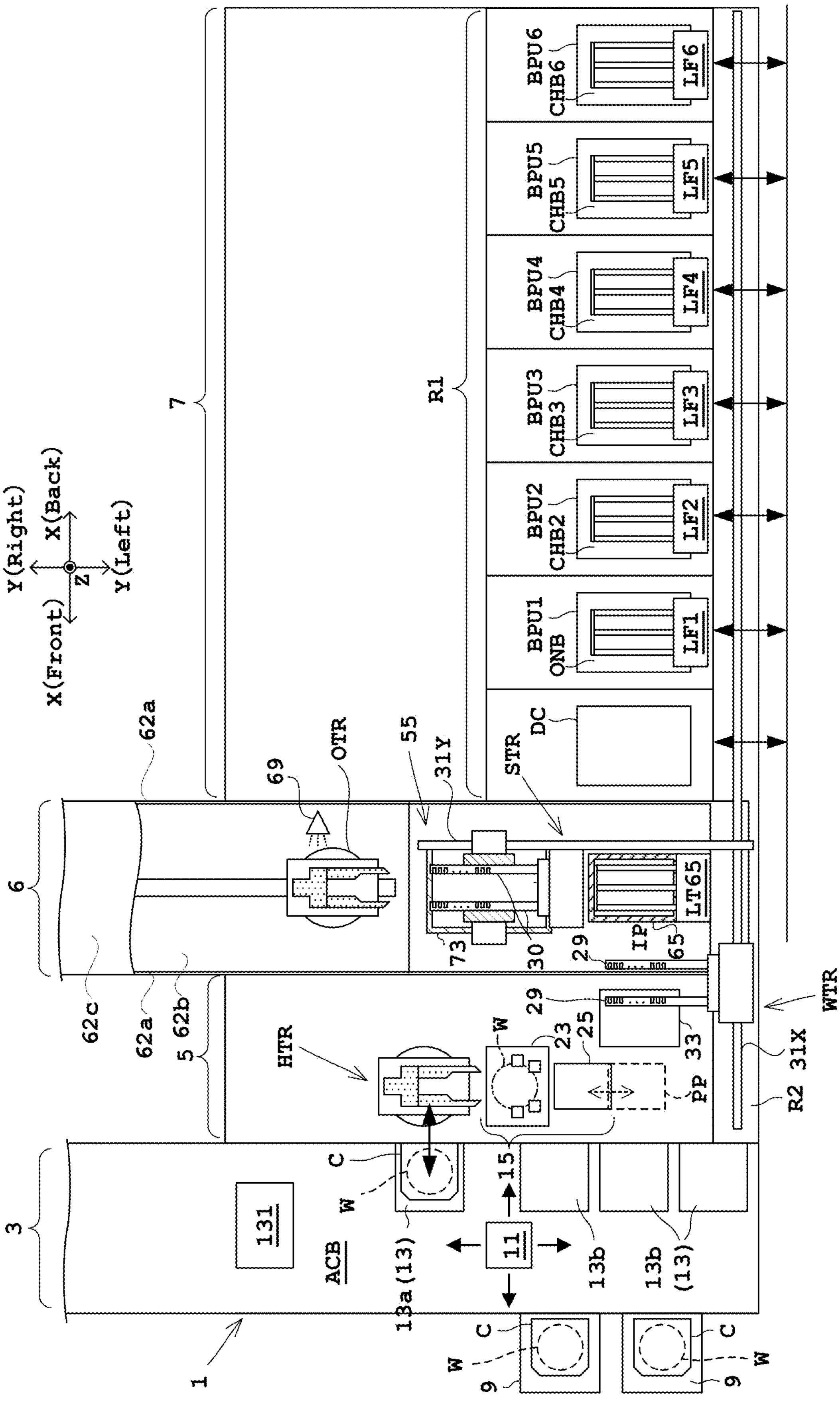
FIG. 2 is a plan view for describing an overall configuration of a batch processing device according to the embodiment.

As illustrated in FIG. 1, each of the batch processing device 1 and the single wafer processing device 2 includes blocks partitioned by partition walls. That is, the batch processing device 1 includes a stocker block 3, a transfer block 5 adjacent to the stocker block 3, and a batch processing block 7 adjacent to the transfer block 5. FIG. 2 illustrates a specific configuration of the batch processing block 7 in the batch processing device 1. The single wafer processing device 2 includes an indexer block 4 and a single wafer processing block 8 adjacent to the indexer block 4.

The batch processing device 1 is configured to perform batch processing, including a first housing 1A that houses each block constituting the batch processing device 1. The single wafer processing device 2 is configured to perform single wafer processing on the substrate W for which the batch processing has been completed, including a second housing 2A that houses each block constituting the single wafer processing device 2. The first housing 1A includes a first load port 9 protruding from a first wall surface orthogonal to a Y direction from the batch processing block 7 toward the transfer block 5 among wall surfaces constituting the first housing. The second housing 2A includes a second load port 10 protruding from a second wall surface orthogonal to the Y direction among wall surfaces constituting the second housing 2A, and the second load port 10 is at the same position as the first load port 9 in the Y direction. A carrier C can be placed on the second load port 10.

In the present specification, for convenience, the directions in which the stocker block 3, the transfer block 5, and the batch processing block 7 in the batch processing device 1 are arrayed are referred to as "front-back directions X". The front-back direction X are also the directions in which the indexer block 4 and the single wafer processing block 8 in the single wafer processing device 2 are arrayed. The front-back directions X extend horizontally. Of the front-back directions X, the direction from the transfer block 5 toward the stocker block 3 in the batch processing device 1 is referred to as "front direction". The front direction is also the direction from the single wafer processing block 8 toward the indexer block 4 in the single wafer processing device 2. The direction opposite to the front direction is referred to as "back direction". The directions extending horizontally orthogonal to the front-back directions X are referred to as "width directions Y". One direction of the "width directions Y" is referred to as "right direction" for convenience, and the other direction is referred to as "left direction" for convenience. The directions (height directions) orthogonal to the front-back directions X and the width directions Y are referred to as "vertical directions Z" for convenience. In each drawing, front, back, right, left, up, and down are appropriately shown for reference.

In the substrate processing system of the present invention, first, first batch processing is performed on the substrate W in the batch processing device 1, and the substrate W after the batch processing is conveyed to the single wafer processing device 2 by the relay device 6. Thereafter, the substrate W is subjected to drying processing by the single wafer processing device 2. Thereafter, the substrate W is subjected to second batch processing in the batch processing device 1 again. The substrate W after the batch processing is conveyed again to the single wafer processing device 2 by the relay device 6. Then, the substrate W is subjected to drying processing by the single wafer processing device 2. Thereafter, the substrate W is stored in the carrier C placed on a carrier placement shelf 14*a*. The carrier C storing the substrate W is conveyed to the second load port 10. The substrate processing system thus ends the entire process of the substrate processing. Hereinafter, specific configurations of the batch processing device 1, the relay device 6, and the single wafer processing device 2 in the substrate processing system of the present invention will be described in this order.

2. Batch Processing Device: Stoker Block

The stocker block 3 includes the first load port 9 that is an entrance of the carrier C when the carrier C storing a plurality of substrates W in a horizontal orientation at predetermined intervals in a vertical direction is input into the block. The first load port 9 protrudes from the outer wall of the stocker block 3 extending in the width direction (Y direction).

A plurality of (for example, 25) substrates W are stacked and stored in one carrier C at predetermined intervals in a horizontal orientation. The carrier C storing the unprocessed substrate W to be carried into the batch processing device 1 is first placed on the first load port 9. The carrier C is formed with a plurality of grooves (not illustrated) extending in the horizontal direction to accommodate the substrates W with their surfaces being separated from each other. One substrate W is inserted into each of the grooves. Examples of the carrier C include a sealed-type front opening unify pod (FOUP). In the present invention, an open type container may be adopted as the carrier C.

The internal structure of the stocker block 3 will be described. The stocker block 3 includes a conveyance and storage unit ACB that stocks and manages the carrier C. The conveyance and storage unit ACB includes a carrier conveyance mechanism 11 that conveys the carrier C and a shelf 13 on which the carrier C is placed. The number of carriers C that can be stocked by the stocker block 3 is one or more.

The stocker block 3 includes a plurality of shelves 13 on which the carrier C is placed. The shelf 13 is provided on a partition wall separating the stocker block 3 and the transfer block 5. The shelf 13 includes a shelf 13*b* for stock on which the carrier C is simply temporarily placed, and a carrier placement shelf 13*a* for substrate extraction to be accessed by a first substrate conveyance mechanism HTR of the transfer block 5.

The carrier placement shelf 13*a* corresponds to a first placement unit. The carrier placement shelf 13*a* has a configuration capable of placing the carrier C storing a plurality of substrates in a horizontal orientation at predetermined intervals in the vertical direction. The carrier placement shelf 13*a* has a configuration on which the carrier C from which the substrate W is to be taken out is placed. In the present embodiment, one carrier placement shelf 13*a* is provided, but a plurality of carrier placement shelves 13*a* may be provided. The carrier conveyance mechanism 11 takes in the carrier C storing the unprocessed substrate W from the first load port 9 and places the carrier C on the carrier placement shelf 13*a* for substrate extraction. At this time, the carrier conveyance mechanism 11 can also temporarily place the carrier C on the shelf 13*b* for stock before placing the carrier C on the carrier placement shelf 13*a*. The number of carrier placement shelves 13*a* included in the stocker block 3 is one or more.

The carrier conveyance mechanism 11 can also move to the inside of the single wafer processing device 2. The substrate processing unit is provided with a bridging unit 17 that enables the carrier conveyance mechanism 11 to move between the left and right. The bridging unit 17 is configured to bridge the batch processing device 1 and the single wafer processing device 2. A passage CP for allowing the carrier C to travel back and forth is provided inside the bridging unit 17. A carrier block 12 in which a plurality of carriers C can be retained is provided on the right side of the passage CP. The carrier block 12 belongs to the single wafer processing device 2. The carrier block 12 includes a carrier placement shelf 14*a* on which the carrier C can be placed. The carrier placement shelf 14*a* corresponds to a second placement unit of the present invention. The carrier placement shelf 14*a* is a conveyance destination of the substrate W processed by the single wafer processing device 2. The substrate W for which substrate drying processing has been completed in the single wafer processing device 2 is loaded into an empty carrier C set on the carrier placement shelf 14*a*. Details of the carrier block 12 will be described later.

The carrier conveyance mechanism 11 can convey the carrier C from the carrier placement shelf 14*a* of the single wafer processing device 2 to the carrier placement shelf 13*a* of the batch processing device 1. That is, the substrate processing unit of the present embodiment can cause the batch processing device 1 to take in the substrates W for which the drying processing has been completed in the single wafer processing device 2. The substrates W after the drying processing in the carrier placement shelf 14*a* are batch-processed substrates. The substrates W on the carrier placement shelf 14*a* are conveyed to the carrier placement shelf 13*a* and taken into the batch processing device 1 again. Thereafter, the substrates W are subjected to batch processing again. In this manner, the substrate processing unit of the present embodiment has a configuration in which the batch processing of the substrates W is performed twice.

3. Batch Processing Device: Transfer Block

The transfer block 5 is adjacent to the carrier placement shelf 13*a*. The transfer block 5 is disposed adjacent to the back side of the stocker block 3. The transfer block 5 includes a first substrate conveyance mechanism HTR that can access the carrier C placed on the carrier placement shelf 13*a* for substrate extraction, an HVC orientation changing unit 23 that collectively changes the orientation of the plurality of substrates W from the horizontal orientation to the vertical orientation, and a pusher mechanism 25. The HVC orientation changing unit 23 constitutes a first orientation changing mechanism 15. The first orientation changing mechanism 15 collectively changes the orientation of the plurality of substrates W extracted from the carrier C from the horizontal orientation to the vertical orientation. Further, in the transfer block 5, a substrate delivery position PP for delivering the plurality of substrates W to the second substrate conveyance mechanism WTR provided in a collective conveyance region R2 is set. The first substrate conveyance mechanism HTR, the HVC orientation changing unit 23, and the pusher mechanism 25 are arrayed in this order in the Y direction.

The first substrate conveyance mechanism HTR corresponds to a substrate acquisition and conveyance mechanism of the present invention. The first substrate conveyance mechanism HTR is configured to collectively take out a plurality of substrates W from the carrier C placed on the carrier placement shelf 13*a*. The first substrate conveyance mechanism HTR is provided on the right of the back side of the conveyance and storage unit ACB of the stocker block 3. The first substrate conveyance mechanism HTR is configured to collectively take out a plurality of substrates W from the carrier C placed on the carrier placement shelf 13*a* for substrate extraction and storage. The first substrate conveyance mechanism HTR includes a plurality of (for example, 25) hands 51 that collectively convey a plurality of substrates W. One hand 51 supports one substrate W. The first substrate conveyance mechanism HTR collectively takes out a plurality of (for example, 25) substrates W from the carrier C placed on the carrier placement shelf 13*a* of the stocker block 3. Then, the first substrate conveyance mechanism HTR can convey the plurality of gripped substrates W to a support table 23A of the HVC orientation changing unit 23. The HVC orientation changing unit 23 changes the orientation of the plurality of received substrates W in the horizontal orientation into the vertical orientation. The pusher mechanism 25 is configured to hold and move the plurality of substrates W in the vertical orientation up, down, left, and right.

Figure 3:
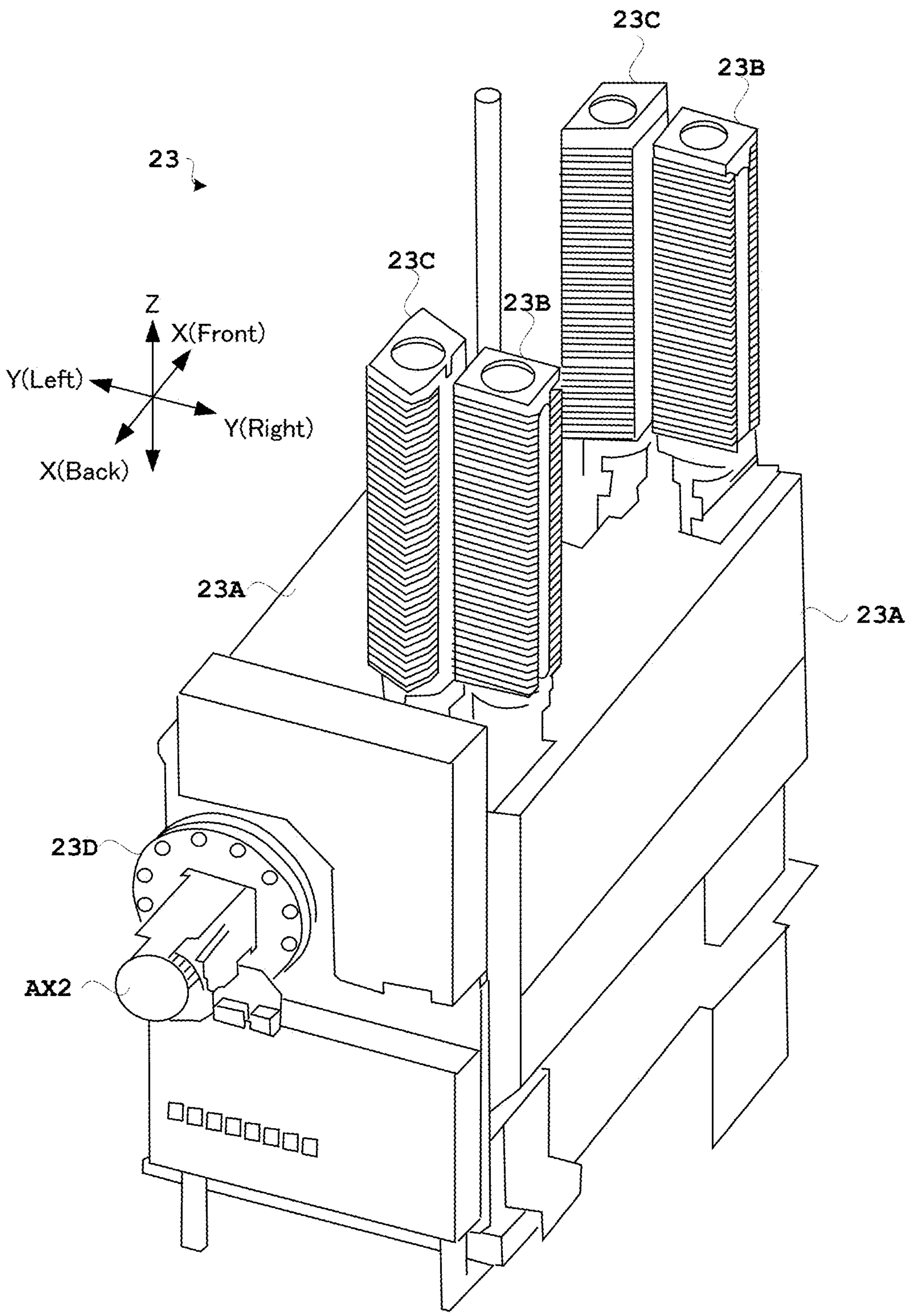
FIG. 3 is a perspective view for describing a configuration of an HVC orientation changing unit according to the embodiment.

The HVC orientation changing unit 23 corresponds to a first orientation changing mechanism of the present invention. The HVC orientation changing unit 23 is configured to change the orientation of the substrate W taken out from the carrier C by the first substrate conveyance mechanism HTR from the horizontal orientation to the vertical orientation. FIG. 3 illustrates the HVC orientation changing unit 23 of a first embodiment. The HVC orientation changing unit 23 includes a pair of horizontal holders 23B and a pair of vertical holders 23C extending in the longitudinal direction (Z direction). The support table 23A has a support surface extending in an XY plane that supports the horizontal holders 23B and the vertical holders 23C. A rotation drive mechanism 23D is configured to rotate the horizontal holders 23B and the vertical holders 23C by 900 together with the support table 23A. With this rotation, the horizontal holders 23B and the vertical holders 23C are configured to extend in the left-right direction (Y direction). FIGS. 4A to 4F are schematic views each for describing the operation of the HVC orientation changing unit 23. Hereinafter, the configuration of each unit will be described with reference to FIGS. 3 and 4A to 4F.

The horizontal holder 23B supports the plurality of substrates W in the horizontal orientation from below. That is, the horizontal holder 23B has a comb-shaped structure having a plurality of protrusions corresponding to the substrates W to be supported. Between the adjacent protrusions, there is an elongated recess in which the peripheral portion of the substrate W is positioned. When the peripheral portion of the substrate W is inserted into the recess, the lower surface of the substrate W in the horizontal orientation comes into contact with the upper surface of the protrusion, and the substrate W is supported in the horizontal orientation.

The vertical holder 23C supports the plurality of substrates W in the vertical orientation from below. That is, the vertical holder 23C has a comb-shaped structure having a plurality of protrusions corresponding to the substrates W to be supported. Between the adjacent protrusions, there is an elongated V-shaped groove in which the peripheral portion of the substrate W is positioned. When the peripheral portion of the substrate W is inserted into the V-shaped groove, the substrate W is sandwiched by the V-shaped groove and supported in the vertical orientation. Since the two vertical holders 23C are provided on the support table 23A, the substrate W is sandwiched by different V-shaped grooves at two positions of the peripheral portion.

The pair of horizontal holders 23B and the pair of vertical holders 23C extending in the vertical direction (Z direction) are provided along a virtual circle corresponding to the substrate W in the horizontal orientation so as to surround the substrate W to be held. The pair of horizontal holders 23B is separated by the diameter of the substrate W, and holds one end of the substrate W and the other end that is the farthest from the one end. In this manner, the pair of horizontal holders 23B supports the substrate W in the horizontal orientation. On the other hand, the pair of vertical holders 23C is separated by a distance shorter than the diameter of the substrate W, and supports a predetermined portion of the substrate W and a specific portion positioned in the vicinity of the predetermined portion. In this manner, the pair of vertical holders 23C supports the substrate W in the vertical orientation. The pair of horizontal holders 23B are at the same position in the left-right direction (Y direction), and the pair of vertical holders 23C are at the same position in the left-right direction (Y direction). The pair of vertical holders 23C is provided on the side in the direction (left direction) in which the support table 23A is rotated and tilted relative to the pair of horizontal holders 23B.

The rotation drive mechanism 23D rotatably supports the support table 23A by at least 90° about a horizontal axis AX2 extending in the front-back direction (X direction). When the support table 23A in a horizontal state is rotated by 90°, the support table 23A becomes a vertical state, and the orientation of the plurality of substrates W held by the horizontal holders 23B and the vertical holders 23C are changed from the horizontal orientation to the vertical orientation.

Figure 4A:
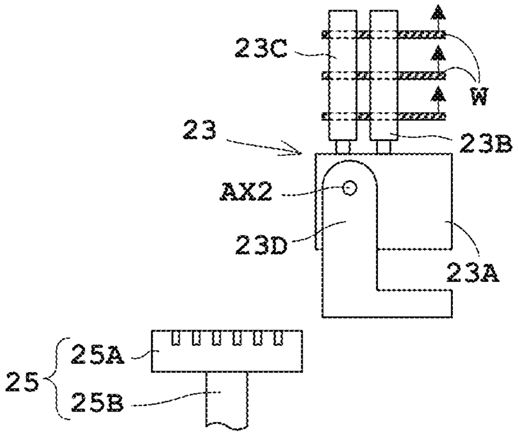
FIG. 4A is a schematic view for describing a batch set in a transfer block according to the embodiment.
Figure 4B:
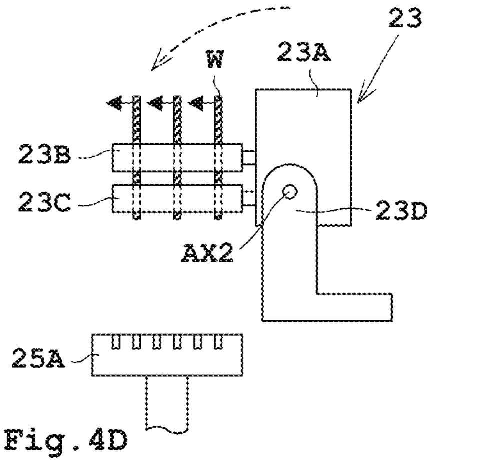
FIG. 4B is a schematic view for describing the batch set in the transfer block according to the embodiment.
Figure 4C:
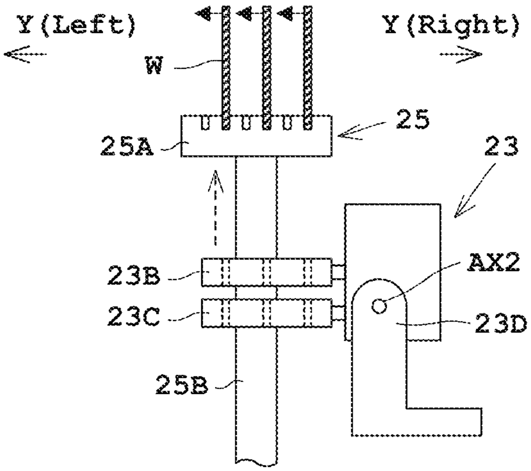
FIG. 4C is a schematic view for describing the batch set in the transfer block according to the embodiment.
Figure 4D:
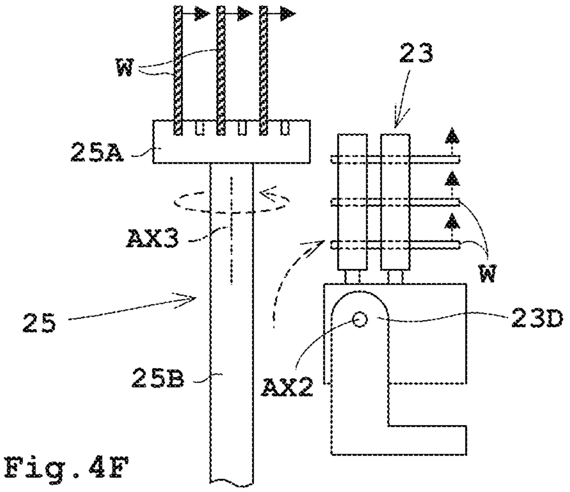
FIG. 4D is a schematic view for describing the batch set in the transfer block according to the embodiment.
Figure 4E:
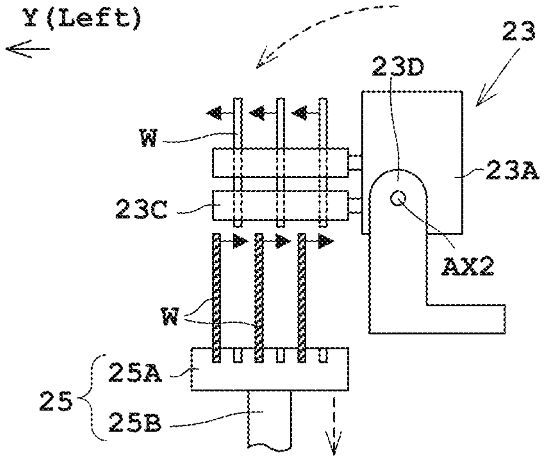
FIG. 4E is a schematic view for describing the batch set in the transfer block according to the embodiment.
Figure 4F:
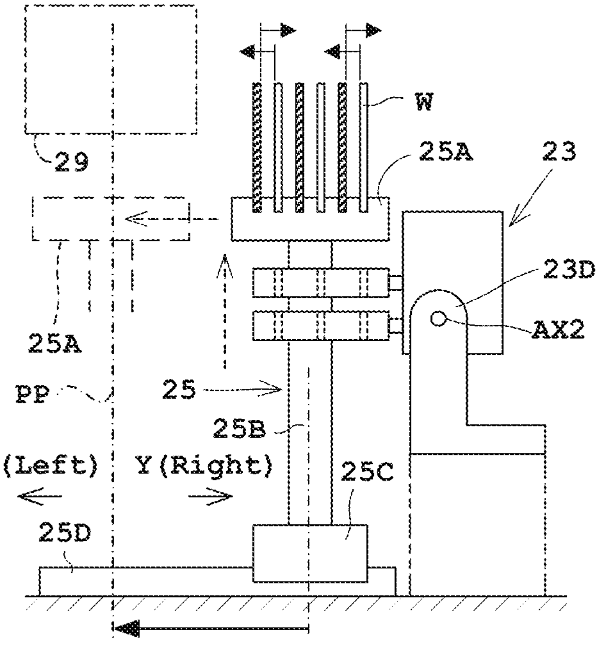
FIG. 4F is a schematic view for describing the batch set in the transfer block according to the embodiment.

As illustrated in FIG. 4F, the pusher mechanism 25 includes a pusher 25A on which the substrate W in the vertical orientation can be mounted, an elevating and rotating unit 25B that rotates and moves up and down the pusher 25A, a horizontal movement unit 25C that moves the elevating and rotating unit 25B in the left-right direction (Y direction), and a rail 25D that extends in the left-right direction (Y direction) and guides the horizontal movement unit 25C. The pusher 25A is configured to support a lower portion of each of a plurality of (for example, 50) substrates W in the vertical orientation. The elevating and rotating unit 25B is provided below the pusher 25A, including an extensible mechanism that moves the pusher 25A in the up-down direction. The elevating and rotating unit 25B can rotate the pusher 25A by at least 180° about a vertical axis. The horizontal movement unit 25C supports the elevating and rotating unit 25B and horizontally moves the pusher 25A and the elevating and rotating unit 25B. The horizontal movement unit 25C can move the pusher 25A from a pick-up position close to the HVC orientation changing unit 23 to the substrate delivery position PP by being guided by a rail 25D. The horizontal movement unit 25C can also shift the substrate W in the vertical orientation by a distance corresponding to a half pitch in the substrate array of the pusher 25A in an array direction of the substrate W.

Here, operations of the HVC orientation changing unit 23 and the pusher mechanism 25 will be described. The HVC orientation changing unit 23 and the pusher mechanism 25 array, for example, a total of 50 substrates W accommodated in the two carriers C at a predetermined interval (for example, 5 mm) in a face-to-face manner. The 25 substrates W in the first carrier C are described as first substrates W1 belonging to a first substrate group. In the same manner, the 25 substrates W in the second carrier C are described as second substrates W2 belonging to a second substrate group. In FIGS. 4A to 4F, for convenience of drawing, the number of the first substrates W1 is three, and the number of the second substrates W2 is three.

FIG. 4A illustrates a state in which the first substrates W1 in the horizontal orientation are collectively transferred to the HVC orientation changing unit 23 by the first substrate conveyance mechanism HTR. At this time, the device surface (the surface on which a circuit pattern is formed) of the first substrate W1 faces upward. The 25 first substrates W1 are disposed at a predetermined interval (for example, 10 mm). The interval of 10 mm is called full pitch (normal pitch). The first substrate W1 in this state is held by the horizontal holders 23B. The pusher 25A at this time is at the pick-up position below the support table 23A.

FIG. 4B illustrates a state in which the support table 23A of the HVC orientation changing unit 23 is rotated by 90° by the rotation drive mechanism 23D. In this manner, in the HVC orientation changing unit 23, the orientation of the 25 first substrates W1 is changed from the horizontal orientation to the vertical orientation. The first substrate W1 in this state is held by the vertical holders 23C.

The pusher mechanism 25 supports the substrate group in the vertical orientation formed by the first orientation changing mechanism 15 changing the orientation of the first substrate W1 stored in the first carrier C. FIG. 4C illustrates a state in which the pusher 25A has moved up from the pick-up position to a position set immediately above the pick-up position. This upward movement is performed by the elevating and rotating unit 25B. In this manner, when the pusher 25A moves from the lower side to the upper side of the first substrate W1, the first substrate W1 supported by the vertical holder 23C of the HVC orientation changing unit 23 is pulled out from the vertical holder 23C and moves onto the pusher 25A. A groove in which the substrate W is to be sandwiched is provided on the upper surface of the pusher 25A. The first substrate W1 is supported by these grooves arrayed at equal intervals. Since the grooves are arrayed at a half pitch and the first substrates W1 are arrayed at the full pitch in the HVC orientation changing unit 23, grooves in which the first substrates W1 are sandwiched and empty grooves that do not support the substrates W are alternately arrayed on the upper surface of the pusher 25A positioned immediately above.

FIG. 4D illustrates an operation in which the pusher 25A is rotated by 180° by the elevating and rotating unit 25B and an operation in which the support table 23A of the HVC orientation changing unit 23 is reversely rotated by 90° by the rotation drive mechanism 23D. The HVC orientation changing unit 23 in this state can support the second substrate W2. When the pusher 25A rotates 180°, the substrate W supported at the right end of the pusher 25A moves to the left end of the pusher 25A, and the empty groove positioned at the left end of the pusher 25A moves to the right end of the pusher 25A. Since the positional relationship between the HVC orientation changing unit 23 and the pusher 25A is set such that the substrate W positioned at the right end of the HVC orientation changing unit 23 is transferred to the right end of the pusher 25A, the HVC orientation changing unit 23 can pass the second substrate W2 at the right end to the groove at the right end of the pusher 25A regardless of the presence of the first substrate W1 supported by the pusher 25A. The same applies to the other second substrates W2 supported by the HVC orientation changing unit 23. That is, the second substrates W2 arrayed at full pitch intervals in the HVC orientation changing unit 23 can be arrayed at full pitch intervals in order from the right end of the pusher 25A. This is because empty grooves are arrayed at full pitch intervals starting from the right end in the pusher 25A after rotation. The first substrates W1 on the pusher 25A at this time are accommodated in the gaps between the second substrates W2 arrayed in the pusher 25A. FIG. 4D illustrates a state in which the second substrate W2 has already been conveyed to the HVC orientation changing unit 23. In FIG. 4D, the second substrate W2 is supported by the horizontal holder 23B.

When the pusher 25A at the position immediately above in the state of FIG. 4D returns to the original pick-up position, the HVC orientation changing unit 23 can rotate the support table 23A again by 90°.

FIG. 4E illustrates a state in which the support table 23A is actually rotated again. At this time, since the pusher 25A is rotated by 180°, when the pusher 25A is moved again to the position immediately above as illustrated in FIG. 4F, the second substrate W2 does not interfere with the first substrate W1 and is accommodated in the empty groove sandwiched between the first substrates W1 on the upper surface of the pusher 25A. In this manner, a lot in which the first substrates W1 and the second substrates W2 are alternately arrayed is formed. In FIG. 4E, the second substrate W2 is supported by the vertical holders 23C. Since the lot is configured by arraying the substrates W in a face-to-face manner, the device surfaces of the first substrates W1 constituting the lot all face rightward in FIG. 4F, and the device surfaces of the second substrates W2 all face leftward in FIG. 4F. In this manner, the pusher mechanism 25 also supports the substrate group in the vertical orientation formed by the first orientation changing mechanism 15 changing the orientation of the second substrates W2 stored in the second carrier C.

FIG. 4F illustrates a state in which the pusher 25A has moved again to the position immediately above. Then, the lot generated in the pusher 25A is conveyed in the left direction (Y direction) by the horizontal movement unit 25C and moved to the substrate delivery position PP.

In this manner, the pusher mechanism 25 combines the two substrate groups stored in the carrier C at the full pitch to form a lot in which the substrates W are arrayed at the half pitch. The device surface of the first substrate W1 and the device surface of the second substrate W2 constituting the lot face each other, and the substrates are arrayed in a face-to-face manner.

A dry lot support unit 33 is provided mainly for the purpose of temporarily causing the lot for which batch assembly has been performed by the HVC orientation changing unit 23 and the pusher mechanism 25 to wait, and is located at a position sandwiched between the substrate delivery position PP and the relay device 6 to be described later. When the lot is conveyed from the dry lot support unit 33 to the batch processing block 7, the second substrate conveyance mechanism WTR included in the batch processing device 1 is used.

5. Batch Processing Device: Batch Processing Block

The batch processing block 7 is adjacent to the transfer block 5. The batch processing block 7 performs batch processing on the lot described above. The batch processing block 7 is divided into a batch processing region R1 and a collective conveyance region R2 arrayed in the width direction (Y direction). Each region extends in the front-back direction (X direction). Specifically, the batch processing region R1 is disposed inside the batch processing block 7. The collective conveyance region R2 is adjacent to the batch processing region R1 and is disposed on the leftmost side of the batch processing block 7.

5.1. Batch Processing Region

The batch processing region R1 in the batch processing block 7 is a rectangular region extending in the front-back direction (X direction). One end side (front side) of the batch processing region R1 is adjacent to the relay device 6. The other end side of the batch processing region R1 extends in a direction (back side) away from the transfer block 5 and the relay device 6. Thus, the relay device 6 is a device that is inserted at a position where the batch processing device 1 is divided from the middle. When the lot is conveyed from the batch processing device 1 to the relay device 6, the second substrate conveyance mechanism WTR included in the batch processing device 1 is used.

The second substrate conveyance mechanism WTR collectively conveys the plurality of substrates W in the vertical orientation between the transfer block 5, batch processing units BPU1 to BPU6, and a loading position IP of the relay device 6. Thus, the collective conveyance region R2, which is a region where the second substrate conveyance mechanism WTR can move, is not divided by the relay device 6 but extends in the Y direction along the left end portion of the relay device 6. The relay device 6 is configured to be fitted inside the batch processing device 1, but it does not reach the left end of the batch processing device 1. This is because the collective conveyance region R2 is provided at the left end of the batch processing device 1.

The batch processing region R1 includes a batch type processing unit that mainly performs batch type processing. Specifically, in the batch processing region R1, a batch drying chamber DC for collectively drying a plurality of substrates W and a plurality of batch processing units BPU1 to BPU6 for collectively immersing the plurality of substrates W in a direction in which the batch processing region R1 extends are arrayed. The batch processing units BPU1 to BPU6 collectively immerse the plurality of substrates in the vertical orientation. The disposition of the batch drying chamber DC and the batch processing units BPU1 to BPU6 will be specifically described. The batch drying chamber DC is adjacent to the relay device 6 from the back side. The first batch processing unit BPU1 is adjacent to the batch drying chamber DC from the back side. The second batch processing unit BPU2 is adjacent to the first batch processing unit BPU1 from the back side. The third batch processing unit BPU3 is adjacent to the second batch processing unit BPU2 from the back side. The fourth batch processing unit BPU4 is adjacent to the third batch processing unit BPU3 from the back side. The fifth batch processing unit BPU5 is adjacent to the fourth batch processing unit BPU4 from the back side. The sixth batch processing unit BPU6 is adjacent to the fifth batch processing unit BPU5 from the back side. Thus, the batch drying chamber DC, the first batch processing unit BPU1, the second batch processing unit BPU2, the third batch processing unit BPU3, the fourth batch processing unit BPU4, the fifth batch processing unit BPU5, and the sixth batch processing unit BPU6 are disposed so as to be separated from the relay device 6 in this order. In FIG. 1, the second batch processing unit BPU2 to the fifth batch processing unit BPU5 are omitted for convenience of drawing. This configuration can be understood by referring to FIG. 2.

The batch processing units BPU1 to BPU6 include a batch processing tank of the present invention. The batch processing tank is a liquid tank that holds a chemical liquid or pure water. The chemical liquid may be an acidic aqueous solution, for example, a phosphoric acid aqueous solution. In the present specification, the chemical liquid and pure water are collectively referred to as a processing liquid. The batch processing tanks that hold a chemical liquid are referred to as batch chemical liquid processing tanks CHB2 to CHB6, and the batch processing tank that holds pure water is referred to as batch rinse processing tank ONB.

Specifically, the second batch processing unit BPU2 includes a batch chemical liquid processing tank CHB2 that collectively performs chemical liquid processing on the lot, and a lifter LF2 that moves the lot up and down between a substrate delivery position and a chemical liquid processing position (see FIG. 2). The substrate delivery position is a position set above the batch chemical liquid processing tank CHB2 that can be accessed by the second substrate conveyance mechanism WTR, and the chemical liquid processing position is a position set in the tank of the batch chemical liquid processing tank CHB2 in which the lot can be immersed in a chemical liquid. The batch chemical liquid processing tank CHB2 performs acid processing on the lot. The acid processing may be phosphoric acid processing, but may be processing using another acid. In the phosphoric acid processing, etching processing is performed on the plurality of substrates W constituting the lot. In the etching processing, for example, the nitride film on the surface of the substrate W is chemically etched.

The batch chemical liquid processing tank CHB2 stores an acid solution such as a phosphoric acid solution. The batch chemical liquid processing tank CHB2 is provided with the lifter LF2 that moves the lot up and down. The lifter LF2 moves up and down in the vertical direction (Z direction). Specifically, the lifter LF2 moves up and down between a processing position corresponding to the inside of the batch chemical liquid processing tank CHB2 and a delivery position corresponding to the upper side of the batch chemical liquid processing tank CHB2. The lifter LF2 holds the lot formed of the substrates W in the vertical orientation. The lifter LF2 delivers and receives the lot to and from the second substrate conveyance mechanism WTR at the delivery position. When the lifter LF2 has moved down from the delivery position to the processing position while holding the lot, the entire region of the substrates W is positioned below the liquid level of the chemical liquid. When the lifter LF2 has moved up from the processing position to the delivery position while holding the lot, the entire region of the substrates W is positioned above the liquid level of the chemical liquid. The lifter LF2 can collectively immerse a plurality of substrates whose orientation has been changed into the vertical orientation by the HVC orientation changing unit 23 in the batch processing tank. At this time, the lifter LF2 moves down from the delivery position to the processing position.

Figure 5A:
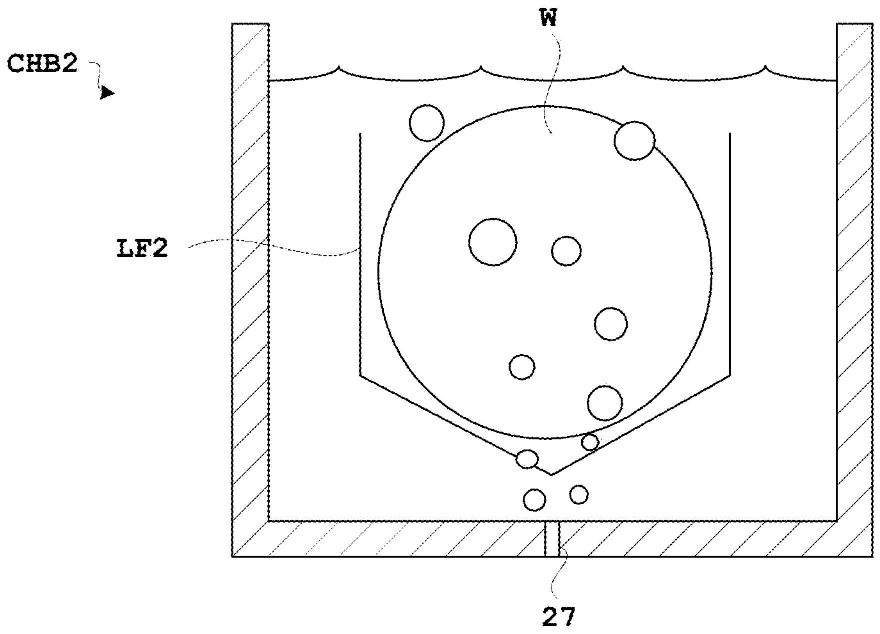
FIG. 5A is a schematic view for describing a batch processing tank according to the embodiment and also a plan view for describing a configuration of a relay conveyance mechanism according to the embodiment.

The batch chemical liquid processing tank CHB2 supplies, for example, a chemical liquid upward from below to convect the chemical liquid. In the first batch processing and the second batch processing in the present embodiment, the chemical liquid is jetted from the bottom of the batch chemical liquid processing tank CHB2, and the held chemical liquid is stirred up and down. The fluid to be jetted may be an inert gas, or the chemical liquid may be stirred up and down by bubbling. FIG. 5A illustrates the batch chemical liquid processing tank CHB2 of the present invention. As illustrated in FIG. 5A, the batch chemical liquid processing tank CHB2 includes a jetting port 27 for jetting a fluid at the bottom. When the chemical liquid or the like is jetted from the jetting port 27, the chemical liquid staying at the bottom moves toward the water surface of the batch chemical liquid processing tank CHB2, and the chemical liquid in the tank is stirred. The batch chemical liquid processing tank CHB3, the batch chemical liquid processing tank CHB4, the batch chemical liquid processing tank CHB5, and the batch chemical liquid processing tank CHB6 of the third batch processing unit BPU3, the fourth batch processing unit BPU4, the fifth batch processing unit BPU5, and the sixth batch processing unit BPU6 are also configured to stir the holding chemical liquid up and down by jetting the chemical liquid or the like from the bottom. The batch rinse processing tank ONB in the first batch processing unit BPU1 holds pure water. Thus, the batch rinse processing tank ONB has a configuration in which pure water is jetted from the bottom, and held the pure water is stirred up and down.

The third batch processing unit BPU3 specifically includes the batch chemical liquid processing tank CHB3 and a lifter LF3 that moves the lot up and down between a substrate delivery position and a chemical liquid processing position. The batch chemical liquid processing tank CHB3 has the same configuration as the batch chemical liquid processing tank CHB2 described above. That is, the batch chemical liquid processing tank CHB3 stores the chemical liquid described above, and is provided with the lifter LF3. The batch chemical liquid processing tank CHB3 performs the same processing as in the batch chemical liquid processing tank CHB2 on the lot. The batch processing device 1 of the present example includes a plurality of processing tanks capable of performing the same chemical liquid processing. This is because the phosphoric acid processing takes more time than other processing. The phosphoric acid processing requires a long time (for example, 60 minutes). Thus, in the device of the present example, the acid processing can be performed in parallel by a plurality of batch chemical liquid processing tanks.

The fourth batch processing unit BPU4 to the sixth batch processing unit BPU6 have the same configuration as the second batch processing unit BPU2 and the third batch processing unit BPU3. That is, the fourth batch processing unit BPU4 includes the batch chemical liquid processing tank CHB4 and a lifter LF4 that moves the lot up and down between a substrate delivery position and a chemical liquid processing position. In the same manner, the fifth batch processing unit BPU5 includes the batch chemical liquid processing tank CHB5 and a lifter LF5 that moves the lot up and down between a substrate delivery position and a chemical liquid processing position. The sixth batch processing unit BPU6 includes the batch chemical liquid processing tank CHB6 and a lifter LF6 that moves the lot up and down between a substrate delivery position and a chemical liquid processing position. Thus, the lot is subjected to acid processing in any one of the batch chemical liquid processing tank CHB2 to the batch chemical liquid processing tank CHB6. When the chemical liquid processing is performed in parallel by the five processing units in this manner, the throughput of the device increases.

The first batch processing unit BPU1 specifically includes the batch rinse processing tank ONB that accommodates a rinse liquid and a lifter LF1 that moves the lot up and down between a substrate delivery position and a rinse position. The substrate delivery position is a position set above the batch rinse processing tank ONB that can be accessed by the second substrate conveyance mechanism WTR, and the rinse position is a position set in the tank of the batch rinse processing tank ONB in which the lot can be immersed in a rinse liquid. The batch rinse processing tank ONB has the same configuration as the batch chemical liquid processing tank CHB2 described above. That is, the batch rinse processing tank ONB accommodates a rinse liquid and is provided with the lifter LF1. Unlike other processing tanks, the batch rinse processing tank ONB accommodates pure water, and is provided for the purpose of cleaning the chemical liquid attached to the plurality of substrates W. In the batch rinse processing tank ONB, when the specific resistance of the pure water in the tank has increased to a predetermined value, the cleaning processing ends.

In this manner, the batch rinse processing tank ONB in the present embodiment is positioned closer to the relay device 6 than the batch chemical liquid processing tanks CHB2 to CHB6. With such a configuration, each mechanism constituting the relay device 6 and the batch chemical liquid processing tank CHB2 to the batch chemical liquid processing tank CHB6 are separated as much as possible, and the relay device 6 is not adversely affected by an acid such as phosphoric acid. In addition, by disposing the relay device 6 and the batch rinse processing tank ONB close to each other, the lot for which the rinse processing has been completed is conveyed by a short distance and immediately loaded into the relay device 6. Thus, according to the configuration of the present embodiment, the conveyance of the substrate W can be quickly completed while maintaining the wet state of the substrate W.

5.2. Collective Conveyance Region

The collective conveyance region R2 in the batch processing block 7 is a rectangular region extending in the front-back direction (X direction). The collective conveyance region R2 is provided along the outer edge of the batch processing region R1, and has one end side extending to the transfer block 5 and the other end side extending in a direction away from the transfer block 5. Thus, the collective conveyance region R2 also has a configuration along the relay device 6 at a position sandwiched between the transfer block 5 and the batch processing block 7.

In the collective conveyance region R2, the second substrate conveyance mechanism WTR for collectively conveying a plurality of substrates W is provided. The second substrate conveyance mechanism WTR collectively conveys a plurality of substrates W (specifically, the lot) between the substrate delivery position PP defined in the transfer block 5, the dry lot support unit 33, the batch drying chamber DC, each of the batch processing units BPU1 to BPU6, and the loading position IP in the relay device 6 described later. The second substrate conveyance mechanism WTR is configured to be able to reciprocate in the front-back direction (X direction) across the transfer block 5, the relay device 6, and the batch processing block 7. The second substrate conveyance mechanism WTR is movable not only to the collective conveyance region R2 in the batch processing block 7 but also to the substrate delivery position PP in the transfer block 5, the dry lot support unit 33, and the loading position IP in the relay device 6.

The second substrate conveyance mechanism WTR includes a pair of chucks 29 that conveys the lot. The pair of chucks 29 can be changed between a closed state in which they are close to each other and an open state in which they are separated from each other. The chucks 29 are members extending in the Y direction in which grooves for gripping the substrate W are arrayed at the half pitch. The pair of chucks 29 receives a plurality of substrates W constituting a lot in the closed state. The pair of chucks 29 delivers the plurality of substrates W constituting the lot to another member (lifter LF1 or the like) in the open state. The second substrate conveyance mechanism WTR delivers and receives the lot to and from the substrate delivery position PP in the transfer block 5, the dry lot support unit 33, and a lifter LF65 belonging to a lot standby tank 65 provided at the loading position IP in the relay device 6. In addition, the second substrate conveyance mechanism WTR delivers and receives the lot to and from each of the lifters LF1 to LF6 belonging to the batch processing units BPU1 to BPU6 in the batch processing block 7 and the batch drying chamber DC.

The collective conveyance region R2 is provided with a guide rail 31X extending in the X direction to guide the second substrate conveyance mechanism WTR. The second substrate conveyance mechanism WTR is movable forward and backward in the X direction along the guide rail 31X. Thus, the guide rail 31X extends from the batch processing block 7 to the transfer block 5 via the relay device 6. More specifically, the guide rail 31X faces the substrate delivery position PP in the transfer block 5 from the Y direction, and faces the sixth batch processing unit BPU6 in the batch processing block 7 from the Y direction. In addition, the guide rail 31X faces the dry lot support unit 33 in the transfer block 5, the lot standby tank 65 in the relay device 6, the batch drying chamber DC in the batch processing block 7, and the first batch processing unit BPU1 to the sixth batch processing unit BPU6 from the Y direction.

5.3. Other Configurations

The batch drying chamber DC is disposed at a position sandwiched between the first batch processing unit BPU1 and the relay device 6. The batch drying chamber DC includes a drying chamber that accommodates a lot in which the substrates W in the vertical orientation are arrayed. The drying chamber includes an inert gas supply nozzle that supplies an inert gas into the chamber and a vapor supply nozzle that supplies vapor of an organic solvent into the tank. The batch drying chamber DC first supplies an inert gas to the lot supported in the chamber to replace the atmosphere in the chamber with the inert gas. Then, pressure reduction in the chamber starts. In a state where the pressure reduction in the chamber is being performed, vapor of an organic solvent is supplied into the chamber. The organic solvent is discharged to the outside of the chamber together with moisture attached to the substrate W. In this manner, the batch drying chamber DC performs the drying of the lot. The inert gas at this time may be, for example, nitrogen, and the organic solvent may be, for example, isopropyl alcohol (IPA).

The carrier placement shelf 13*a*, the batch drying chamber DC, and the batch processing units BPU1 to BPU6 in the batch processing device 1 are disposed in the front-back direction. That is, the carrier placement shelf 13*a* is disposed on the front side, and the batch drying chamber DC is disposed behind the carrier placement shelf. The batch processing units BPU1 to BPU6 are disposed further behind them. In the batch processing device 1 of the present embodiment, the layout in the device is optimized so that the moving distance of the second substrate conveyance mechanism WTR decreases.

6. Relay Device

The relay device 6 is configured to bridge the batch processing device 1 and the single wafer processing device 2, having a left end portion fitted into the batch processing device 1 and a right end portion fitted into the single wafer processing device 2. The relay device 6 includes a conveyance path of the substrate W extending in the Y direction connecting the collective conveyance region R2 of the batch processing device 1 to the single wafer conveyance region R3 of the single wafer processing device 2. The conveyance path is configured to convey the substrate W in the Y direction (horizontally) without changing the position of the substrate W in the Z direction. Thus, the insertion position of the relay device 6 in the batch processing device 1 and the insertion position of the relay device 6 in the single wafer processing device 2 are at the same position in the Z direction.

The relay device 6 is configured to convey the substrate W for which the batch processing has been completed from the batch processing device 1 to the single wafer processing device 2. The relay device 6 is positioned in the middle layer of the batch processing device 1 and the single wafer processing device 2 (see FIG. 17). Thus, the relay device 6 bridges the batch processing device 1 and the single wafer processing device 2 at a position in the air away from the floor surface on which the batch processing device 1 and the single wafer processing device 2 are installed. Since the specific position of the relay device 6 is related to the structure of the single wafer processing device 2, the specific position will be described in detail in accordance with the description of the single wafer processing device 2.

The relay device 6 includes a relay housing 6A that couples the first housing 1A of the batch processing device 1 and the second housing 2A of the single wafer processing device 2 separated from each other in the Y direction. The relay housing 6A is provided between a third wall surface 1B facing the second housing 2A among the wall surfaces constituting the first housing 1A and a fourth wall surface 2B facing the third wall surface 1B among the wall surfaces constituting the second housing 2A.

The relay housing 6A includes a side wall 62*a*, a bottom plate 62*b*, and a top plate 62*c* that couple the batch processing device 1 and the single wafer processing device 2. The configurations of the side wall 62*a*, the bottom plate 62*b*, and the top plate 62*c* are detailed in FIG. 2 and FIG. 17. The relay housing 6A couples the housings of the batch processing device 1 and the single wafer processing device 2 to constitute one substrate processing system. As a result, the substrate processing system has a configuration in which the outside air and the atmosphere in the device are isolated.

The relay device 6 includes the lot standby tank 65 that causes a lot for which the batch processing has been completed to stand by in pure water, an underwater orientation changing unit 55 that receives a plurality of substrates W arrayed in the Y direction and collectively rotates the received substrates W by 90° in the water to change the orientation of the plurality of substrates W from the vertical orientation to the horizontal orientation, a relay conveyance mechanism OTR that conveys the substrates W in the horizontal orientation one by one to an unloading position OP, and an unloading path 26 that can hold the substrates W in the horizontal orientation. The lot standby tank 65, the underwater orientation changing unit 55, the relay conveyance mechanism OTR, and the unloading path 26 are arrayed in this order in the right direction starting from the left portion of the batch processing device 1. The loading position IP at which the lot is loaded in from the batch processing device 1 is set in the lot standby tank 65. Thus, in the relay device 6, the loading position IP and the unloading position OP are disposed in the left-right direction orthogonal to the front-back direction. Hereinafter, each unit will be specifically described.

6.1. Relay Device: Lot Standby Tank

The lot standby tank 65 immerses the lot for which the batch processing has been completed in pure water. The lot standby tank 65 has the same configuration as the first batch processing unit BPU1 included in the batch processing device 1. That is, the lot standby tank 65 includes the lifter LF65 that holds pure water and moves the lot up and down. The lifter LF65 can reciprocate between the loading position IP for loading the lot into the relay device 6 and an immersion position for immersing the loaded lot in pure water. The loading position IP is a position determined for receiving the substrate for which the batch processing has been completed from the batch processing device 1. The loading position IP is positioned above the immersion position and is a position where the second substrate conveyance mechanism WTR can convey the substrate. The loading position IP is set such that the entire area of the substrates W constituting the lot is in the air, and the immersion position is set such that the entire area of the substrates W constituting the lot is immersed in pure water.

6.2. Relay Device: Full-Pitch Array Substrate Conveyance Mechanism

A half-lot conveyance mechanism STR sorts the lot immersed in the lot standby tank 65 into the first substrate W1 and the second substrate W2. The half-lot conveyance mechanism STR can convey 25 substrates W arrayed at the full pitch between the lot standby tank 65 and the underwater orientation changing unit 55. In the lot standby tank 65, 50 substrates W arrayed at the half pitch are on standby, and the half-lot conveyance mechanism STR picks up 25 substrates, which is half of the substrates W, and conveys the substrates W to the underwater orientation changing unit 55. The half-lot conveyance mechanism STR includes a pair of chucks 30 similar to the pair of chucks 29 in the second substrate conveyance mechanism WTR. Similarly to the chuck 29, the chuck 30 has grooves formed at half-pitch intervals, but is different from the chuck 29 in that two types of grooves are alternately arrayed. That is, in the chuck 30, deep grooves that cannot grip the substrate W and shallow grooves that grip the substrate W are alternately arrayed at half-pitch intervals. Thus, when the lot in the lifter LF65 is to be gripped by the half-lot conveyance mechanism STR, 25 substrates W are picked up by the shallow grooves capable of gripping the substrates W, and the remaining 25 substrates W cannot abut on the deep groove and remain in the lifter LF65. Since the shallow grooves in the chuck 30 are arrayed at the pitch (full pitch) that is twice the half pitch, the half-lot conveyance mechanism STR picks up 25 substrates W arrayed at the full pitch from the lot in the lifter LF65. Since the lot is configured by arraying the substrates W in a face-to-face manner, the picked-up substrates W are arrayed such that the front surface (device surface) is on the right side and the back surface is on the left side so that the device surfaces of adjacent substrates W do not face each other. On the other hand, the 25 substrates W that are not picked up and remain in the lifter LF65 are arrayed such that the front surface (device surface) is on the left side and the back surface is on the right side so that the device surfaces of adjacent substrates W do not face each other.

Similarly to the chucks 29 of the second substrate conveyance mechanism WTR, the pair of chucks 30 included in the half-lot conveyance mechanism STR can take two states, a closed state in which the chucks 30 are close to each other in the X direction, and an open state in which the chucks 30 are separated from each other in the X direction. When the pair of chucks 30 is in the closed state, the chucks 30 are sufficiently close to each other with respect to the diameter of the substrate W, and thus, two places in the lower portion of the substrate W abut on each of the chucks 30. In this manner, the substrate W is gripped by the pair of chucks 30. When the pair of chucks 30 in the closed state is opened, the chucks 30 are sufficiently separated from each other with respect to the diameter of the substrate W, and thus the substrate W is detached from the chuck 30. Specifically, the case where the pair of chucks 30 is in the open state is before receiving the plurality of substrates W from the lifter LF65 at the loading position IP and after delivering the plurality of substrates W to the pusher 55A described later at a position above the immersion tank described later.

The relay device 6 is provided with a guide rail 31Y extending in the Y direction to guide the half-lot conveyance mechanism STR. The half-lot conveyance mechanism STR is movable forward and backward in the Y direction along the guide rail 31Y Thus, the guide rail 31Y extends from the lot standby tank 65 to the underwater orientation changing unit 55.

The half-lot conveyance mechanism STR can move forward and backward in the Y direction from the loading position IP, which is the position at which the lot of the lifter LF65 is delivered by being guided by the guide rail 31Y, to the position above the immersion tank at which the pusher 55A to be described later included in the underwater orientation changing unit 55 receives the plurality of substrates W. As a result, the half-lot conveyance mechanism STR can convey the plurality of substrates W from the loading position IP to the position above the immersion tank in the Y direction. Further, when the second substrate conveyance mechanism WTR moves from the transfer block 5 to the batch processing block 7, the half-lot conveyance mechanism STR can move to the position above the immersion tank so as not to interfere with the second substrate conveyance mechanism WTR (see FIG. 2).

6.3. Relay Device: Underwater Orientation Changing Unit

The underwater orientation changing unit 55 corresponds to a second orientation changing mechanism of the present invention. The underwater orientation changing unit 55 changes the orientation of the plurality of substrates W received from the batch processing device 1 from the vertical orientation to the horizontal orientation. The underwater orientation changing unit 55 collectively changes the orientation of the sorted first substrate W1 and second substrate W2 from the vertical orientation to the horizontal orientation. The underwater orientation changing unit 55 includes an immersion tank 73 that holds pure water, an inverting chuck 71 positioned above the immersion tank 73, and a pair of inverting chuck support mechanisms 72 each of which holds corresponding one of the inverting chucks 71 and moves up and down and rotates the inverting chuck 71. The inverting chucks 71 can move up and down from the substrate delivery position with the half-lot conveyance mechanism STR set above the liquid surface of the immersion tank 73 to the inside of the liquid in the immersion tank 73. The inverting chucks 71 can immerse the plurality of substrates W received from the half-lot conveyance mechanism STR in the immersion tank 73 and rotate 90° in one direction or in the opposite direction in such a state. The orientation of the plurality of substrates W in the vertical orientation is changed into the horizontal orientation by the rotation of the pair of inverting chucks 71.

The inverting chucks 71 can change their state between a closed state in which the plurality of substrates W can be held by the operation of the pair of inverting chuck support mechanisms 72 and an open state in which the plurality of held substrates W are opened. The inverting chucks 71 can also be rotated by 90° in one direction and the opposite direction while maintaining the mutual positional relationship by the operation of the pair of inverting chuck support mechanisms 72. Then, the inverting chucks 71 can move up and down from above the immersion tank 73 to the inside of the immersion tank 73 in a state where the positional relationship between the inverting chucks is maintained by the operation of the pair of inverting chuck support mechanisms 72.

The inverting chuck 71 has a comb shape in which a plurality of V-shaped grooves 71*a* are provided at full pitch intervals, and the pair of inverting chucks 71 holds the plurality of substrates W from both sides by fitting the plurality of substrates W into the V-shaped grooves. When the inverting chucks 71 are in the closed state, each of the substrate ends abuts on the deepest portion of the V-shaped groove, and even when the inverting chucks 71 are rotated in this state, the substrate W does not slide off the inverting chucks 71. When the inverting chucks 71 are in the open state, the substrate W can be received from the half-lot conveyance mechanism STR holding the plurality of substrates W and on standby above the immersion tank 73. The inverting chucks 71 can also take a state between the closed state and the open state (half-open state), and this state will be described later.

6.4. Relay Device: Relay Conveyance Mechanism

The relay conveyance mechanism OTR is a mechanism provided between the loading position IP and the unloading position OP, which can convey the substrates W whose orientation has been changed into the horizontal orientation by the underwater orientation changing unit 55 to the single wafer processing device 2 one by one. As illustrated in FIG. 1, the relay conveyance mechanism OTR is guided by a relay rail 32Y extending in the Y direction from the underwater orientation changing unit 55 to the unloading position OP to be described later, and can move in the Y direction. The relay conveyance mechanism OTR includes a second hand 103*b*. The relay conveyance mechanism OTR can receive the substrates W in the horizontal orientation one by one from the inverting chucks 71 with the second hand 103*b* facing the underwater orientation changing unit 55. Further, the relay conveyance mechanism OTR can convey the substrate to the unloading position OP where the unloading path 26 is provided.

Figure 5B:
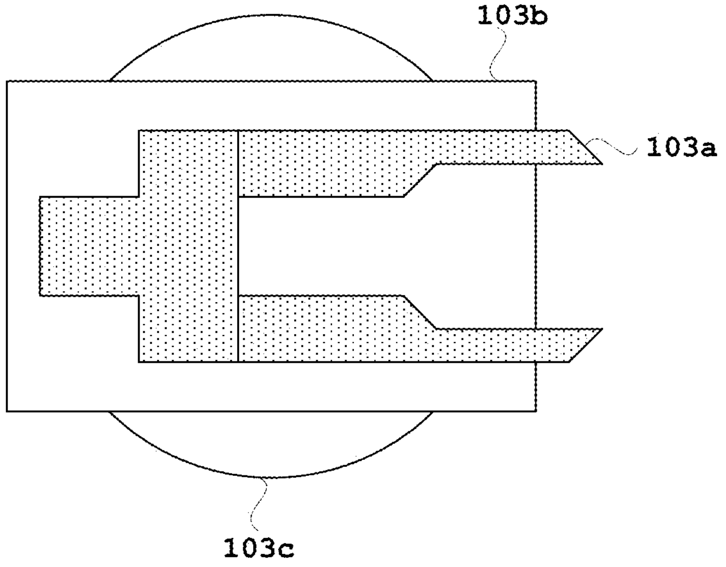
FIG. 5B is a schematic view for describing the batch processing tank according to the embodiment and also a plan view for describing a configuration of the relay conveyance mechanism according to the embodiment.

As illustrated in FIG. 5B, the relay conveyance mechanism OTR includes a first hand 103*a* that acquires the substrate W after drying and the second hand 103*b* that acquires the substrate W before drying. The first hand 103*a* can support one substrate W in the horizontal orientation. In the same manner, the second hand 103*b* can support one substrate W in the horizontal orientation. The first hand 103*a* and the second hand 103*b* are arrayed in the vertical direction and connected to a common base 103*c*. The first hand 103*a* and the second hand 103*b* can independently move forward and backward in the horizontal direction with respect to the base 103*c*. When the first hand 103*a* is moved forward with respect to the second hand 103*b*, the second hand 103*b* does not interfere with the substrate acquisition of the first hand 103*a*. When the second hand 103*b* is moved forward with respect to the first hand 103*a*, the first hand 103*a* does not interfere with the substrate acquisition of the second hand 103*b*.

The first hand 103*a* is positioned above the second hand 103*b*. Such a configuration prevents the moisture adhering to the second hand 103*b* from dripping onto the first hand 103*a*. That is, since the first hand 103*a* is always in a dry state, the substrate W acquired by the first hand 103*a* does not get wet because of the first hand 103*a*.

In the relay conveyance of the substrate W in the present embodiment, the first hand 103*a* is not used. In the present embodiment, how the wet substrate W is conveyed using the second hand 103*b* will be described. The substrate conveyance using the first hand 103*a* will be described later.

6.5. Relay Device: Operation of Relay Conveyance Mechanism

Figure 6A:
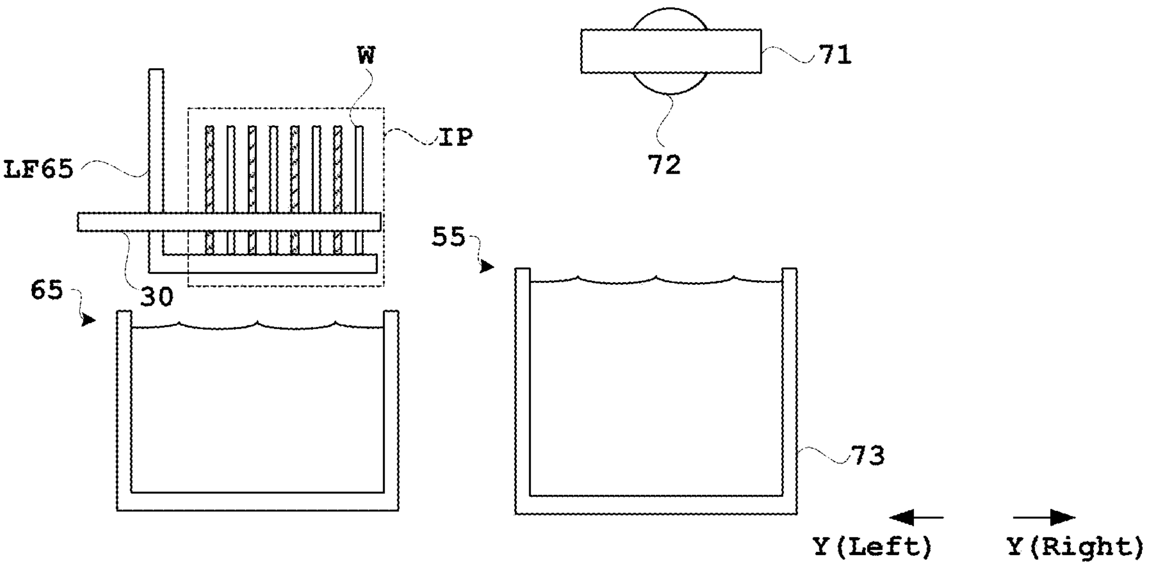
FIG. 6A is a schematic view for describing relay conveyance according to the embodiment.

A state in which the relay device 6 conveys the substrate W at the loading position IP to the unloading position OP will be described. The unloading position OP is a position determined for transferring the substrate W received at the loading position IP to the single wafer processing device 2. FIG. 6A illustrates a state in which the lifter LF65 holds a plurality of substrates W at the loading position IP set above the lot standby tank 65. The second substrate conveyance mechanism WTR executes the conveyance of the substrates to the loading position IP. The plurality of substrates W placed on the lifter LF65 are arrayed in a face-to-face manner in which the substrates W with the device surfaces facing rightward and the substrates W with the device surfaces facing leftward are alternately arrayed.

At this time, when the lifter LF65 moves down from the loading position IP to the immersion position, it is possible to prevent the substrates W waiting for being conveyed from becoming dried while the substrates W are conveyed one by one in the relay device 6.

FIG. 6A illustrates a state in which the plurality of substrates W are collectively delivered from the lifter LF65 to the half-lot conveyance mechanism STR to convey the plurality of substrates W to the underwater orientation changing unit 55. The lifter LF65 at this time supports the plurality of substrates W at the loading position IP, and the half-lot conveyance mechanism STR moves the pair of chucks 30 to a position where the lot can be held and brings the chucks 30 in to the closed state. At this time, as described above, the chucks 30 can grip only half of the plurality of substrates W arrayed at the half pitch constituting the lot. As a result, in the lot, the substrates W held by the chucks 30 and the substrates W not held by the chucks 30 are alternately arrayed.

Figure 6B:
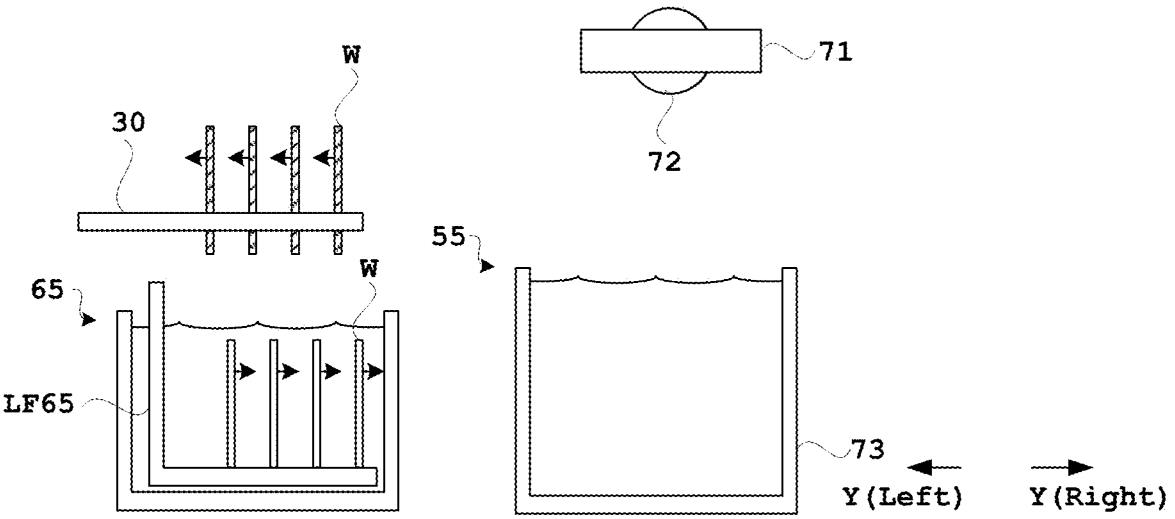
FIG. 6B is a schematic view for describing relay conveyance according to the embodiment.

FIG. 6B illustrates a state in which the lifter LF65 has then moved down from the loading position IP to the immersion position. When the lifter LF65 has moved down from the state of FIG. 6A, the plurality of substrates W arrayed at the full pitch corresponding to half of the substrates W constituting the lot remain in the half-lot conveyance mechanism STR, and the remaining half of the substrates W are returned to the lot standby tank 65 in a state of being arrayed at the full pitch in the lifter LF65. The plurality of substrates W remaining in the half-lot conveyance mechanism STR have device surfaces facing rightward, and the plurality of substrates W held at the immersion position by the lifter LF65 have device surfaces facing leftward.

Figure 7A:
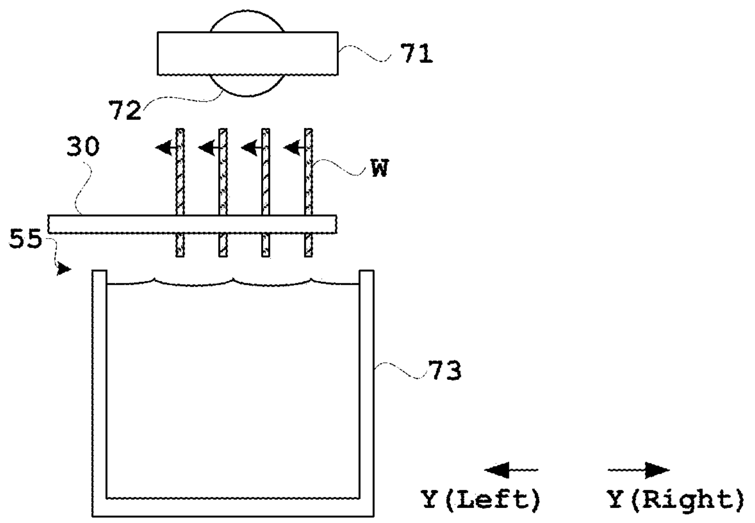
FIG. 7A is a schematic view for describing relay conveyance according to the embodiment.

FIG. 7A illustrates a state in which the half-lot conveyance mechanism STR has then conveyed the plurality of substrates W to above the immersion tank 73. The pair of inverting chucks 71 at this time is positioned above the half-lot conveyance mechanism STR, and the rotation angle is 0° of the initial state. The inverting chucks 71 in the initial state extends in the horizontal direction and can receive a plurality of substrates W in the vertical orientation.

Figure 7B:
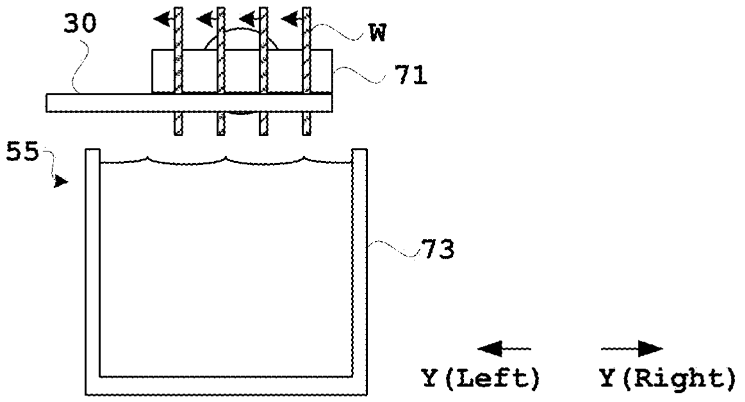
FIG. 7B is a schematic view for describing relay conveyance according to the embodiment.
Figure 7C:
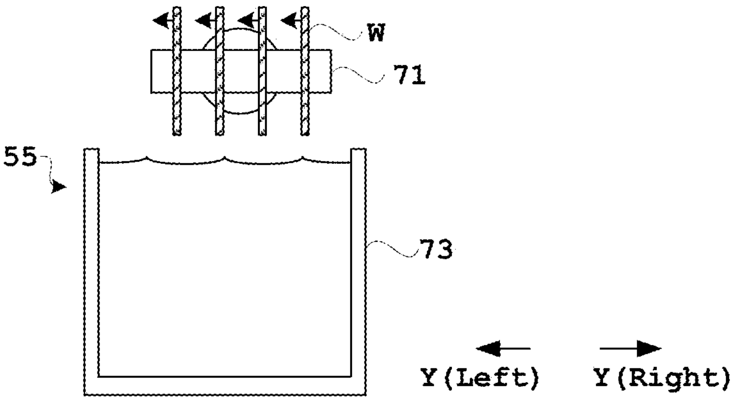
FIG. 7C is a schematic view for describing relay conveyance according to the embodiment.

FIG. 7B illustrates a state in which the inverting chucks 71 have then moved down to the half-lot conveyance mechanism STR. The operation of the inverting chucks 71 is realized by the inverting chuck support mechanisms 72. FIG. 7B illustrates a state in which 25 substrates W are transferred from the chucks 30 of the half-lot conveyance mechanism STR to the inverting chucks 71. That is, the pair of inverting chucks 71 is lowered to the half-lot conveyance mechanism STR while maintaining the open state, and then is brought into the closed state. Since the pair of inverting chucks 71 in the open state is separated at a space for passing the substrate W, they approach the chucks 30 without contacting the substrates W. Thereafter, the inverting chucks 71 are brought into the closed state by the operation of the inverting chuck support mechanisms 72 and grip the 25 substrates W. The 25 substrates W at this time are gripped by both the chucks 30 and the inverting chucks 71. Thereafter, the chucks 30 become the open state and retract in the Y direction (left direction). In this manner, the delivery and reception of the substrate W from the chucks 30 to the inverting chucks 71 is executed. FIG. 7C illustrates a state in which 25 substrates W are transferred to the inverting chucks 71. As indicated by an arrow in FIG. 7C, the inverting chuck 71 moves down to below the liquid level of the immersion tank 73, and immerses the 25 substrates W in pure water held by the immersion tank 73.

Figure 8A:
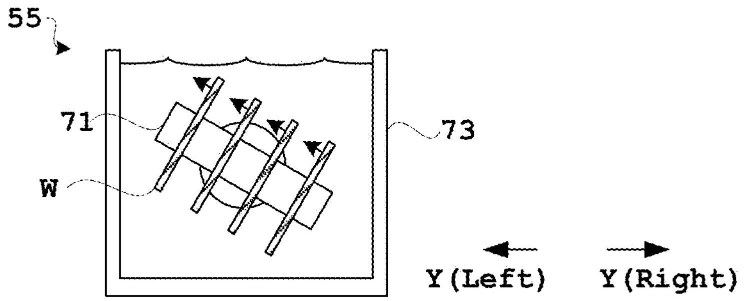
FIG. 8A is a schematic view for describing relay conveyance according to the embodiment.
Figure 8B:
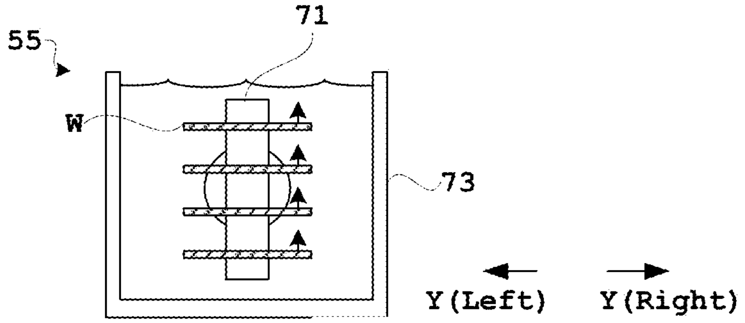
FIG. 8B is a schematic view for describing relay conveyance according to the embodiment.

FIG. 8A illustrates a state in which the inverting chuck 71 is then rotating by 90° in a state in which the 25 substrates W are immersed in pure water. The operation of the inverting chucks 71 is realized by the inverting chuck support mechanisms 72. FIG. 8B illustrates a state in which the inverting chuck 71 completes the rotation of 90° In this manner, the device surfaces of the 25 substrates W immersed in the immersion tank 73 and facing the Y direction (left direction) are rotated by 90° and face upward. When the substrates W are tilted in this manner, the orientation of the substrate W can be set to a horizontal orientation with the device surface facing upward. From now, the substrate W in the horizontal orientation is conveyed with the device surface facing upward.

Figure 8C:
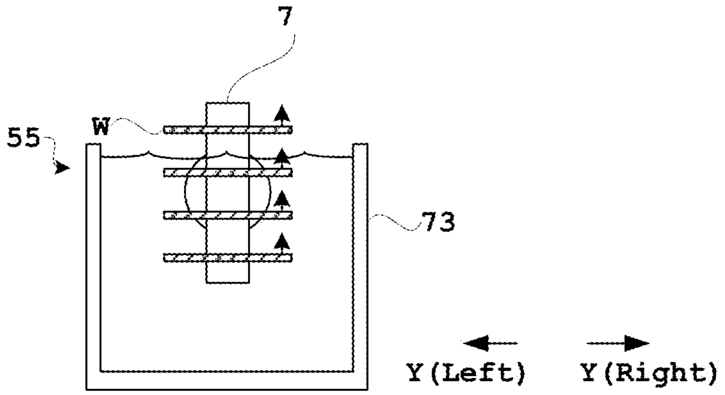
FIG. 8C is a schematic view for describing relay conveyance according to the embodiment.

FIG. 8C illustrates a state in which the inverting chucks 71 have then moved one of the 25 substrates W above the liquid surface of the immersion tank 73. The operation of the inverting chucks 71 is realized by the inverting chuck support mechanisms 72. According to FIG. 8C, there is only one substrate W above the liquid surface, and the remaining 24 substrates W are under the liquid surface in the immersion tank 73. With such a configuration, the 24 substrates W are not dried during standby for conveyance. The one substrate W above the liquid level is conveyed to the unloading position OP by the relay conveyance mechanism OTR while maintaining the horizontal orientation. Thereafter, the inverting chuck support mechanisms 72 move the pair of inverting chucks 71 up by a height corresponding to the full pitch every time the relay conveyance mechanism OTR conveys the substrate W. When this operation is repeated, all of the 25 substrates W are conveyed to the unloading position OP by the relay conveyance mechanism OTR.

The opening/closing operation of the inverting chucks 71 in each state of FIGS. 6A to 8C will be described. As described above, the pair of inverting chucks 71 in the states of FIGS. 6A to 7A is in the open state and is not in a state of being able to hold the substrate W. Since the inverting chucks 71 in the open state can pass the substrates W, the inverting chucks 71 can move to the position illustrated in FIG. 7B without colliding with the substrates W. In FIG. 7B, the pair of inverting chucks 71 is switched from the open state to the closed state. At this time, each of the V grooves included in the pair of inverting chucks 71 causes each of the end portions of the 25 substrates W arrayed at the full pitch to enter and abut on the groove. Since the V grooves are arrayed at a full pitch, the 25 substrates W arrayed at the full pitch easily fit into respective V grooves. How the substrate W fits into each V groove will be described in detail in FIG. 13A. The pair of inverting chucks 71 in FIGS. 7C to 8B is in the closed state and is in a state of gripping the substrate W. In this state, even though the inverting chucks 71 are rotated, the substrate W being gripped does not fall off.

To realize the state of FIG. 8C, it is necessary to devise to prevent the substrate W waiting in the immersion tank 73 from falling while allowing the conveyance of the substrate W by the relay conveyance mechanism OTR. Thus, according to the present embodiment, in the state of FIG. 8C, the pair of inverting chucks 71 is brought into a half-open state. This realizes a state in which the substrate W is supported so as to be taken out. The half-open state will be described in detail in FIGS. 13C and 13D.

Figure 9A:
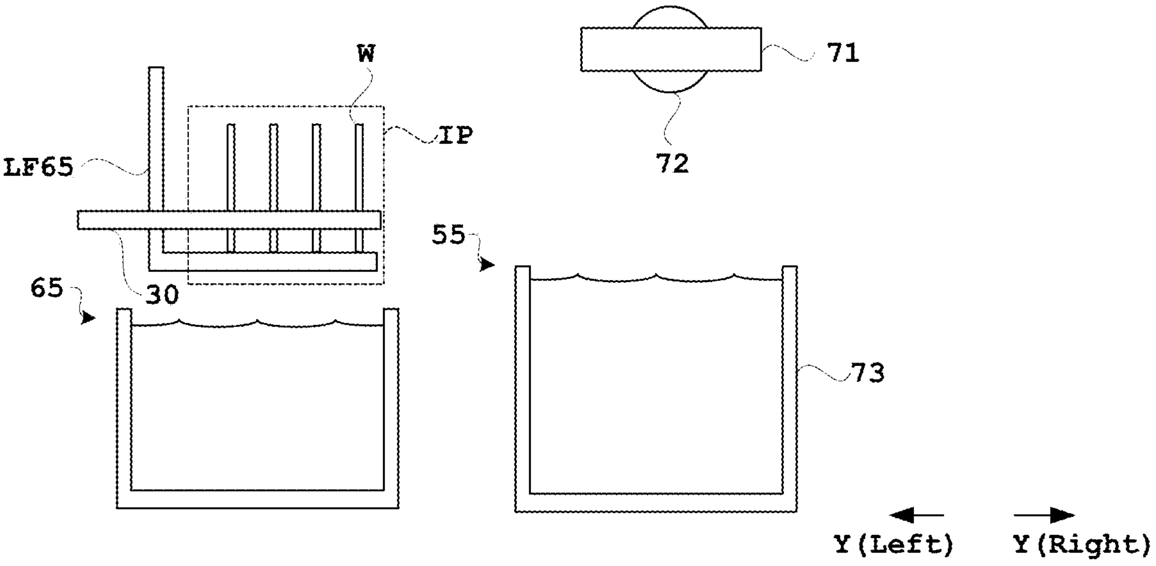
FIG. 9A is a schematic view for describing relay conveyance according to the embodiment.

FIG. 9A illustrates a state in which the lifter LF65 thereafter holds a plurality of substrates W at the loading position IP set above the lot standby tank 65. The second substrate conveyance mechanism WTR executes the conveyance of the substrates to the loading position IP. As the 25 substrates W placed on the lifter LF65, the substrates W whose device surfaces face rightward are arrayed at the full pitch. These substrates W are the substrates W left in the lot standby tank 65 in FIG. 6B. A state in which these 25 substrates W are conveyed will be described below with reference to FIG. 9A and subsequent drawings. FIG. 9A illustrates a state in which the substrate conveyance in the horizontal orientation described in FIG. 8C is completed and the pair of inverting chucks 71 returns to the initial state illustrated in FIG. 6A. The pair of inverting chucks 71 in the initial state can extend in the Y direction to introduce the substrates W in the vertical orientation, and is positioned above the immersion tank 73.

Figure 9B:
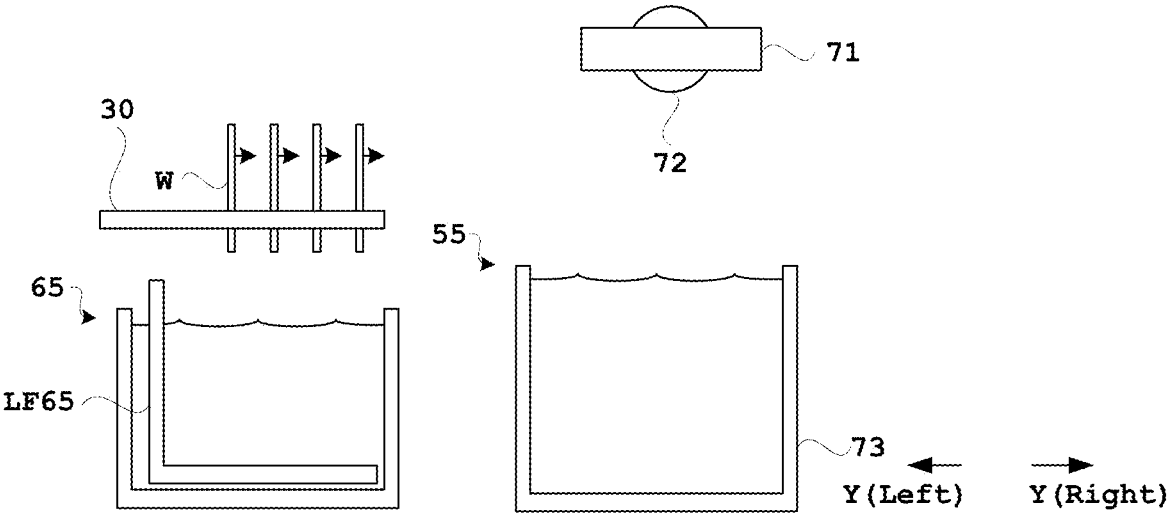
FIG. 9B is a schematic view for describing relay conveyance according to the embodiment.
Figure 10A:
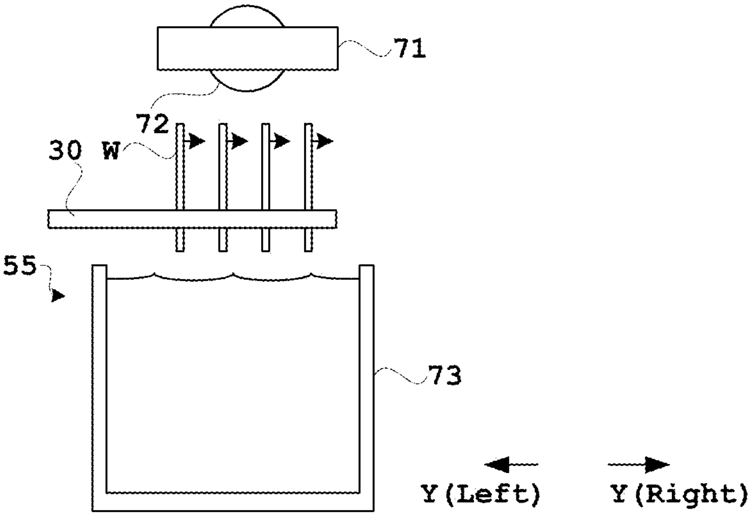
FIG. 10A is a schematic view for describing relay conveyance according to the embodiment.
Figure 10B:
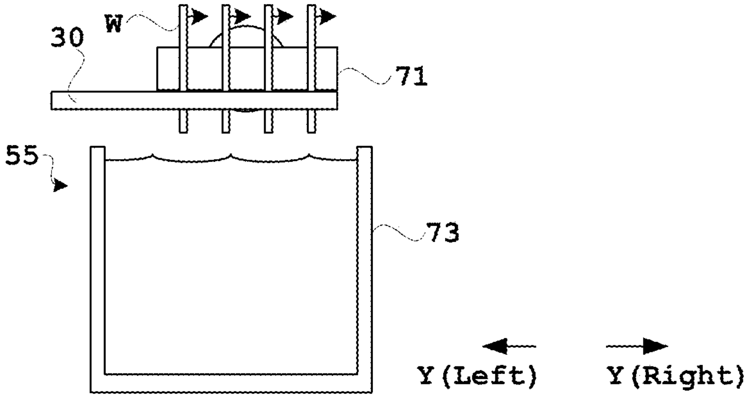
FIG. 10B is a schematic view for describing relay conveyance according to the embodiment.
Figure 10C:
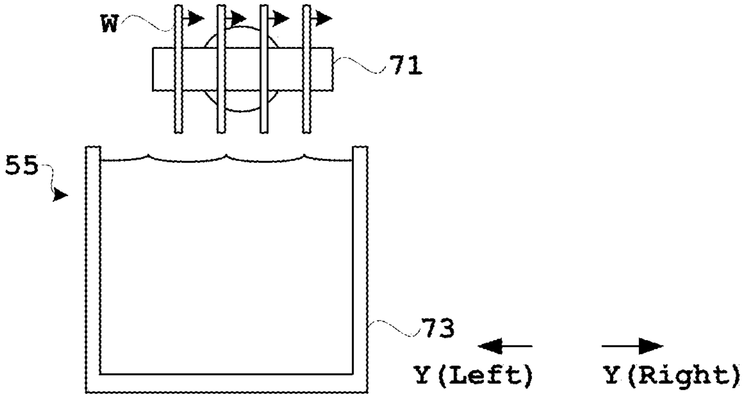
FIG. 10C is a schematic view for describing relay conveyance according to the embodiment.

FIG. 9B is a view corresponding to FIG. 6B described above, and illustrates a state in which 25 substrates W are transferred to the chucks 30 of the half-lot conveyance mechanism STR. FIG. 10A is a view corresponding to FIG. 7A described above, and illustrates a state in which the half-lot conveyance mechanism STR moves the 25 substrates W to a position sandwiched between the immersion tank 73 and the pair of inverting chucks 71. FIG. 10B is a view corresponding to FIG. 7B described above, and illustrates a state in which the 25 substrates W are transferred to the pair of inverting chucks 71 from the half-lot conveyance mechanism STR. FIG. 10C is a view corresponding to FIG. 7C described above, illustrating a state in which the 25 substrates W supported by the pair of inverting chucks 71 are above the immersion tank 73.

Figure 11A:
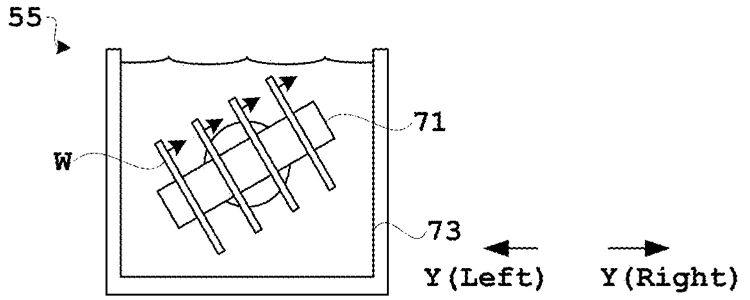
FIG. 11A is a schematic view for describing relay conveyance according to the embodiment.
Figure 11B:
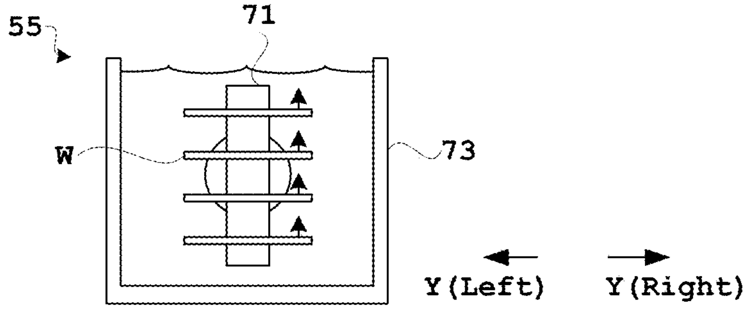
FIG. 11B is a schematic view for describing relay conveyance according to the embodiment.

FIG. 11A illustrates a state in which the inverting chucks 71 are then rotating by −90° in a state in which the 25 substrates W are immersed in pure water. The operation of the inverting chucks 71 is realized by the inverting chuck support mechanisms 72. FIG. 11B illustrates a state in which the inverting chucks 71 have completed the rotation of −90°. In this manner, the device surfaces of the 25 substrates W immersed in the immersion tank 73 and facing the Y direction (right direction) are rotated by 90° and face upward. When the substrates W are tilted in this manner, the orientation of the substrate W can be set to a horizontal orientation with the device surface facing upward. From now, the substrate W in the horizontal orientation is conveyed with the device surface facing upward.

Figure 11C:
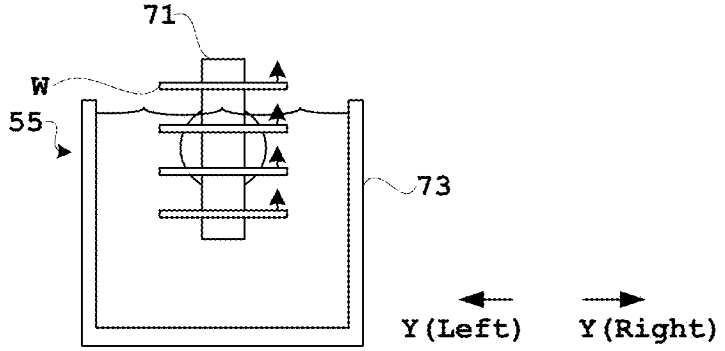
FIG. 11C is a schematic view for describing relay conveyance according to the embodiment.

FIG. 11C is a view corresponding to FIG. 8C described above, illustrating a state in which only the substrate W at the uppermost position is exposed above the liquid surface of the immersion tank 73 while the pair of inverting chucks 71 is in the half-open state. Thereafter, the inverting chuck support mechanisms 72 move the pair of inverting chucks 71 up by a height corresponding to the full pitch every time the relay conveyance mechanism OTR conveys the substrate W. When this operation is repeated, all of the 25 substrates W are conveyed to the unloading position OP by the relay conveyance mechanism OTR.

Figure 12A:
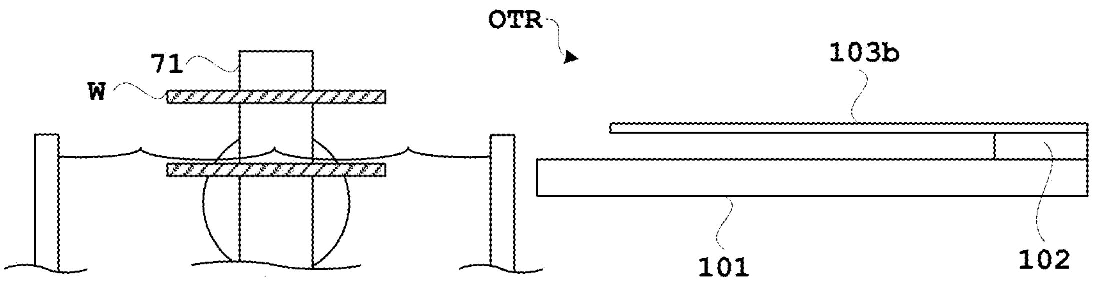
FIG. 12A is a schematic view for describing relay conveyance according to the embodiment.
Figure 12B:
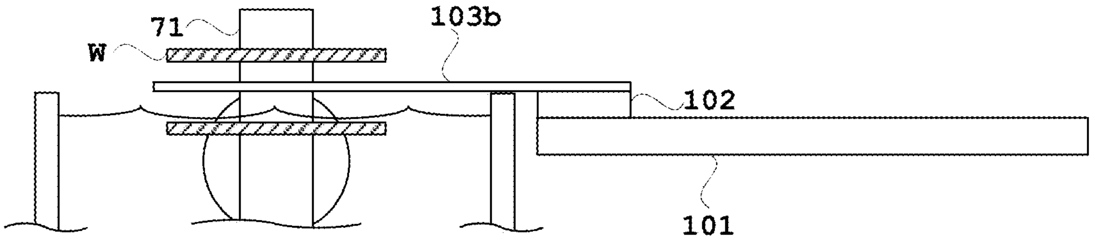
FIG. 12B is a schematic view for describing relay conveyance according to the embodiment.

Hereinafter, a state in which the relay conveyance mechanism OTR conveys the substrate W in the horizontal orientation from the inverting chucks 71 in the state in FIGS. 8C and 11C will be described. FIG. 12A illustrates a state in which the relay conveyance mechanism OTR is moved to the vicinity of the immersion tank 73 to convey the substrate W. As illustrated in FIG. 12A, the second hand 103*b* of the relay conveyance mechanism OTR includes a slide mechanism 102 that moves the second hand 103*b* forward and backward, and a support mechanism 101 that supports the slide mechanism 102. The slide mechanism 102 supports the base of the second hand 103*b* and can move the second hand 103*b* forward as illustrated in FIG. 12B or can move the second hand 103*b* backward as illustrated in FIG. 12D. The support mechanism 101 can reciprocate the slide mechanism 102 and the second hand 103*b* in the Y direction. The support mechanism 101 can direct the second hand 103*b* toward the immersion tank 73 or toward the unloading position OP by rotating the second hand 103*b* by 180°.

FIG. 12B illustrates a state in which the second hand 103*b* is inserted between the substrate W above the liquid surface and the substrate W below the liquid surface by the slide mechanism 102. When the second hand 103*b* is in the state of FIG. 12B, preparation for acquiring the substrate W in the horizontal orientation is completed. The slide mechanism 102 at this time moves from the initial position to the advanced position.

Figure 12C:
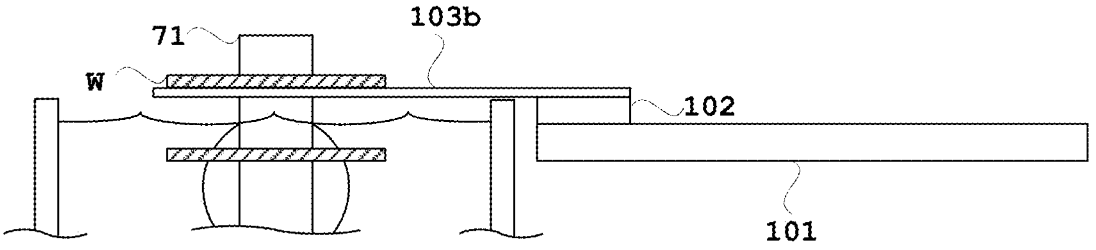
FIG. 12C is a schematic view for describing relay conveyance according to the embodiment.
Figure 12D:
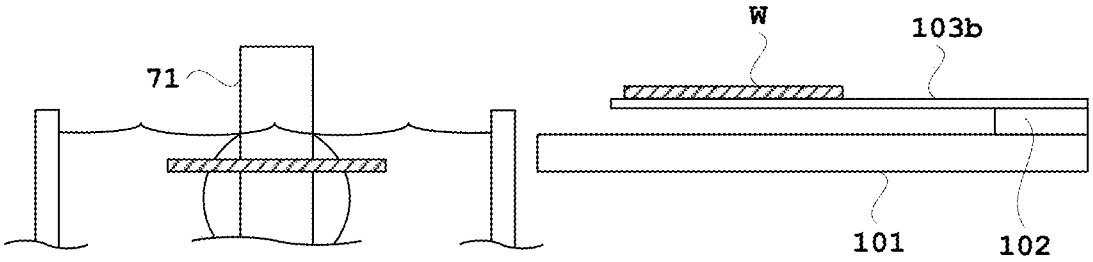
FIG. 12D is a schematic view for describing relay conveyance according to the embodiment.

FIG. 12C illustrates a state in which the pair of inverting chucks 71 moves down while maintaining the positional relationship with each other, and the substrate W above the liquid level is brought into contact with the upper surface of the second hand 103*b*. When the substrate W is acquired by the second hand 103*b* by moving the inverting chucks 71 down in this manner, the relay conveyance mechanism OTR can be configured without the configuration of moving the second hand 103*b* up and down, and thus a substrate processing system having a simple device configuration and few failures can be provided.

FIG. 12D illustrates a state in which the second hand 103*b* in a state of acquiring the substrate W is retracted to the support mechanism 101 of the relay conveyance mechanism OTR by the slide mechanism 102. Since the pair of inverting chucks 71 is in the half-open state, the pair of inverting chucks supports the substrate W held in the liquid while allowing the substrate W to be pulled out by the second hand 103*b*. The slide mechanism 102 at this time moves from the advanced position to the initial position.

Figure 13A:
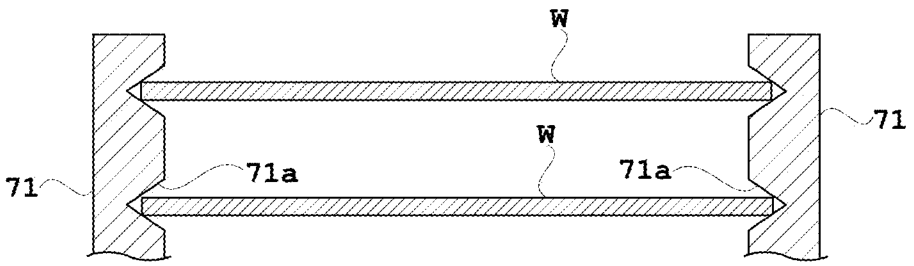
FIG. 13A is a schematic view for describing relay conveyance according to the embodiment.

The half-open state of the pair of inverting chucks 71 will be described. FIG. 13A is a sectional view illustrating a state immediately after 25 substrates W are rotated by 90° or −90° as illustrated in FIGS. 8B and 11B. The pair of inverting chucks 71 at this time is in a closed state, and both ends of the substrate W have reached the deepest portion of the V groove 71*a*. When the pair of inverting chucks 71 presses both ends of the substrate W to fix the substrate W in this manner, the 25 substrates W do not slide off the pair of inverting chucks 71.

Figure 13B:
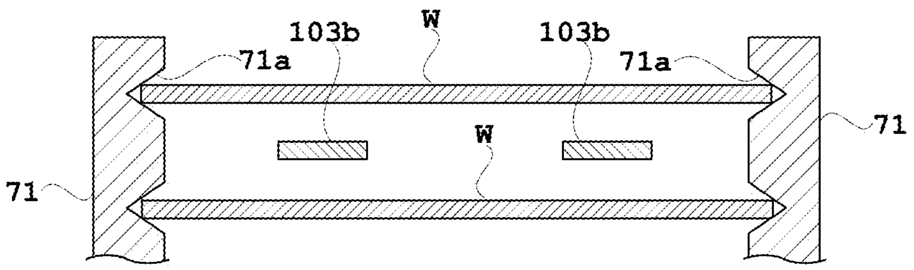
FIG. 13B is a schematic view for describing relay conveyance according to the embodiment.
Figure 13C:
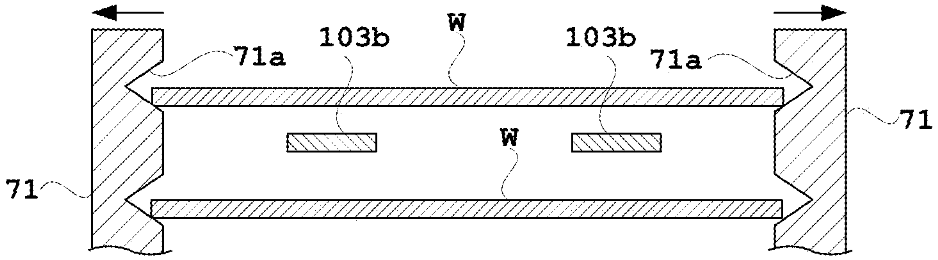
FIG. 13C is a schematic view for describing relay conveyance according to the embodiment.
Figure 13D:
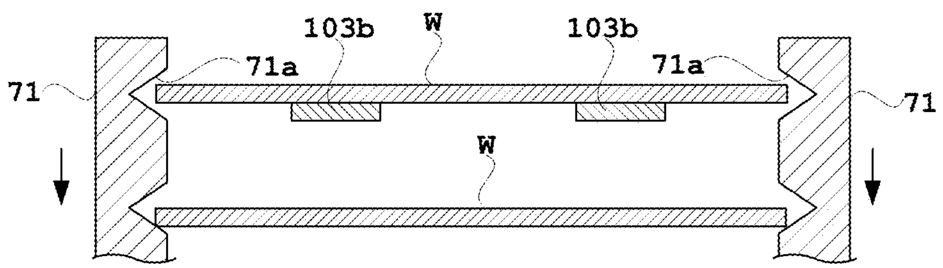
FIG. 13D is a schematic view for describing relay conveyance according to the embodiment.

FIG. 13B is a sectional view corresponding to FIG. 12B described above. The pair of inverting chucks 71 is brought into the closed state, and the second hand 103*b* is inserted between the substrates W. In FIG. 13B and FIGS. 13C and 13D to be described later, illustration of the liquid level in the immersion tank 73 is omitted.

FIG. 13C illustrates a state in which the pair of inverting chucks 71 in the closed state is slightly separated from each other to be in the half-open state. When the pair of inverting chucks 71 is in the half-open state, both ends of the substrate W move from the deepest portion of the V groove and abut on the wall portion constituting the V groove. This state is a state in which the substrate W does not slide off the inverting chuck 71 unless the inverting chuck 71 is rotated, and is a state in which the substrate W itself is not fixed to the inverting chuck 71. Thus, when the pair of inverting chucks 71 is in the half-open state, it is possible to transfer one substrate W to the second hand 103*b* above the liquid level while holding the substrate W waiting in the liquid. However, in the state of FIG. 13C, since the second hand 103*b* is not yet in contact with the substrate W, it is necessary to move the substrate W down with respect to the second hand 103*b* to pass the substrate W to the second hand 103*b*.

FIG. 13D is a sectional view corresponding to FIG. 12C described above. In FIG. 13D, the pair of inverting chucks 71 slightly moves down from the state of FIG. 13C to bring the substrate W into contact with the second hand 103*b*. In the state of FIG. 13D, the substrate W is placed on the second hand 103*b* and is at a position away from the wall surface of the V-shaped groove 71*a* of the inverting chuck 71. That is, in the state of FIG. 13D, the substrate W is not in contact with the inverting chuck 71. Thus, when the slide mechanism 102 is operated to move the second hand 103*b* in this state, the substrate W is pulled out without abutting on the inverting chucks 71.

Figure 14A:
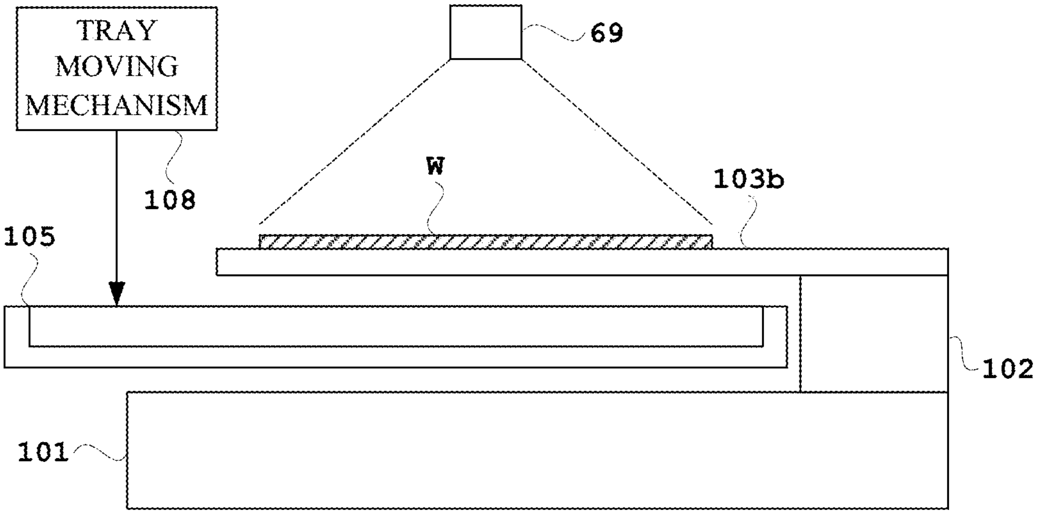
FIG. 14A is a schematic view for describing relay conveyance according to the embodiment.

FIG. 14A illustrates a state of the substrate W in the horizontal orientation acquired from the pair of inverting chucks 71. The substrate processing system of the present embodiment has a configuration related to water retention of the substrate W in the middle of the substrate conveyance path in the relay device 6. A shower head 69 supplies a mist of pure water to the substrate W. Since the shower head 69 is also illustrated in FIG. 1, it can be understood with reference to FIG. 1. A tray 105 is a rectangular dish-shaped member inserted into a gap between the second hand 103*b* and the support mechanism 101, which holds the pure water supplied from the shower head 69 and dropped from the substrate W. Since the tray 105 blocks the operation of the slide mechanism 102, the tray 105 retracts in the X direction with respect to the slide mechanism 102 when the slide mechanism 102 operates as illustrated in FIGS. 12B and 12C. A tray moving mechanism 108 is configured to realize the operation of the tray 105.

Figure 14B:
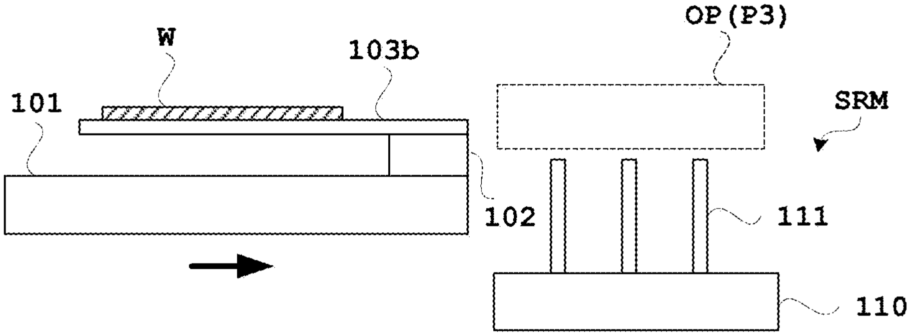
FIG. 14B is a schematic view for describing relay conveyance according to the embodiment.

FIG. 14B illustrates a state in which the relay conveyance mechanism OTR has conveyed the substrate W in the Y direction and moved to the vicinity of the unloading position OP. The second hand 103*b* at this time faces the immersion tank 73 and the inverting chucks 71 in a state of gripping the substrate W.

Figure 14C:
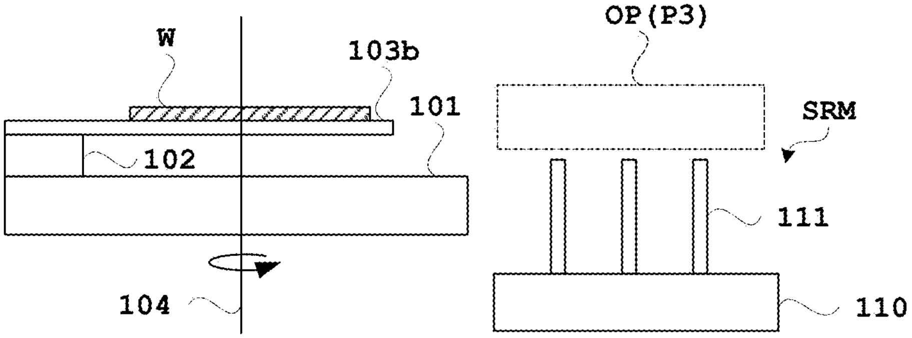
FIG. 14C is a schematic view for describing relay conveyance according to the embodiment.

FIG. 14C illustrates a state in which the support mechanism 101 of the relay conveyance mechanism OTR is then rotated by 180° about a rotation shaft 104 extending in the Z direction. Such an operation of the support mechanism 101 directs the second hand 103*b* facing the immersion tank 73 side to the unloading position OP side.

Figure 15A:
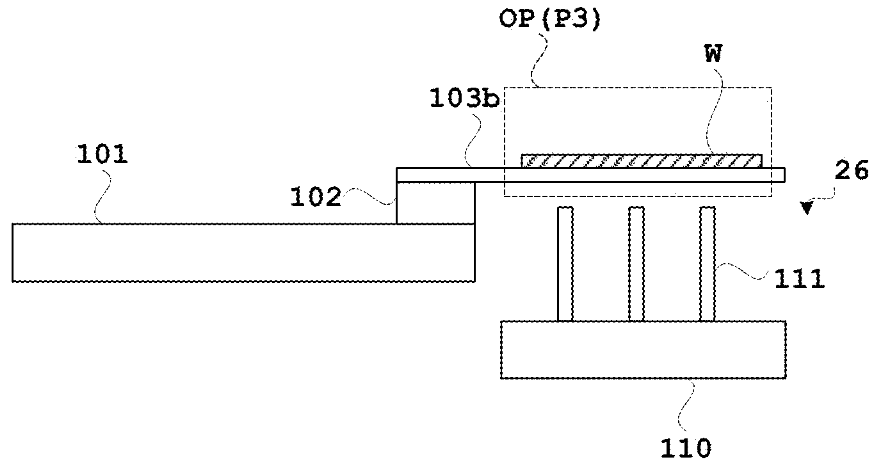
FIG. 15A is a schematic view for describing relay conveyance according to the embodiment.

FIG. 15A illustrates a state in which the slide mechanism 102 has then performed a sliding operation to move the second hand 103*b* holding the substrate W to the unloading position OP. At this time, the substrate W is positioned at the unloading position OP determined in the substrate processing system. The slide mechanism 102 at this time moves from the initial position to the advanced position.

The unloading path 26 is provided at the unloading position OP. Both the relay conveyance mechanism OTR and a center robot CR to be described later can access the unloading path 26. The relay conveyance mechanism OTR transfers the substrate W to the center robot CR of the single wafer processing device 2 through the unloading path 26. The unloading path 26 includes a plurality of (for example, three) support pins 111 extending in the Z direction. The support pins 111 are retractable in the Z direction. Each of the support pins 111 extend and contract synchronously such that the tip has the same height. A bottom plate 110 is configured to support the base end portion of the support pin 111. In FIG. 15A, the tip of the support pin 111 is positioned below the unloading position OP.

Figure 15B:
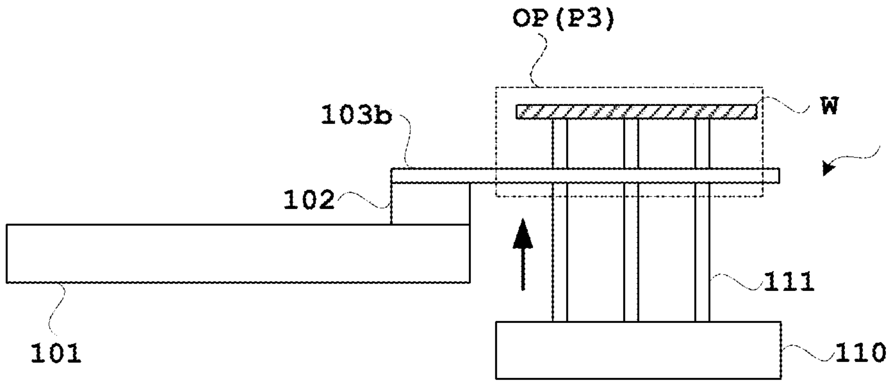
FIG. 15B is a schematic view for describing relay conveyance according to the embodiment.

FIG. 15B illustrates a state in which the support pins 111 then extend, and the substrate W supported by the second hand 103*b* is moved to above the unloading position OP. In this manner, the substrate W is shifted from the second hand 103*b* to the support pins 111.

Figure 15C:
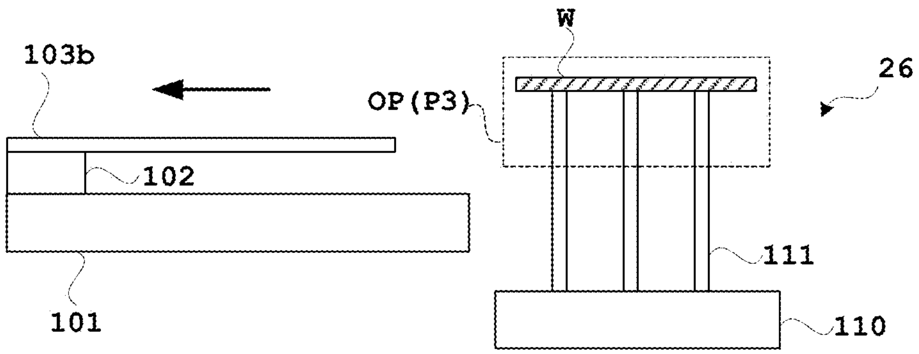
FIG. 15C is a schematic view for describing relay conveyance according to the embodiment.

FIG. 15C illustrates a state in which the slide mechanism 102 has then returned from the advanced position to the initial position, and the second hand 103*b* has retracted from the unloading position OP. The substrate W is supported at the unloading position OP by the support pins 111. Thus, the substrate W is ready to be received by the center robot CR of the single wafer processing device 2.

7. Single Wafer Processing Device: Carrier Block

The carrier block 12 includes the second load port 10 that is an entrance of the carrier C when the carrier C storing a plurality of substrates W in the horizontal orientation at predetermined intervals in a vertical direction is input into the block. The second load port 10 protrudes from the outer wall of the carrier block 12 extending in the width direction (Y direction).

The internal structure of the carrier block 12 will be described. The carrier block 12 stocks and manages the carrier C. The carrier block 12 includes a shelf 14 on which the carrier C can be placed. The number of carriers C that can be stocked by the carrier block 12 is one or more.

The carrier block 12 includes a plurality of shelves 14 on which the carrier C is to be placed. The shelf 14 is provided on a partition wall separating the carrier block 12 and the indexer block 4. The shelf 14 includes a shelf 14*b* for stock on which the carrier C is to be simply temporarily placed, and a carrier placement shelf 14*a* for substrate storage to be accessed by the indexer robot IR of the indexer block 4.

The carrier placement shelf 14*a* has a configuration capable of placing the carrier C storing a plurality of substrates in the horizontal orientation at predetermined intervals in the vertical direction. The carrier placement shelf 14*a* has a configuration on which the carrier C to which the substrate W is to be stored is placed. In the present embodiment, one carrier placement shelf 14*a* is provided, but a plurality of carrier placement shelves 14*a* may be provided. The carrier conveyance mechanism 11 takes in the carrier C for storing the substrate W for which the single wafer processing has been performed from the carrier placement shelf 14*a* and places the carrier C on the carrier placement shelf 13*a* in the batch processing device 1. At this time, the carrier conveyance mechanism 11 can also temporarily place the carrier C on the shelf 13*b* and 14*b* for stock before placing the carrier C on the carrier placement shelf 13*a*. The number of carrier placement shelves 14*a* included in the carrier block 12 is one or more.

7. Single Wafer Processing Device: Indexer Block

The indexer block 4 is adjacent to the carrier block 12. The indexer block 4 includes an indexer robot IR that conveys the substrates W in the horizontal orientation one by one between the carrier C and a storage path 24 provided on the indexer block 4 side in the single wafer processing block 8 described later. The storage path 24 corresponds to a path of the present invention. The storage path 24 has a configuration on which the substrate W in the horizontal orientation can be placed. The indexer robot IR corresponds to a second robot of the present invention. The indexer robot IR can access the storage path 24 and the carrier placement shelf 14*a*.

The indexer robot IR stores the substrate W for which the single wafer processing has been performed in the empty carrier C placed on the carrier placement shelf 14*a*. The indexer robot IR includes a hand including a pair of gripping bodies that grip the substrate W in the horizontal orientation at a tip, and an arm supporting the hand. The arm has a plurality of joints, a tip thereof is connected to the hand, and a proximal end thereof is connected to a base of the arm provided in the indexer block 4. The indexer robot IR of the present embodiment is configured to receive the substrate W for which the single wafer processing has been from the storage path 24 and store the substrate W in the carrier placement shelf 14*a* outside the indexer block 4.

8. Single Wafer Processing Device: Single Wafer Processing Block

The single wafer processing block 8 is adjacent to the indexer block 4. That is, the single wafer processing block 8 is provided on the back side of the indexer block 4 as viewed from the carrier block 12. The storage path 24 that can be accessed by the indexer robot IR and the center robot CR on which the substrate W for which the single wafer processing has been performed can be placed in the storage path 24 are provided at the center portion of the single wafer processing block 8 in the Y direction. The center robot CR corresponds to a first robot of the present invention. The center robot CR is configured to be able to access the unloading position OP of the relay device 6, the single wafer processing chamber 48, and the storage path 24. The center robot CR receives the substrates W in the horizontal orientation for which the batch processing has completed one by one from the unloading position OP of the relay device 6 and conveys the substrates W to the single wafer processing chamber 48. The center robot CR is a substrate conveyance robot that conveys the substrates W in the horizontal orientation one by one, which can reciprocate in the Z direction. Thus, as will be described later, the center robot CR can access both the single wafer processing chamber 48 and the unloading path 26 constituting a stacked body.

Figure 16:
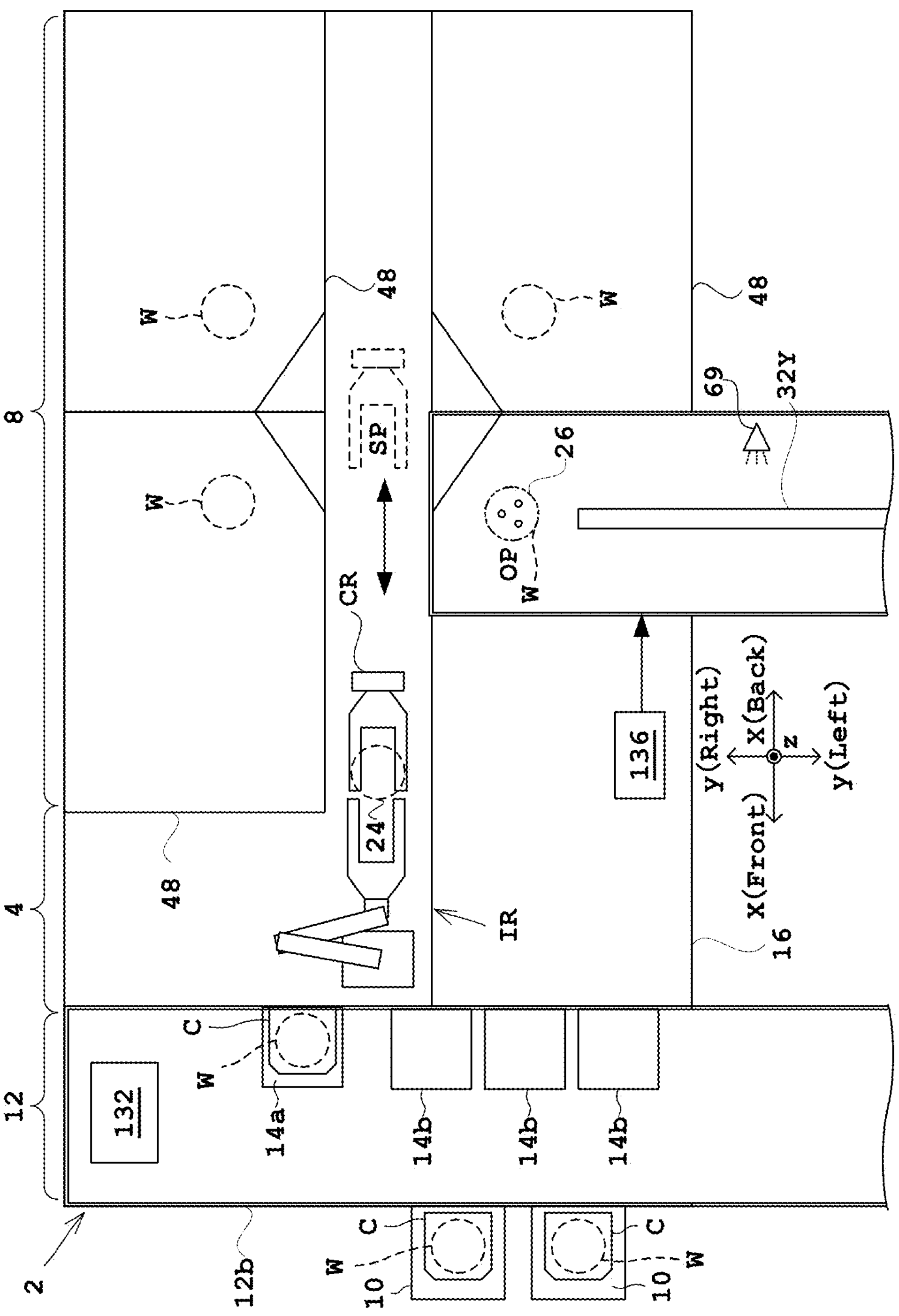
FIG. 16 is a plan view for describing an overall configuration of a single wafer processing device according to the embodiment.

The center robot CR can also move in the front-back direction. When the center robot CR is positioned on the back side, the center robot CR is located at a position surrounded by the single wafer processing chamber 48 as illustrated in FIG. 1. FIG. 16 is a plan view for describing an overall configuration of the single wafer processing device 2 according to the embodiment. As illustrated in FIG. 16, the center robot CR located at a reference position SP is located at a position surrounded by the unloading path 26 and the three single wafer processing chambers 48.

Similarly to the relay conveyance mechanism OTR, the center robot CR includes a hand for acquiring the substrate W before the drying processing and a hand for acquiring the substrate W after the drying processing. The center robot CR uses these hands separately to convey the substrate W before the drying processing or the substrate W after the drying processing. Since the positional relationship and the like of the hands are the same as those of the first hand 103*a* and the second hand 103*b* included in the relay conveyance mechanism OTR, the description thereof will be omitted.

The indexer robot IR and the center robot CR correspond to a storage and conveyance mechanism of the present invention. The indexer robot IR and the center robot CR are configured to cooperatively receive the substrate W in the horizontal orientation from the single wafer processing chamber 48 and carry the substrate W into an empty carrier C placed on the carrier placement shelf 14*a*.

Figure 17:
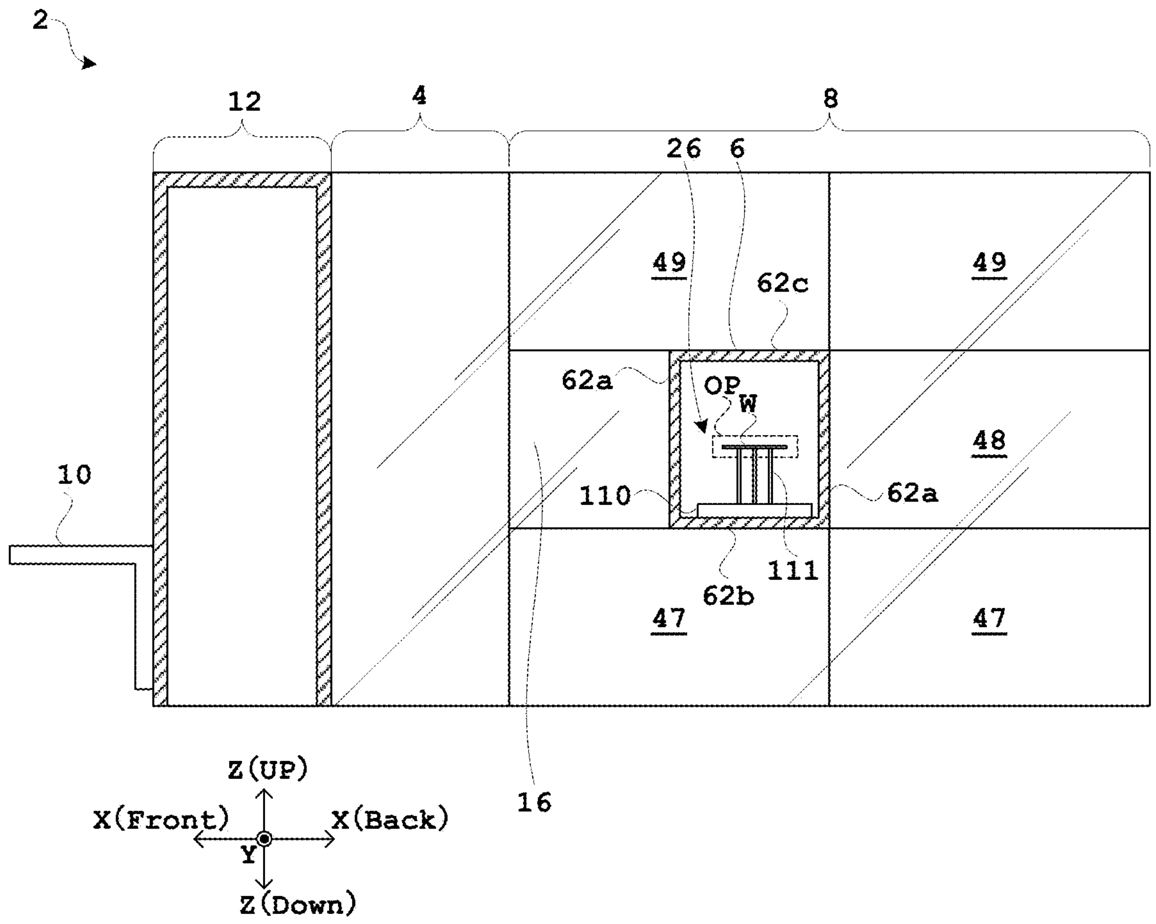
FIG. 17 is a right-side view for describing the single wafer processing device according to the embodiment.

FIG. 17 is a side view of the single wafer processing device 2 as viewed from the batch processing device 1. As illustrated in the drawing, the single wafer processing chamber 47, the single wafer processing chamber 48, and the single wafer processing chamber 49 are stacked in the Z direction to form a stacked body. That is, the single wafer processing block 8 is provided with a lower region, a middle region, and an upper region. The single wafer processing chamber 47 is provided in the lower region. The single wafer processing chamber 48 is provided in the middle region. The single wafer processing chamber 49 is provided in the upper region.

The unloading path 26 is positioned in the middle region of the single wafer processing block 8. The single wafer processing chamber 47 in the lower region is provided below the unloading path 26. The single wafer processing chamber 49 in the upper region is provided above the unloading path 26. Thus, the unloading path 26 is provided in place of the single wafer processing chamber 48 in the middle region in the stacked body in which the single wafer processing chamber 47, the single wafer processing chamber 48, and the single wafer processing chamber 49 are arrayed in the Z direction.

FIG. 16 illustrates the middle region of the single wafer processing block 8. Three single wafer processing chamber 48 are provided in the middle region. Thus, the single wafer processing block 8 includes a first stacked body to which the first single wafer processing chamber 48 belongs, a second stacked body to which the second single wafer processing chamber 48 belongs, and a third stacked body to which the third single wafer processing chamber 48 belongs. The single wafer processing chamber 49 and the single wafer processing chamber 47 are provided above and below the unloading path 26. Thus, a total of 11 single wafer processing chambers are provided in the single wafer processing block 8.

As illustrated in FIG. 17, a shielding plate 16 is a part of the second wall surface 2B of the single wafer processing device 2. The shielding plate 16 is provided in the middle region of the single wafer processing block 8, and it closes an opening formed between the unloading path 26 and the indexer block 4. When the shielding plate 16 is provided adjacent to the indexer block 4, the relay device 6 can be provided close to the center robot CR. With this configuration, when the center robot CR acquires the substrate W in the unloading path 26, it is not necessary for the center robot CR to greatly move in the front-back direction.

The hand provided in the center robot CR can move in the Z direction while maintaining the orientation of the substrate W. With such a configuration, the center robot CR can convey the substrate W of the unloading path 26 to the single wafer processing chamber 49 in the upper region and the single wafer processing chamber 47 in the lower region. Providing the unloading path 26 in the middle region of the single wafer processing block 8 makes it possible to dispose the unloading path 26 in the vicinity of the upper region. In the same manner, the unloading path 26 is disposed in the vicinity of the lower region. Thus, the movement distance of the substrate W in the Z direction in the unloading path 26 is short with respect to both the upper region and the lower region.

The carrier placement shelf 14*a* and the single wafer processing chamber 48 in the single wafer processing device 2 are disposed in the front-back direction. Thus, the carrier placement shelf 14*a* is disposed in front of the single wafer processing chamber 48.

9. Single Wafer Processing Device: Single Wafer Processing Chamber

Figure 18:
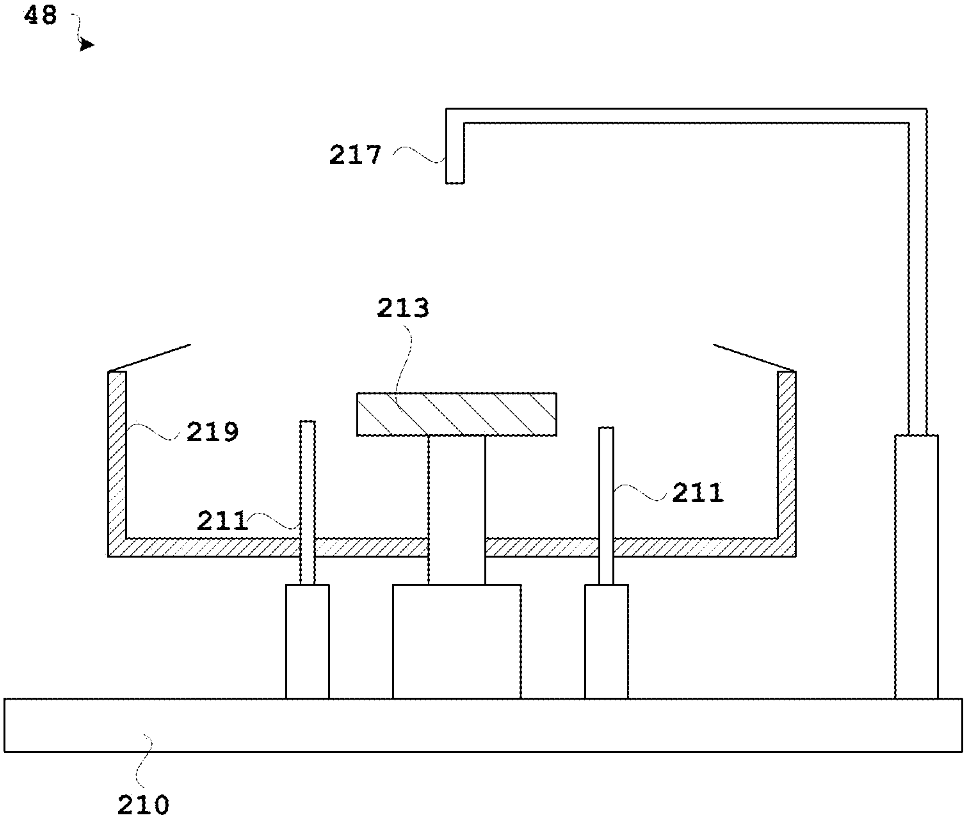
FIG. 18 is a schematic view for describing a configuration of a single wafer processing chamber according to the embodiment.

FIG. 18 illustrates a configuration of the single wafer processing chamber 48 provided in the single wafer processing block 8. The single wafer processing chamber 48 can receive substrates W in the horizontal orientation one by one and perform chemical liquid processing and drying processing. Thus, the single wafer processing chamber 48 corresponds to a substrate drying unit of the present invention. The single wafer processing chamber 48 can dry the substrates W for which the batch processing has been completed in the horizontal orientation one by one.

The single wafer processing chamber 48 includes a vacuum chuck 213 that attaches to and supports the substrate W. The vacuum chuck 213 has a disk shape having a diameter smaller than that of the substrate W, and it can rotate about the vertical axis while attaching to and supporting the substrate in the horizontal orientation. The rotation axis of the substrate W coincides with the central axis of the substrate W. When the single wafer processing chamber 48 dries the substrate W, the substrate W supported by the chamber is rotated, whereby the liquid adhering to the substrate W is shaken off. The single wafer drying unit includes the single wafer processing chamber 48 provided in the single wafer processing device 2. The single wafer processing chamber 48 is configured to dry the substrate W by spin drying.

In addition, the single wafer processing chamber 48 includes a guide 219 that receives the shaken liquid and a nozzle 217 that supplies a liquid such as isopropyl alcohol (IPA) to the substrate W. The nozzle 217 positioned above the vacuum chuck can retract with respect to the vacuum chuck 213, and does not interfere when the center robot CR places the substrate W on the vacuum chuck 213.

The single wafer processing chamber 48 includes a support pin 211 that moves the substrate W up and down. By extending and contracting the support pin 211, the substrate W can be received from the center robot CR, or the substrate W can be set in the vacuum chuck 213.

The single wafer processing chamber 47 and the single wafer processing chamber 49 have the same configuration as that of the single wafer processing chamber 48.

The vacuum chuck 213 corresponds to a rotation mechanism of the present invention. The vacuum chuck 213 is configured to rotate the substrate W about the normal line. The rotation mechanism of the present invention is formed of a spin chuck (vacuum chuck 213) of the single wafer processing chamber 47, the single wafer processing chamber 48, and the single wafer processing chamber 49 provided in the single wafer processing device 2. The vacuum chuck 213 can transfer the received substrate W in the horizontal orientation to the center robot CR by at least half rotating the substrate W about the vertical axis.

10. Controller

The substrate processing system includes a first controller 131 related to the control of the batch processing device 1, a second controller 132 related to the control of the single wafer processing device 2, and a third controller 136 related to the control of the relay device 6. FIG. 1 can be referred to for each controller. Although not illustrated in FIG. 1, a storage unit corresponding to each controller is provided in the substrate processing system. The controller 131, the controller 132, and the controller 136 is configured by, for example, a central processing unit (CPU). A specific configuration of each controller is not limited, and for example, the controllers may be configured by a single processor, or each controller may be configured by an individual processor. The control related to the batch processing device 1 may be configured by a plurality of processors, and this circumstance is the same in the single wafer processing device 2 and the relay device 6.

Examples of the control related to the controller 131 include control related to the carrier conveyance mechanism 11, the first substrate conveyance mechanism HTR, the first orientation changing mechanism 15, the second substrate conveyance mechanism WTR, the batch processing units BPU1 to BPU6, and the batch drying chamber DC. Examples of the control related to the controller 132 include control related to the center robot CR, the single wafer processing chamber 47, the single wafer processing chamber 48, the single wafer processing chamber 49, and the indexer robot IR. Examples of the control related to the third controller 136 include control related to a pure water supply device coupled to the half-lot conveyance mechanism STR, the lot standby tank 65, the lifter LF65, the underwater orientation changing unit 55 (second orientation changing mechanism), the unloading path 26, the relay conveyance mechanism OTR, and the shower head 69.

The first controller 131, the second controller 132, and the third controller 136 correspond to a controller of the present invention. The first controller 131, the second controller 132, and the third controller 136 are configured to control the batch processing device 1, the single wafer processing device 2, and the relay device 6.

The storage unit stores programs, parameters, and the like related to control. The storage unit may be configured by a single device or may be configured by individual devices corresponding to the respective controllers. The substrate processing system of the present embodiment has no particular limitation on the configuration of the device that realizes the storage unit.

11. Flow of Substrate Processing

Figure 19:
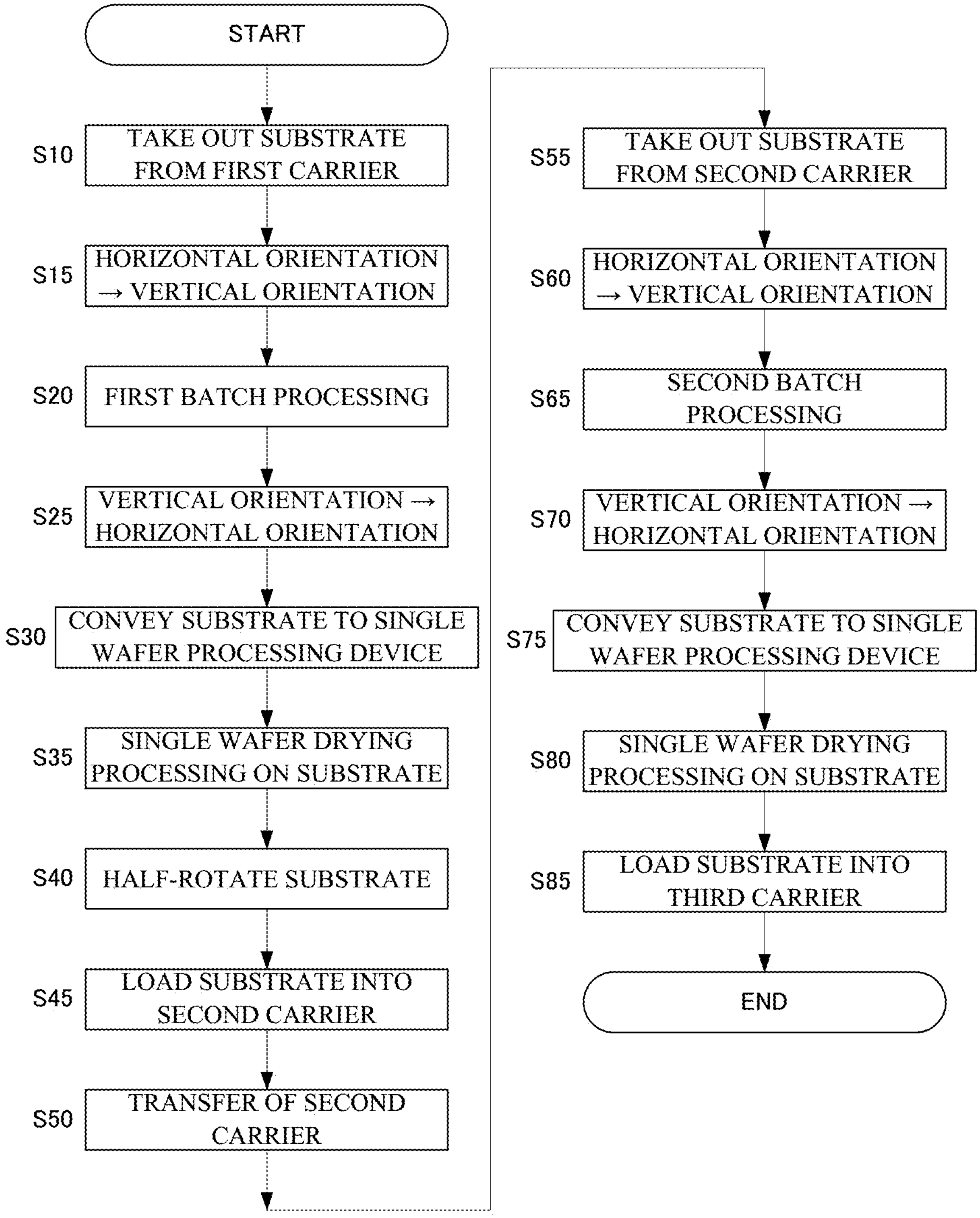
FIG. 19 is a flowchart for describing a flow of substrate processing according to the embodiment.

Hereinafter, a flow of substrate processing in the embodiment will be described with reference to the flowchart of FIG. 19. Each operation described below is executed under the control of any one of the first controller 131, the second controller 132, and the third controller 136 described above.

Step S10: The substrates W in the horizontal orientation are collectively taken out from the carrier C placed on the carrier placement shelf 13*a*. The substrates W in this step are unprocessed substrates. The carrier C placed on the carrier placement shelf 13*a* is acquired from the first load port 9 and conveyed by the carrier conveyance mechanism 11. The carrier C in this step is referred to as a first carrier C1 for distinction. The first substrate conveyance mechanism HTR takes out the substrates W from the first carrier C1 placed on the carrier placement shelf 13*a* and takes the substrates W into the transfer block 5.

Step S15: The first substrate conveyance mechanism HTR collectively delivers the plurality of substrates W in the horizontal orientation to the HVC orientation changing unit 23. The HVC orientation changing unit 23 changes the orientation of the substrates W taken out from the first carrier C1 from the horizontal orientation to the vertical orientation. The substrates W whose orientation has been changed are collectively supported by the pusher mechanism 25. The second substrate conveyance mechanism WTR collectively acquires the plurality of substrates W from the pusher mechanism 25 at the substrate delivery position PP. At this time, batch assembly of the substrates may be performed in the pusher mechanism 25. Then, the second substrate conveyance mechanism WTR delivers the acquired plurality of substrates (lot) to the lifter LF2 standing by at the substrate delivery position. The second substrate conveyance mechanism WTR may convey the plurality of substrates (lot) from the substrate delivery position PP of the pusher mechanism 25 to the substrate delivery position of the lifter LF2 via the dry lot support unit 33.

Step S20: The lifter LF2 that has acquired the plurality of substrates (lot) moves down to the processing position. The plurality of substrates (lot) are immersed in the batch chemical liquid processing tank CHB2. In this manner, the lifter LF2 collectively immerses the plurality of substrates (lot) whose orientation has been changed into the vertical orientation in the batch chemical liquid processing tank CHB2 to execute the first chemical liquid processing. In the chemical liquid processing at this time, the substrate surface is etched by a thickness of half the target thickness. When the first chemical liquid processing is completed, the lifter LF2 moves up the plurality of substrates (lot) to the substrate delivery position. The second substrate conveyance mechanism WTR acquires the plurality of substrates (lot) from the lifter LF2 and delivers the plurality of substrates (lot) to the lifter LF1 standing by at the substrate delivery position. The lifter LF1 collectively immerses the plurality of substrates (lot) for which the first chemical liquid processing has been completed into the batch rinse processing tank CHB1 to execute the first batch rinse processing. In this manner, the lifter LF1 and the lifter LF2 collectively immerse the plurality of substrates (lot) whose orientation has been changed into the vertical orientation in the batch rinse processing tank CHB1 and the batch chemical liquid processing tank CHB2 to execute the first batch processing.

Step S25: The underwater orientation changing unit 55 acquires the plurality of substrates W conveyed by the second substrate conveyance mechanism WTR via the half-lot conveyance mechanism STR. The position where the plurality of substrates W are delivered by the second substrate conveyance mechanism WTR to the half-lot conveyance mechanism STR is the loading position IP. The underwater orientation changing unit 55 collectively changes the orientation of the plurality of substrates for which the first batch processing has been completed from the vertical orientation to the horizontal orientation.

Figure 20:
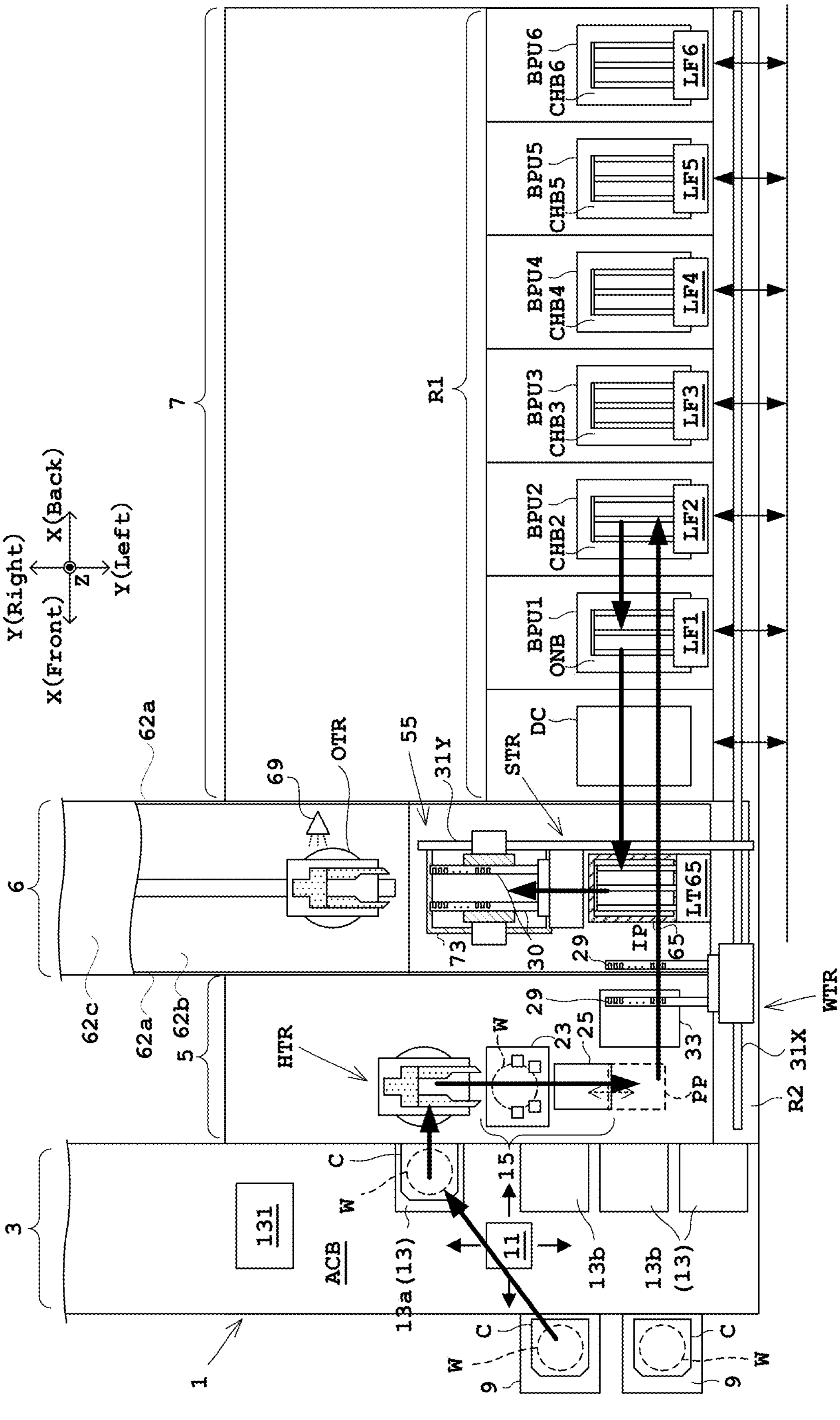
FIG. 20 is a schematic view for describing a flow of substrate processing according to the embodiment.

FIG. 20 illustrates the flow of the substrates W from step S10 to step S25 described above.

Step S30: The relay conveyance mechanism OTR acquires the substrates W whose orientation has been changed into the horizontal orientation from the underwater orientation changing unit 55 one by one, and conveys the substrates W to the unloading position OP in the unloading path 26. That is, the relay conveyance mechanism OTR conveys the substrates whose orientation has been changed into the horizontal orientation from the batch processing device 1 to the single wafer processing device 2. When the substrate W in the horizontal orientation has been conveyed to the unloading path 26, the support pin 111 extends. The substrate W is thus ready to be delivered to the center robot CR.

Step S35: The substrate W is conveyed to the single wafer processing chamber 48 by the center robot CR. It is assumed that the notch of the substrate W at this time faces forward. The single wafer processing chamber 48 performs spin dry processing on the substrate W in a state where the substrate W is held by the vacuum chuck 213. In this manner, the single wafer processing chamber 48 dries the substrates W whose orientation has been changed after the first batch processing conveyed to the single wafer processing device, one by one.

Step S40: The single wafer processing chamber 48 finally half-rotates the substrate W acquired from the center robot CR. That is, the notch in the substrate W for which the drying processing has been completed face backward. In this manner, the single wafer processing chamber 48 acquires the substrate W before the drying processing, then delivers the substrate W after the drying processing to the center robot CR in a state where the front and back of the substrate W after the drying processing are inverted.

Step S45: The center robot CR that has acquired the substrates W conveys the substrates W to the storage path 24. The substrates W held by the storage path 24 are acquired by the indexer robot IR and stored in an empty carrier C placed on the carrier placement shelf 14*a*. The carrier C in this step is referred to as a second carrier C2 for distinction. In this manner, the center robot CR and the indexer robot IR load the substrates W in the horizontal orientation conveyed to the single wafer processing device 2 into the second carrier C2 placed on the carrier placement shelf 14*a*.

Step S50: The carrier conveyance mechanism 11 transfers the second carrier C2 placed on the carrier placement shelf 14*a* to the carrier placement shelf 13*a*. As a result, the second carrier C2 is transferred from the single wafer processing device 2 to the batch processing device 1. The substrates W stored in the second carrier C2 are set again in the batch processing device 1 after the first batch processing.

Figure 21:
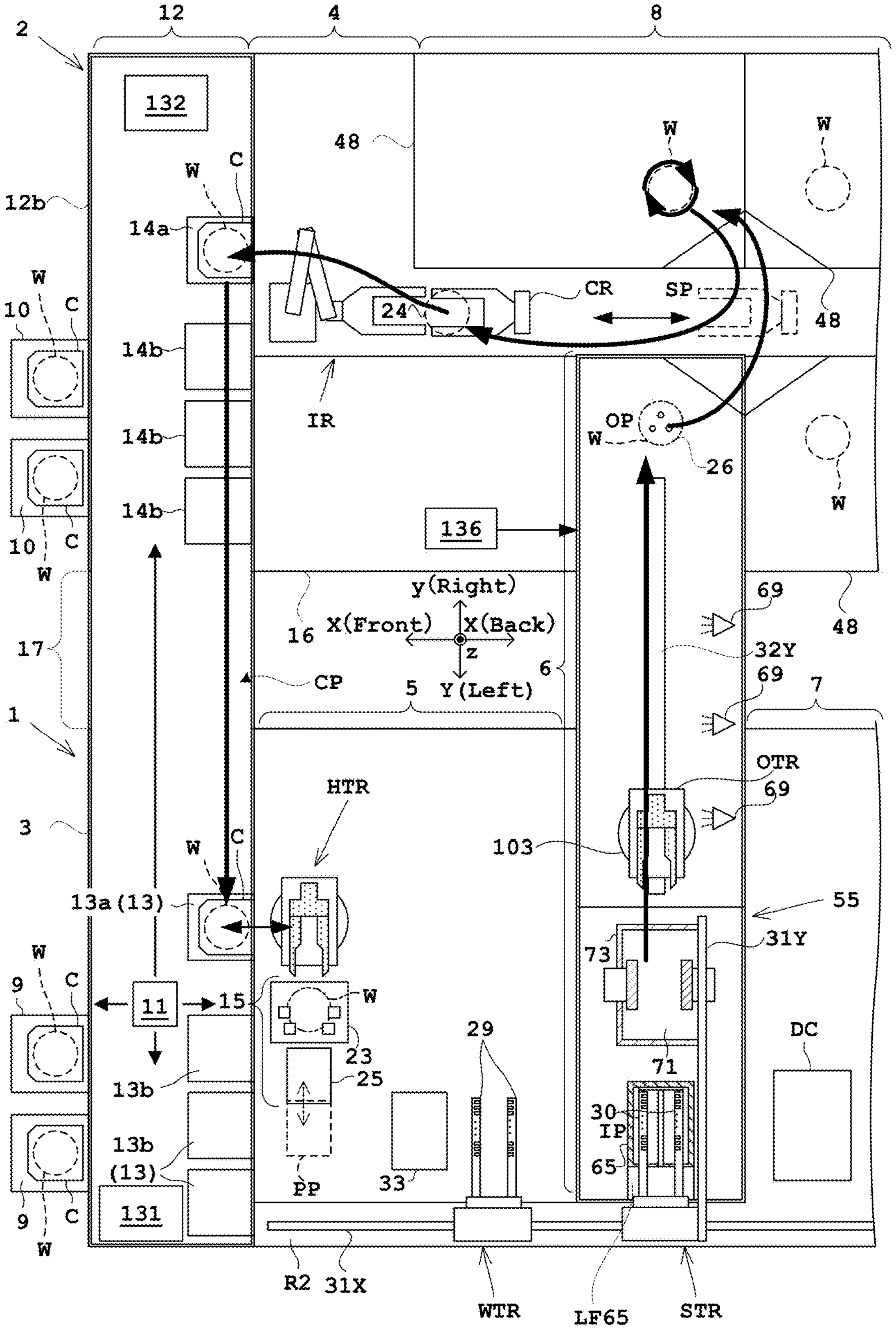
FIG. 21 is a schematic view for describing a flow of substrate processing according to the embodiment.

FIG. 21 illustrates the flow of the substrates W from step S30 to step S50 described above.

Step S55: The substrates W in the horizontal orientation are collectively taken out from the second carrier C2 placed on the carrier placement shelf 13*a*. The substrates W in this step are substrates for which the first batch processing has been completed. The first substrate conveyance mechanism HTR takes out the substrates W from the second carrier C2 placed on the carrier placement shelf 13*a* and takes the substrates W into the transfer block 5. In this manner, when the second carrier C2 storing the substrates W for which the first batch processing has been performed is placed on the carrier placement shelf 13*a* of the batch processing device 1, the first substrate conveyance mechanism HTR takes out the substrates W from the second carrier C2 placed on the carrier placement shelf 13*a*.

Step S60: The first substrate conveyance mechanism HTR collectively delivers the plurality of substrates W in the horizontal orientation to the HVC orientation changing unit 23. The HVC orientation changing unit 23 changes the orientation of the substrates W taken out from the second carrier C2 from the horizontal orientation to the vertical orientation. The substrates W whose orientation has been changed are collectively supported by the pusher mechanism 25. The second substrate conveyance mechanism WTR collectively acquires the plurality of substrates W from the pusher mechanism 25 at the substrate delivery position PP. At this time, batch assembly of the substrates may be performed in the pusher mechanism 25. Then, the second substrate conveyance mechanism WTR delivers the acquired plurality of substrates (lot) to the lifter LF2 standing by at the substrate delivery position. The second substrate conveyance mechanism WTR may convey the plurality of substrates (lot) from the substrate delivery position PP of the pusher mechanism 25 to the substrate delivery position of the lifter LF2 via the dry lot support unit 33.

Step S65: The lifter LF2 that has acquired the plurality of substrates (lot) moves down to the processing position. The plurality of substrates (lot) are immersed in the batch chemical liquid processing tank CHB2. In this manner, the lifter LF2 collectively immerses the plurality of substrates (lot) whose orientation has been changed into the vertical orientation in the batch chemical liquid processing tank CHB2 to execute the second chemical liquid processing. In the chemical liquid processing at this time, the substrate surface is etched by a thickness of half the target thickness. That is, the chemical liquid processing is performed twice, and as a result, the substrate surface is etched by the target thickness. When the second chemical liquid processing has been completed, the lifter LF2 moves up the plurality of substrates (lot) to the substrate delivery position. The second substrate conveyance mechanism WTR acquires the plurality of substrates (lot) from the lifter LF2 and delivers the plurality of substrates (lot) to the lifter LF1 standing by at the substrate delivery position. The lifter LF collectively immerses the plurality of substrates (lot) for which the second chemical liquid processing has been completed in the batch rinse processing tank CHB1 to execute the second batch rinse processing. In this manner, the lifter LF1 and lifter LF2 collectively immerse the plurality of substrates (lot) whose orientation has been changed into the vertical orientation in the batch rinse processing tank CHB1 and the batch chemical liquid processing tank CHB2 to execute the second batch processing.

As the substrates W in the second batch processing, the substrates W in the first batch processing are rotated by 180° about the normal line of the substrates W. The single wafer processing chamber 48 rotates the substrates W received from the center robot CR by 180° about the central axis and returns the substrate W to the center robot CR in step S40. Thus, the second batch processing is performed on the substrates in a vertically inverted orientation with respect to the orientation of the substrates in the first batch processing. Step S40 is a step after the first batch processing and before the second batch processing.

Step S70: The underwater orientation changing unit 55 acquires the plurality of substrates W conveyed by the second substrate conveyance mechanism WTR via the half-lot conveyance mechanism STR. The position where the plurality of substrates W are delivered by the second substrate conveyance mechanism WTR to the half-lot conveyance mechanism STR is the loading position IP. The underwater orientation changing unit 55 collectively changes the orientation of the plurality of substrates for which the second batch processing has been performed from the vertical orientation to the horizontal orientation.

Figure 22:
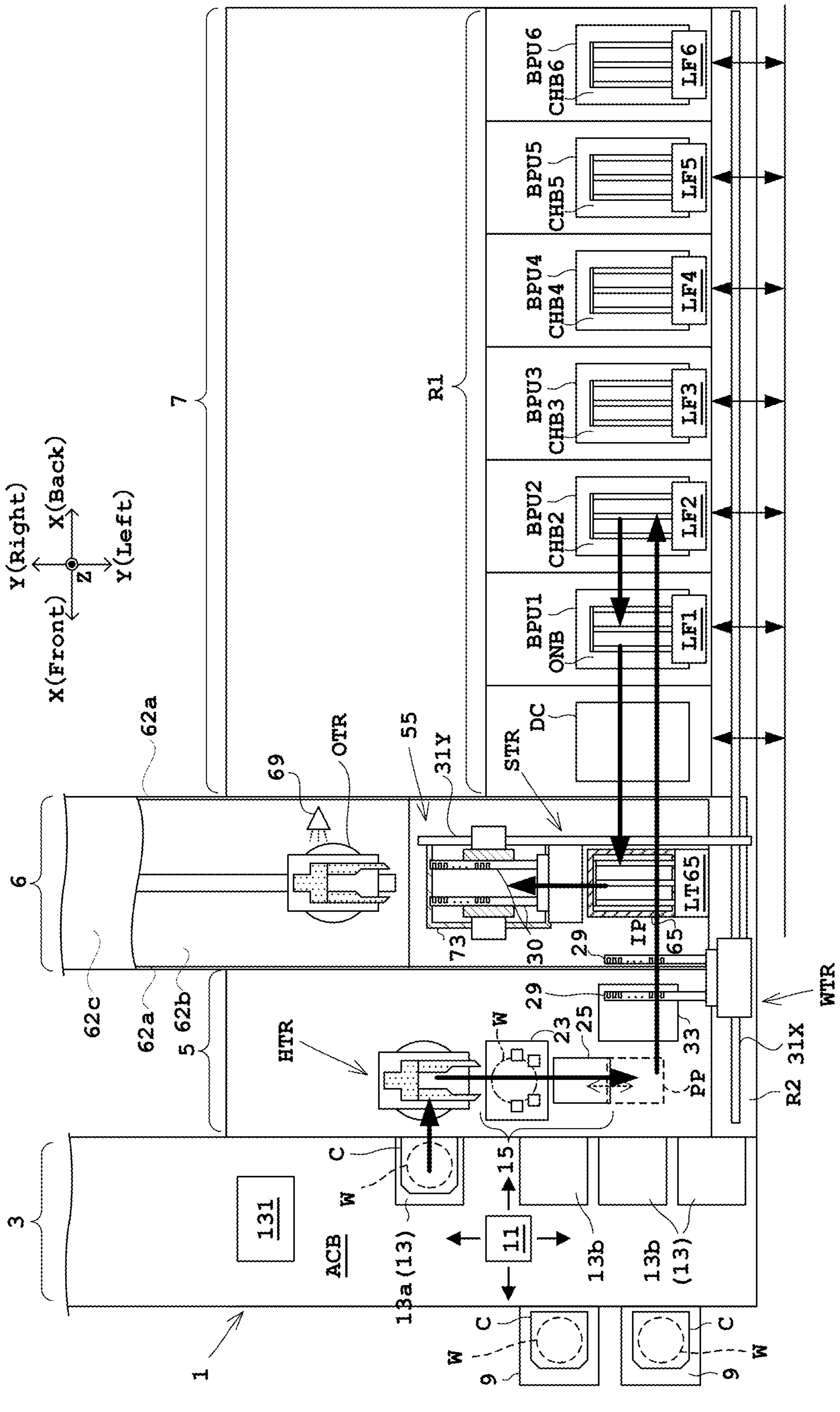
FIG. 22 is a schematic view for describing a flow of substrate processing according to the embodiment.

FIG. 22 illustrates the flow of the substrate W from step S55 to step S70 described above.

Step S75: The relay conveyance mechanism OTR acquires the substrates W whose orientation has been changed into the horizontal orientation from the underwater orientation changing unit 55 one by one, and conveys the substrates W to the unloading position OP in the unloading path 26. That is, the relay conveyance mechanism OTR conveys the substrates whose orientation has been changed into the horizontal orientation from the batch processing device 1 to the single wafer processing device 2. When the substrate W in the horizontal orientation has been conveyed to the unloading path 26, the support pin 111 extends. The substrate W is thus ready to be delivered to the center robot CR.

Step S80: The substrate W is conveyed to the single wafer processing chamber 48 by the center robot CR. It is assumed that the notch of the substrate W at this time faces forward. The single wafer processing chamber 48 performs spin dry processing on the substrate W in a state where the substrate W is held by the vacuum chuck 213. In this manner, the single wafer processing chamber 48 dries the substrates W whose orientation has been changed after the first batch processing conveyed to the single wafer processing device, one by one. The single wafer processing chamber 48 does not finally half-rotate the substrates W acquired from the center robot CR. That is, the notch in the substrate W for which the drying processing has been completed face forward. In this manner, the single wafer processing chamber 48 acquires the substrate W before the drying processing, then delivers the substrate W after the drying processing to the center robot CR in a state where the substrate W is not rotated.

Step S85: The center robot CR that has acquired the substrates W conveys the substrates W to the storage path 24. The substrates W held by the storage path 24 are acquired by the indexer robot IR and stored in an empty carrier C placed on the carrier placement shelf 14*a*. The carrier C in this step is referred to as a third carrier C3 for distinction. In this manner, the center robot CR and the indexer robot IR loads the substrates W in the horizontal orientation conveyed to the single wafer processing device 2 into the third carrier C3 placed on the carrier placement shelf 14*a*. The third carrier C3 is conveyed to the second load port 10 by the carrier conveyance mechanism 11. The substrate processing of the embodiment thus ends.

Thus, in the carrier placement shelf 14*a* and the carrier placement shelf 14*b* of the single wafer processing device 2, the second carrier C2 that stores the substrates W before the second batch processing and the third carrier C3 that stores the substrates W after the second batch processing are mixed. According to the configuration of the embodiment, the carrier C is managed so as not to erroneously transfer the third carrier C3 to the batch processing device 1. The management of the carriers C is realized by the host computer of the plant controlling a tag such as a barcode attached to each of the carriers C. The data held when the host computer controls the carriers C includes the position of the notch of the substrates W stored in the carriers C.

Figure 23:
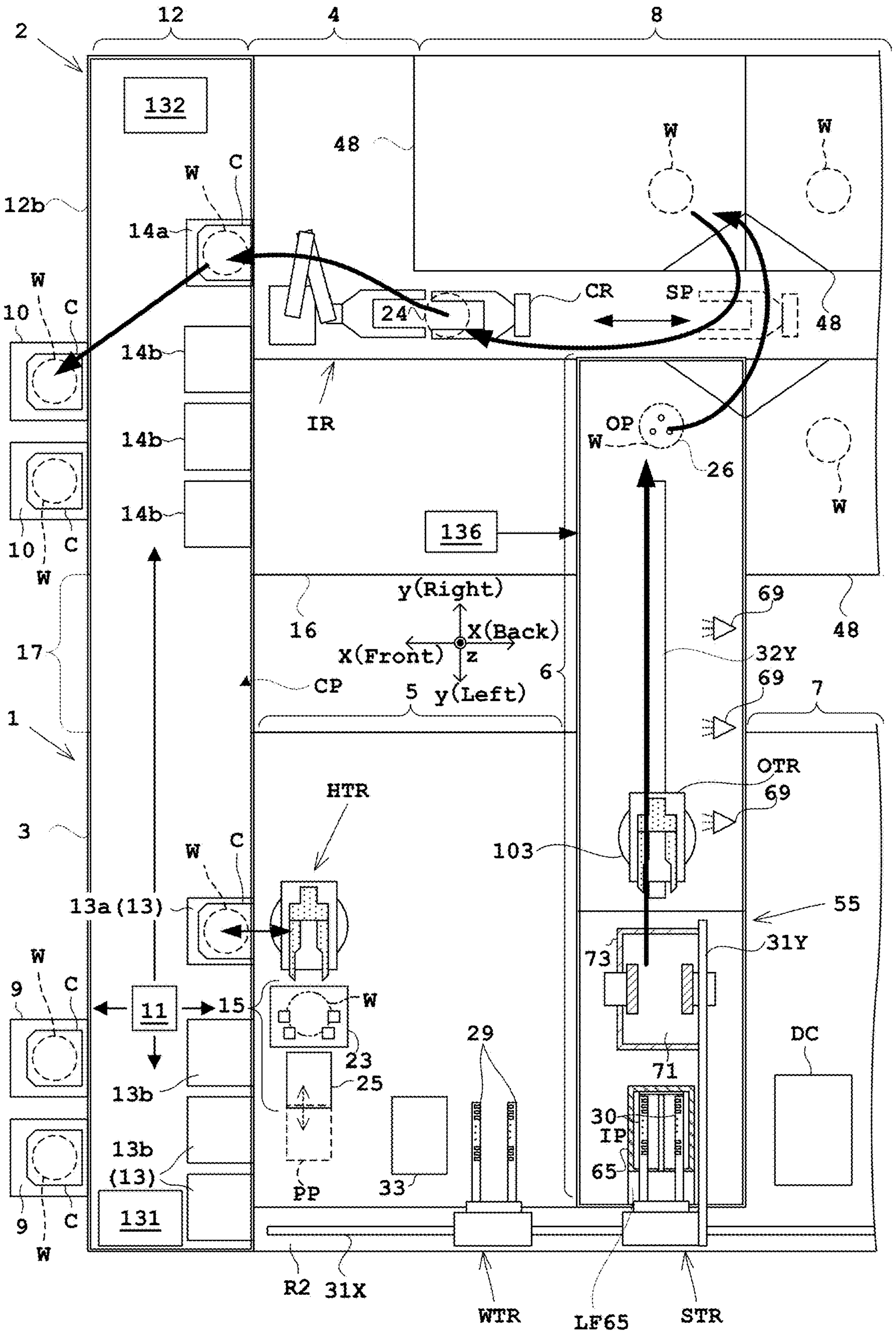
FIG. 23 is a schematic view for describing a flow of substrate processing according to the embodiment.

FIG. 23 illustrates the flow of the substrates W from step S75 to step S85 described above.

12. Effects of Configuration According to Embodiment

In this manner, according to the above configuration, the controller of the substrate processing system controls the center robot CR and the indexer robot IR to store the substrates W for which the first batch processing has been completed, in the second carrier C2. Then, the controller controls the first substrate conveyance mechanism HTR to take out the substrates W from the second carrier C2 and perform the second batch processing. At this time, the controller controls the single wafer processing chamber 48 to vertically invert the substrates W before the second batch processing. With this configuration, the difference in the batch processing occurring between the lower portion of the substrate positioned at the bottom of the batch chemical liquid processing tank CHB2 and the upper portion of the substrate positioned at the water surface portion of the batch chemical liquid processing tank CHB2 is homogenized, and thus it is possible to provide a substrate processing system capable of producing a high-quality device.

Figure 24A:
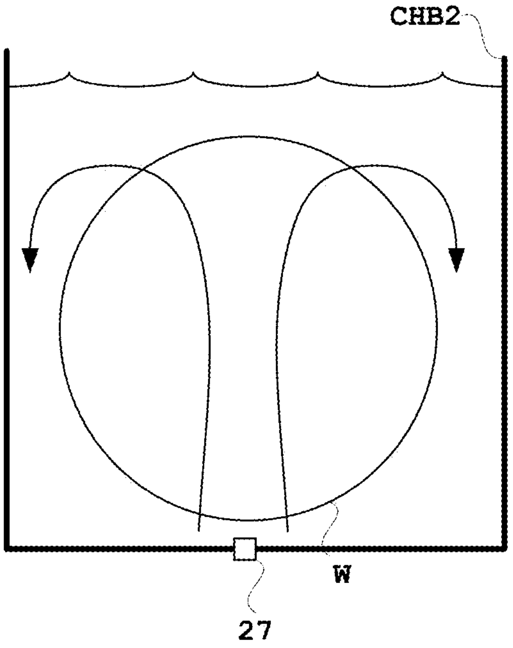
FIG. 24A is a schematic view for describing an effect of a configuration according to the embodiment.
Figure 24B:
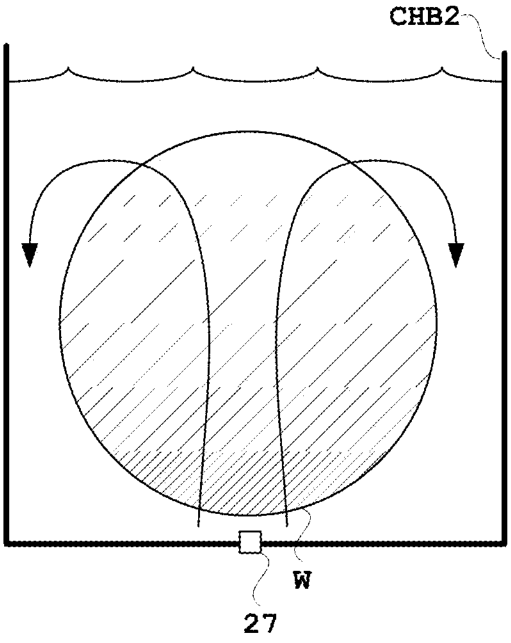
FIG. 24B is a schematic view for describing an effect of a configuration according to the embodiment.

FIGS. 24A to 24D are schematic views each illustrating an effect of the present invention. Immediately after the first batch processing has been started, the entire area of the substrate W is in an unprocessed state as illustrated in FIG. 24A. In this case, there is no difference in the processing state between the upper portion and lower portion of the substrate W. However, as the batch processing of the substrate W progresses, a difference occurs in the etched state of the substrate W as illustrated in FIG. 24B. This is because, as indicated by the arrows in FIGS. 24A to 24D, stirring of the processing liquid from the bottom to the water surface occurs in the batch chemical liquid processing tank CHB2. Since the flow rate of the processing liquid increases in the lower portion of the substrate W close to the jetting port 27 for a fluid, the etching of the substrate W proceeds quickly in this portion. On the other hand, since the flow rate of the processing liquid slows in the upper portion of the substrate away from the jetting port 27 for a fluid, the etching of the substrate W proceeds slowly in this portion.

Figure 24C:
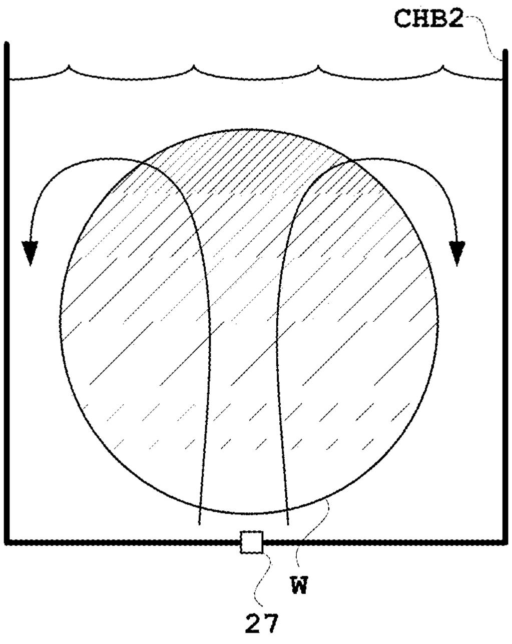
FIG. 24C is a schematic view for describing an effect of a configuration according to the embodiment.
Figure 24D:
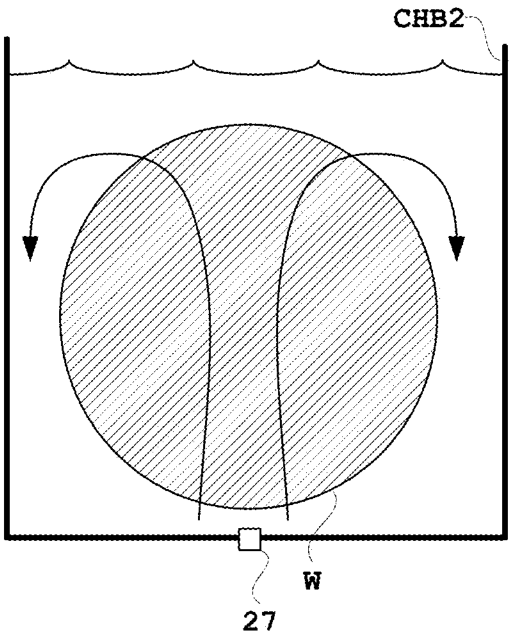
FIG. 24D is a schematic view for describing an effect of a configuration according to the embodiment.

In the substrate processing system of the present invention, as illustrated in FIG. 24C, the substrate is vertically inverted, and then the second batch processing is executed. In the second batch processing, the lower portion of the substrate W whose etching has progressed is positioned in the water surface portion of the batch chemical liquid processing tank CHB2, and the upper portion of the substrate W whose etching has been delayed is positioned in the bottom of the batch chemical liquid processing tank CHB2. When the batch processing is performed again in this state, the acid processing slowly proceeds in the portion where the etching has progressed in the substrate W, and the acid processing quickly proceeds in the portion where the etching has delayed in the substrate W. Finally, as illustrated in FIG. 24D, the degree of acid processing on the substrate W becomes constant over the entire substrate, and the second batch processing ends. In this manner, according to the present invention, it is possible to provide a substrate processing system capable of making the substrate processing constant over the entire substrate and producing a high-quality device.

According to the above configuration, since the batch processing is performed while the processing liquid is stirred up and down, efficient batch processing can be performed. With the substrate processing system according to the present invention, even when the configuration in which the batch processing is performed while the processing liquid is stirred up and down is adopted, the unevenness of the substrate processing occurring during the batch processing is homogenized, and thus a high-quality device can be produced.

According to the above configuration, the conveyance mechanism that conveys the second carrier C2 from the carrier placement shelf 14*a* to the carrier placement shelf 13*a* is provided. With this configuration, the conveyance of the second carrier C2 in the carrier placement shelf 14*a* to the carrier placement shelf 13*a* can be performed by the substrate processing system. With this configuration, the second carrier C2 can be conveyed without depending on manual conveyance or conveyance by a carrier conveyance crane provided in the plant.

According to the above configuration, the single wafer processing chamber 48 dries the substrates W whose orientation has been changed after the first batch processing conveyed to the single wafer processing device 2, one by one. With this configuration, in the same manner as in the second batch processing, the substrate W can be mildly dried even after the first batch processing, and thus a high-quality device can be produced.

According to the above configuration, the relay conveyance mechanism OTR includes the first hand 103*a* that acquires the substrate W after drying and the second hand 103*b* that acquires the substrate W before drying. According to such a configuration, it is possible to realize a configuration in which both the substrate W after drying and the substrate W before drying pass through the relay device 6. Since the first hand 103*a* is always in a dried state, the substrate W does not get wet because of the first hand 103*a*. When the substrate W before drying is conveyed by the second hand 103*b* different from the first hand 103*a*, the substrate W before drying can also be reliably conveyed in the relay device 6.

According to the above configuration, the substrates W in the horizontal orientation received by the vacuum chuck 213 are half-rotated about the vertical axis and delivered to the center robot CR and the indexer robot TR. With this configuration, the substrate rotation can be realized using the existing configuration. That is, the present invention can be realized by changing the control of an existing device configuration.

According to the above configuration, the substrate W is dried by spin drying. With this configuration, the single wafer processing chamber 48 can be configured using a device that has been operated for a long time and has past results.

According to the above configuration, the single wafer processing device 2 includes the unloading path 26 on which the substrates W in the horizontal orientation can be placed. The above configuration also includes the center robot CR that can access the unloading path 26, the unloading position OP of the relay device 6, and the single wafer processing chamber 48. The center robot CR is provided at a position surrounded by the single wafer processing chamber 48. According to the above configuration, since the layout of the substrate processing system is optimized, it is possible to provide a substrate processing system capable of quickly executing substrate processing based on efficient substrate conveyance.

According to the above configuration, the carrier placement shelf 13*a* and the batch chemical liquid processing tank CHB2 in the batch processing device are disposed in the front-back direction, the loading position IP and the unloading position OP in the relay device 6 are disposed in the left-right direction, and the carrier placement shelf 14*a* and the single wafer processing chamber 48 in the single wafer processing device 2 are disposed in the front-back direction. According to the above configuration, since the layout of the substrate processing system is optimized, it is possible to provide a substrate processing system capable of quickly executing substrate processing based on efficient substrate conveyance.

13. Modification of Embodiment

The present invention is not limited to the above configuration but can be modified as follows.

First Modification

According to the configuration of the embodiment, the substrates W are conveyed to the single wafer processing device 2 in a state before the drying processing after the first batch processing, but the present invention is not limited to this configuration. A plurality of substrates W for which the first batch processing has been completed may be dried in the batch drying chamber DC, and the substrates W after the drying processing may be conveyed to the single wafer processing device 2. The batch drying chamber DC corresponds to a batch drying unit of the present invention. The batch drying chamber DC collectively dries the substrates W for which the first batch processing has been completed.

The relay device 6 of a first modification conveys the substrates W after drying using the first hand 103*a* after the first batch processing. On the other hand, since the relay device 6 handles the substrates W before the drying processing after the second batch processing, the relay device 6 conveys the substrates W using the second hand 103*b*. The lot standby tank 65 and the immersion tank 73 at the time of conveying the substrates W for which the first batch processing has been completed are empty, and do not hold pure water. This is to prevent the substrates W after the drying processing from being immersed in pure water by the lot standby tank 65 and the immersion tank 73. On the other hand, the lot standby tank 65 and the immersion tank 73 at the time of conveying the substrates W for which the second batch processing has been completed hold pure water as in the embodiment. The shower head 69 jets or does not jet pure water according to the dry state of the substrate W.

Figure 25:
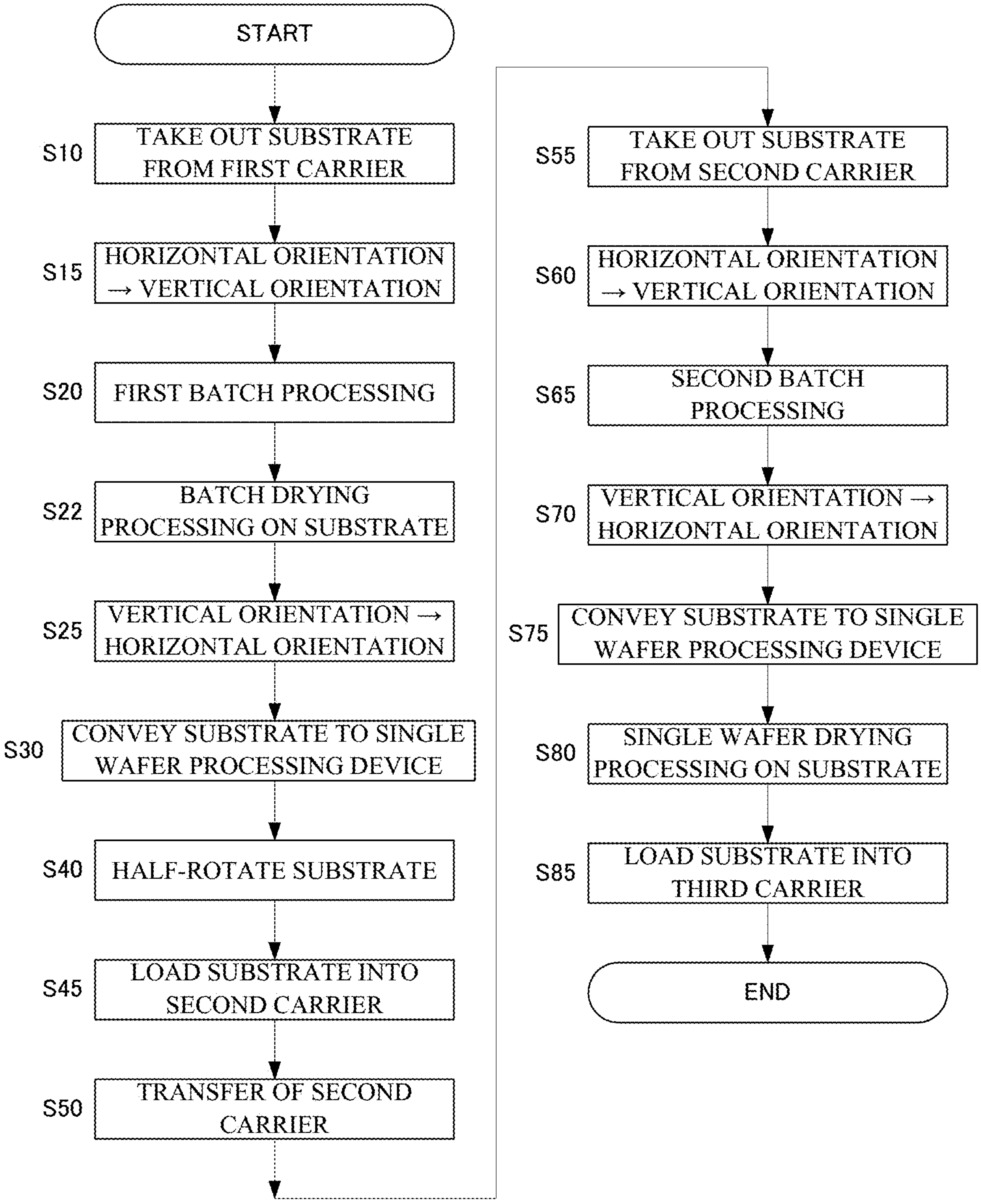
FIG. 25 is a flowchart for describing a flow of substrate processing according to a modification.

FIG. 25 is a flowchart for describing a flow of substrate processing according to the first modification. The flowchart is substantially along the flow of the substrate processing described in FIG. 19. However, the flow is different from the flow of the substrate processing of the embodiment in that step S22 related to batch drying is positioned between step S20, and step S25 and step S35 of FIG. 19 is omitted. In the first modification, the substrate drying processing is performed before the substrates W are conveyed to the single wafer processing device 2. Thus, it is not necessary to perform the substrate drying processing using the single wafer processing chamber 48 after the substrates are conveyed to the single wafer processing device 2. Hereinafter, step S22 will be described.

Step S22: The plurality of substrates W (lot) for which the batch rinse processing has been completed is conveyed to the batch drying chamber DC. This conveyance is realized by the second substrate conveyance mechanism WTR acquiring the substrates from the lifter LF1. The batch drying chamber DC collectively dries the substrates W after the first batch processing.

Since the subsequent processing is slightly different from that of the embodiment, this point will be described. First, the second substrate conveyance mechanism WTR changes the orientation of the substrates that have been collectively subjected to the drying processing from the vertical orientation to the horizontal orientation. The substrates W in the horizontal orientation are conveyed to the unloading position OP by the relay conveyance mechanism OTR one by one. Then, the center robot CR conveys the substrate W at the unloading position OP to the single wafer processing chamber 48.

Figure 26:
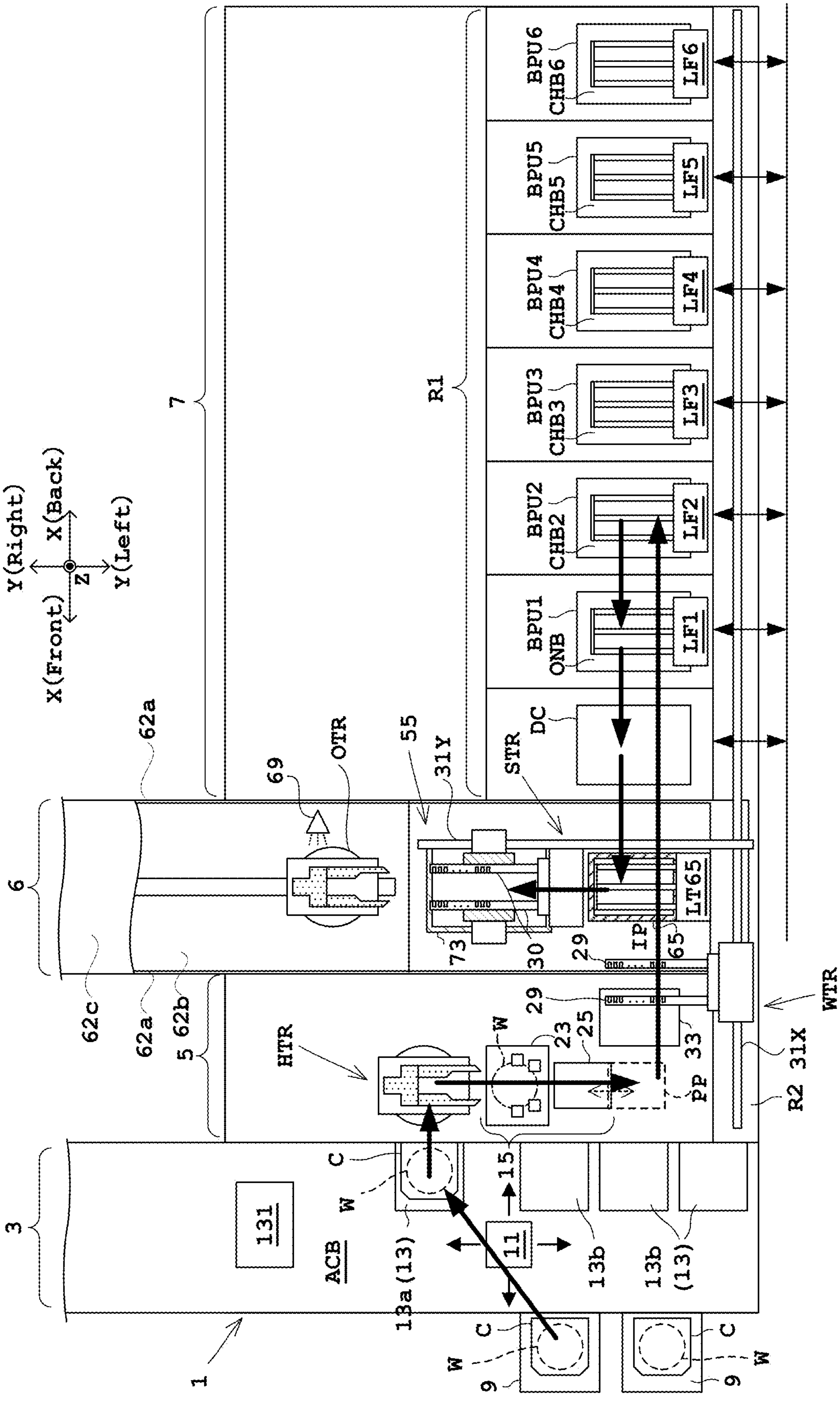
FIG. 26 is a schematic view for describing the flow of substrate processing according to a modification.

The single wafer processing chamber 48 delivers the substrate W to the center robot CR by half-rotating the vacuum chuck 213. The subsequent processing is the same as in the flow of the substrate processing of the embodiment. FIG. 26 illustrates a state in which the substrates W are conveyed via the batch drying chamber DC in the first modification.

According to the above configuration, the batch drying chamber DC that collectively dries the substrates W for which the first batch processing has been completed is provided. With this configuration, it is possible to collectively dry the substrates for which the first batch processing has been completed with less adverse effects due to the substrate drying without significantly advancing the etching of the substrates W. Thus, it is possible to provide a substrate processing system with improved throughput.

Second Modification

When the configuration of the first modification is not adopted, the batch processing device 1 can be configured by omitting the batch drying chamber DC. In such a substrate processing system, the carrier placement shelf 13*a* and the batch rinse processing tanks CHB1 to CHB6 are arrayed in the front-back direction. That is, the carrier placement shelf 13*a* is positioned in front of the batch rinse processing tank CHB1.

Third Modification

Figure 27:
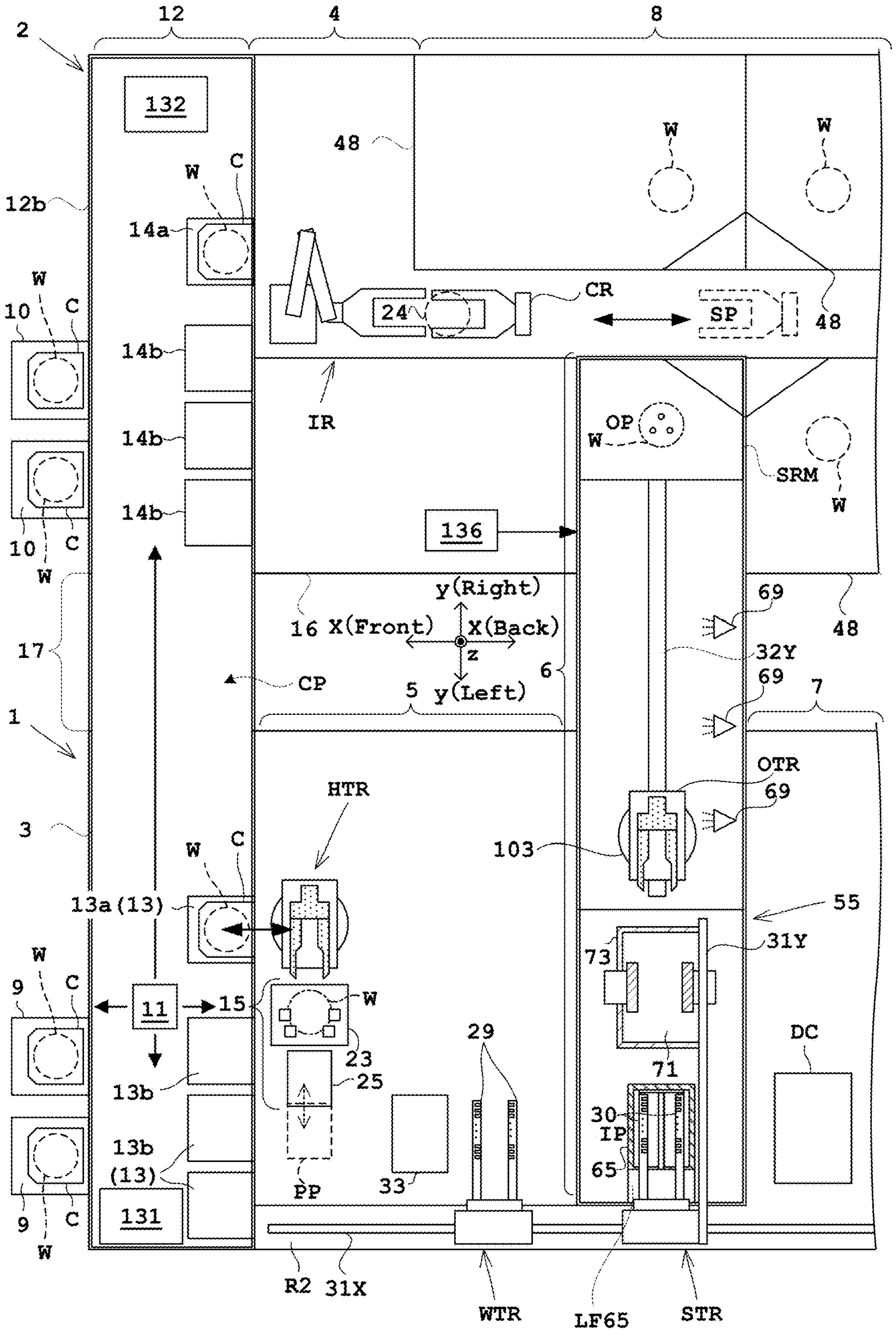
FIG. 27 is a plan view for describing an overall configuration of a substrate processing system according to a modification.

In the embodiment, the half rotation of the substrate W is realized by the single wafer processing chamber 48, but the present invention is not limited to this configuration. As illustrated in FIG. 27, a half-rotation mechanism SRM for rotating the substrate W may be provided at the unloading position OP of the relay device 6 to realize the half rotation of the substrate W. The half-rotation mechanism SRM corresponds to a rotation mechanism of the present invention. The half-rotation mechanism SRM is provided at the unloading position OP of the relay device 6, and it half-rotates the substrate W in the horizontal orientation conveyed to the unloading position OP about the vertical axis.

Figure 28A:
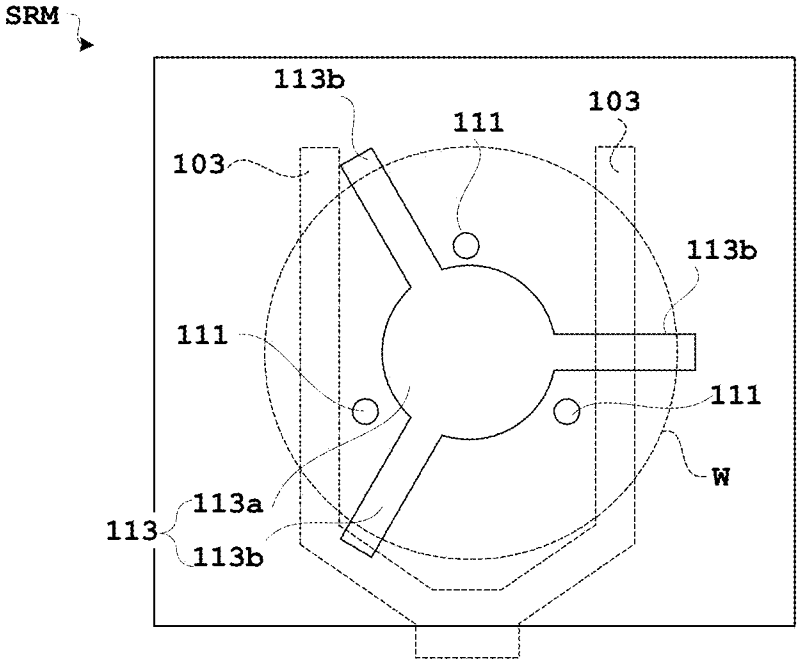
FIG. 28A is a plan view for describing a configuration of a half-rotation mechanism according to a modification of the present invention, and is also a schematic view for describing a configuration of the half-rotation mechanism according to a modification of the present invention.
Figure 28B:
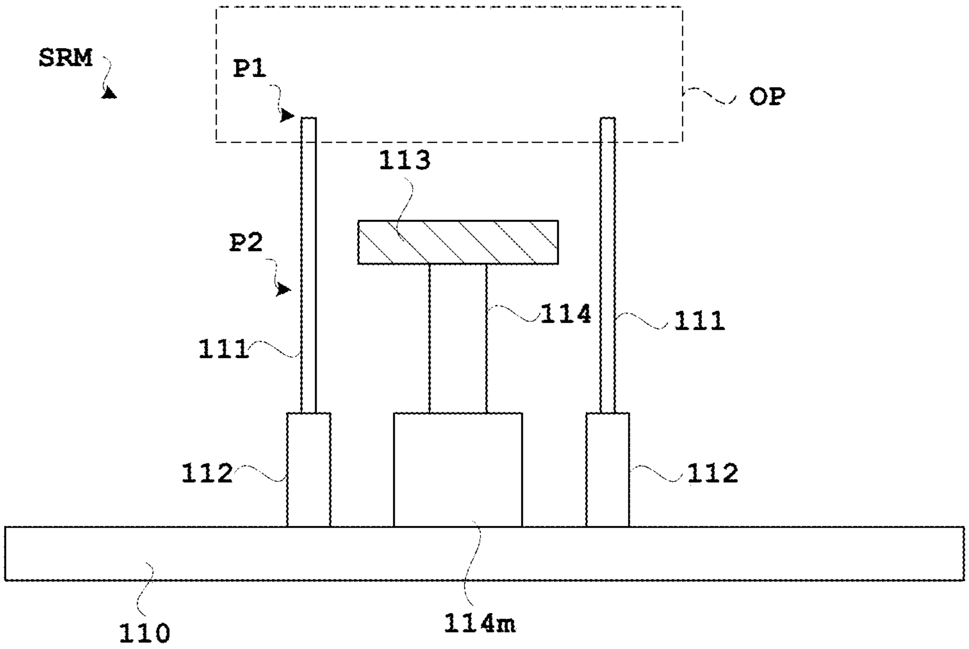
FIG. 28B is a plan view for describing a configuration of the half-rotation mechanism according to a modification of the present invention, and is also a schematic view for describing a configuration of the half-rotation mechanism according to a modification of the present invention.

FIGS. 28A and 28B specifically illustrate the half-rotation mechanism SRM. The half-rotation mechanism SRM includes a plurality of support pins 111 whose tips can move up and down between an upper first position P1 and a lower second position P2. The plurality of support pins 111 move in and out synchronously and move their tips between the first position P1 and the second position P2. The plurality of support pins 111 moves up the substrate W held by the relay conveyance mechanism OTR to the first position P1 to receive the substrate W from the relay conveyance mechanism OTR, and move the received substrate W down to a turntable 113. Hereinafter, this configuration will be described in detail.

As illustrated in FIG. 28A, the half-rotation mechanism SRM includes the turntable 113 on which the substrate W in the horizontal orientation can be placed. The turntable 113 has a disk-shaped central portion 113*a* and three extension portions 113*b* radially extending from the central portion 113*a*. The turntable 113 is rotatable about the central portion 113*a*, and the turntable 113 rotates about the Z axis. The three extension portions 113*b* rotate with the rotation of the central portion 113*a*.

Since the central portion 113*a* of the turntable 113 is provided avoiding the support pins 111, this point will be described. The support pins 111 are provided at positions away from the peripheral edge of the central portion 113*a* of the turntable 113. The three support pins 111 are provided at positions corresponding to vertexes of an equilateral triangle having the same center of gravity as the rotation center of the turntable 113, and the central portion 113*a* of the turntable 113 does not interfere with the support pins 111 even when rotating.

The extension portion 113*b* of the turntable 113 has a configuration for reliably placing the substrate W in the horizontal orientation. The support pins are provided at positions avoiding the plurality of extension portions extending from the rotation center of the turntable 113 in the initial position. The tip of the extension portion 113*b* is configured to protrude from the substrate W when the substrate W in the horizontal orientation is placed on the turntable 113, and is configured to be able to reliably support three positions of the peripheral edge of the substrate W. The extension portion 113*b* is sufficiently elongated so as to prevent interference with the support pin 111 as much as possible. When the turntable 113 is rotated, a state in which the position of the extension portion 113*b* and the position of the support pin 111 coincide with each other occurs. Since the support pin 111 is contracted in the initial state, the extension portion 113*b* does not immediately collide with the support pin 111 even when the turntable 113 is rotated. However, when the support pin 111 extends while the extension portion 113*b* is stopped at a position overlapping the support pin 111, the support pin 111 collides with the extension portion 113*b*. Thus, the turntable 113 has an angle range that cannot be stopped. Since the extension portion 113*b* in the present embodiment is sufficiently elongated, the range of this angle is as small as possible.

The support pin 111 is provided at a position that does not interfere with the relay conveyance mechanism OTR that enters above the half-rotation mechanism SRM. That is, the three support pins 111 in the initial state are positioned in a space sandwiched between a pair of blades of the second hand 103*b* positioned at the unloading position OP. With this configuration, when the support pin 111 receives the substrate W at the unloading position OP, the support pin 111 and the second hand 103*b* do not collide with each other. The support pins 111 in the initial state are positioned below the second position P2 set in the lower portion of the unloading position OP. The second position P2 is detailed in FIG. 28B.

The half-rotation mechanism SRM includes the turntable 113 capable of adjusting the position of the notch in the substrate W by rotating the substrate in the horizontal orientation one by one at the unloading position OP. FIG. 28B illustrates a more detailed configuration of the half-rotation mechanism SRM. As illustrated in FIG. 28B, the half-rotation mechanism SRM includes the turntable 113 on which the substrate W is placed, a rotation shaft 114 that rotatably supports the turntable 113 and extends in the Z direction, and a rotation shaft drive motor 114*m* that drives the rotation shaft 114. In FIG. 28B, the extension portion 113*b* of the turntable 113 is omitted. The rotation shaft drive motor 114*m* is attached to the bottom plate 110 of the half-rotation mechanism SRM.

Figure 29A:
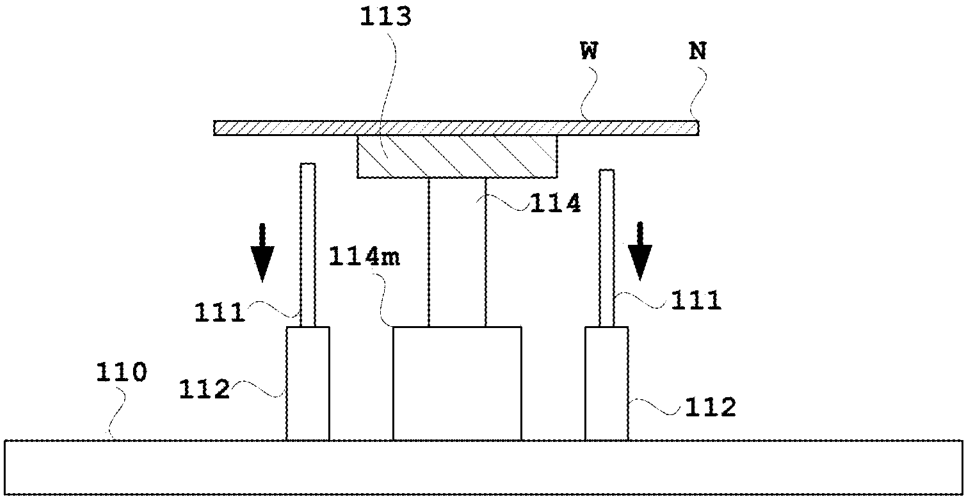
FIG. 29A is a schematic view for describing an operation of the half-rotation mechanism according to a modification of the present invention.

A support pin extensible mechanism 112 that extends and contracts the support pin 111 is provided at the base of each of the support pins 111. The support pin extensible mechanism 112 is attached to the bottom plate 110. The three support pin extensible mechanisms 112 operate synchronously to operate each of the support pins 111 while maintaining the state in which the tips of the support pins 111 have the same height. Thus, the three support pins 111 can extend and contract while supporting the substrate W in the horizontal orientation. In FIG. 29A, each of the support pins 111 is in a contracted state, and the tip of each of the support pins 111 is positioned below the turntable 113. In FIG. 29A, one support pin 111 the three support pins 111 is not illustrated.

FIG. 28A illustrates a state in which the support pin 111 is in an extended state. Then, the tip of the support pin 111 is moved to the first position P1. Since the first position P1 is positioned at the unloading position OP of the relay device 6, the half-rotation mechanism SRM is ready to receive the substrate W in the horizontal orientation from the relay conveyance mechanism OTR as the support pin 111 extends.

FIG. 29A illustrates a state in which the support pin 111 then returns to the contracted state. When the support pin 111 is contracted, the tip of the support pin 111 reaches the second position P2 below the upper surface of the turntable 113. The substrate W at this time comes into contact with the turntable 113 as the support pins 111 contract, and is not supported by the support pins 111. Thus, the substrate W is delivered from the support pins 111 to the turntable 113.

Figure 29B:
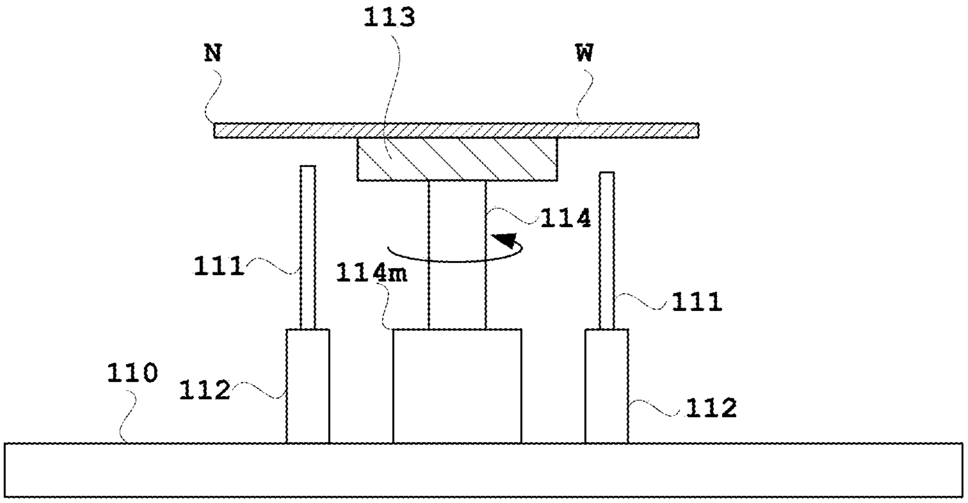
FIG. 29B is a schematic view for describing an operation of the half-rotation mechanism according to a modification of the present invention.
Figure 30A:
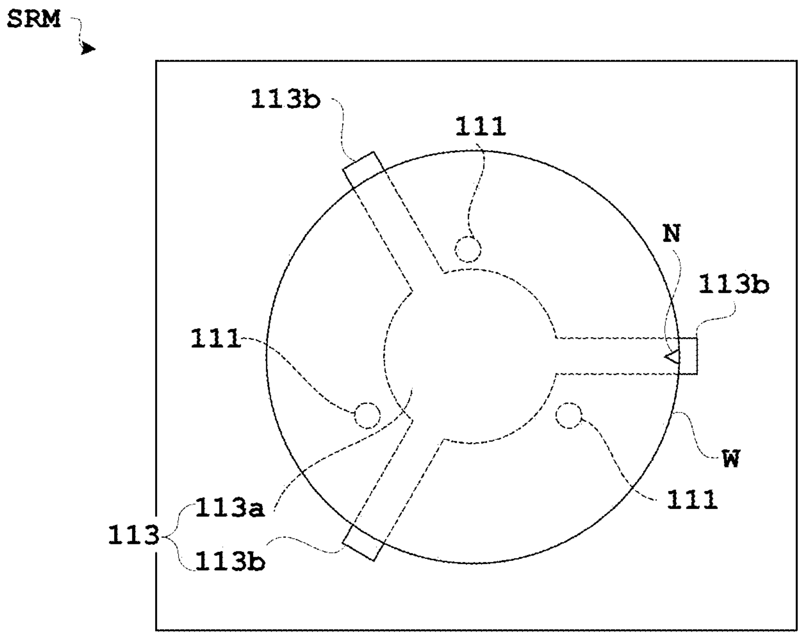
FIG. 30A is a plan view for describing an operation of the half-rotation mechanism according to a modification of the present invention.
Figure 30B:
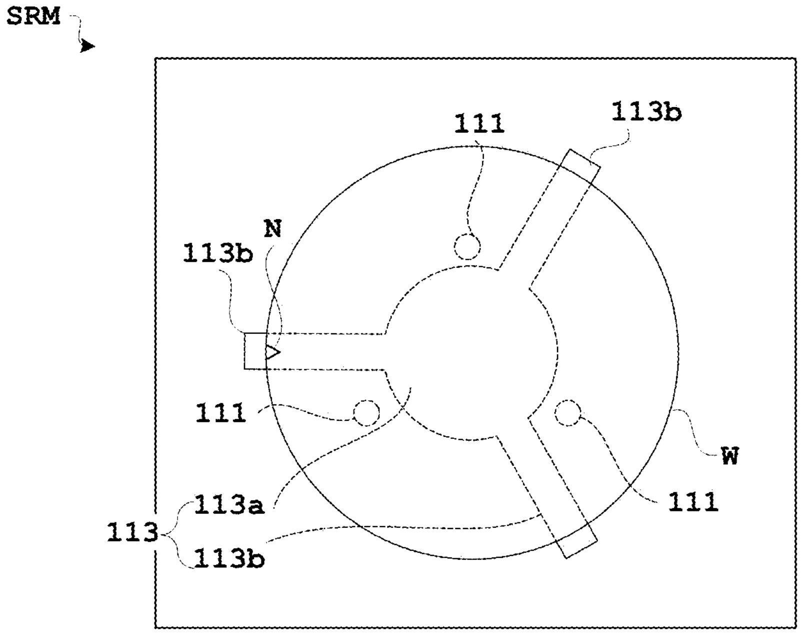
FIG. 30B is a plan view for describing an operation of the half-rotation mechanism according to a modification of the present invention.

FIG. 29B illustrates a state in which the turntable 113 is then rotated by 180°, and a notch N positioned at the right end of the substrate W is moved to the left end of the substrate W. In this manner, the position of the notch N of the second substrate W2 is changed by the half-rotation mechanism SRM. FIGS. 30A and 30B are plan views for describing step S20. FIG. 30A illustrates a state of the turntable 113 before rotation, and FIG. 30B illustrates a state of the turntable 113 after rotation. As illustrated in FIG. 30A, the extension portion **113*b* of the turntable 113 is at a position avoiding the support pins 111. This position is the initial position of the extension portion 113*b*, and the initial position is set so that the extension portion 113*b* does not collide with the support pin 111 when the support pin 111 is in the extended state. The turntable 113 is rotated by 180° about the Z axis from the state of FIG. 30A to the state of FIG. 30B. At this time, since the support pin 111 is in the contracted state, the tip of the support pin 111 does not collide with the extension portion 113*b* of the turntable 113**.

As illustrated in FIG. 30B, the extension portion **113*b* of the turntable 113 after rotation is at a position avoiding the support pins 111. This position is the position of the extension portion 113*b* after rotation operation, and the position after rotation operation is set so that the extension portion 113*b* does not collide with the support pins 111 when the support pins 111** are in the extended state.

Thereafter, the support pins 111 become in the extended state. As the support pins become the extended state, the substrate W moves up to the unloading position OP, and thus preparation for acquisition of the substrate W by the center robot CR is completed.

Figure 31:
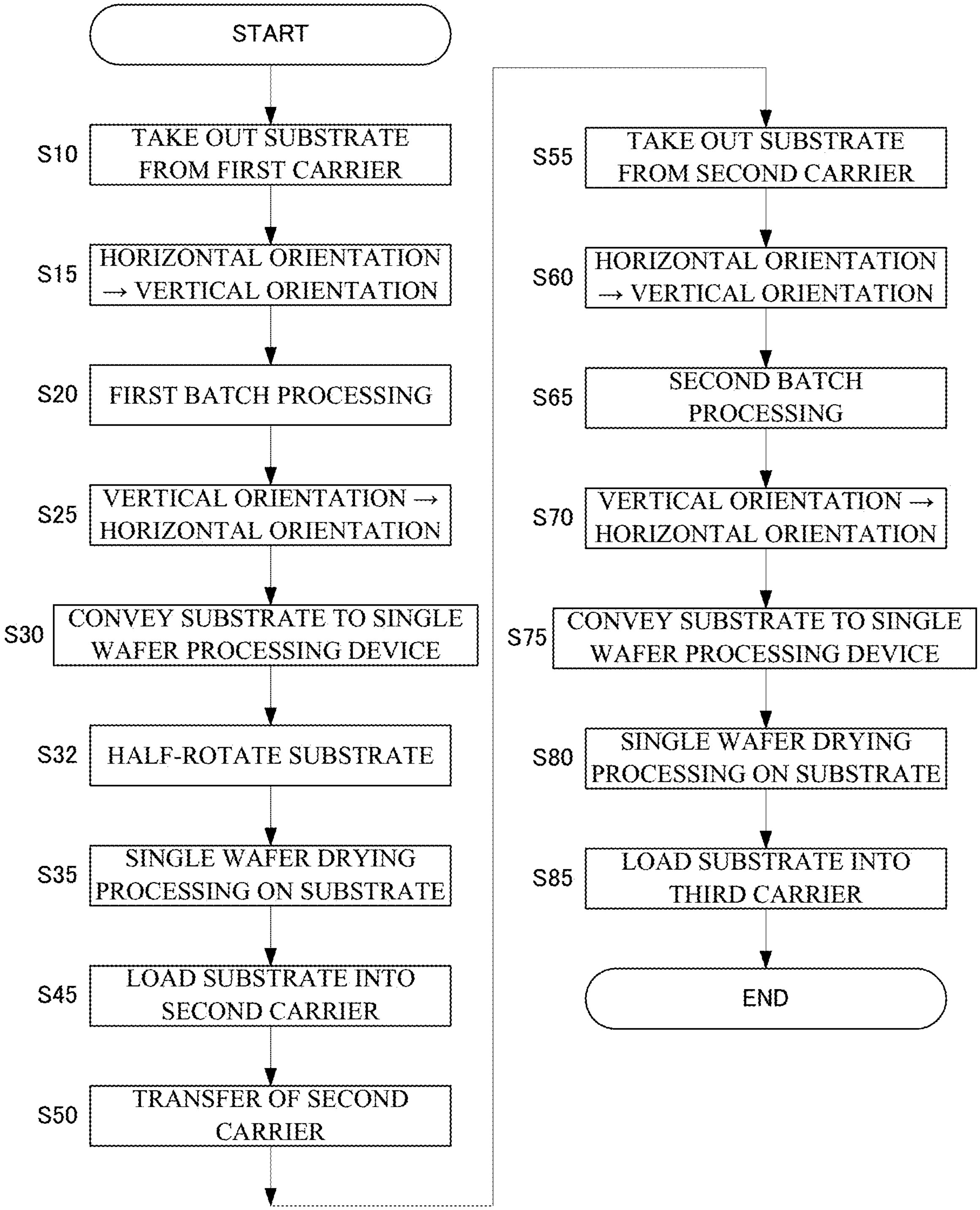
FIG. 31 is a flowchart for describing a flow of substrate processing according to a modification.

FIG. 31 is a flowchart for describing a flow of substrate processing according to a third modification. The flowchart is substantially along the flow of the substrate processing described in FIG. 19. However, the flow is different from the flow of the substrate processing of the embodiment in that step S32 related to half-rotation of the substrate W is positioned between step S30 and step S35, and step S40 of FIG. 19 is omitted. In the third modification, half rotation on the substrate W is performed before the substrate W is conveyed to the single wafer processing device 2. Thus, it is not necessary to perform half rotation of the substrate W using the single wafer processing chamber 48 after the substrate is conveyed to the single wafer processing device 2. Hereinafter, step S32 will be described.

Step S32: The substrates W in the horizontal orientation are conveyed to the unloading position OP one by one. This conveyance is realized by the relay conveyance mechanism OTR. The tips of the support pins 111 at this time are located at the first position P1. Eventually, the support pins 111 contract and move to the second position P2. The substrate W delivered to the turntable 113 is rotated by 180° by the turntable 113. Thereafter, the support pins 111 extend, and the tips of the support pins 111 are located at the first position P1. In this manner, the substrate W is moved up again to the unloading position OP, and is ready to be conveyed to the single wafer processing chamber 48 by the center robot CR.

Since the subsequent processing is slightly different from that of the embodiment, this point will be described. The substrate W received by the center robot CR from the unloading position OP is conveyed to the single wafer processing chamber 48. The single wafer processing chamber 48 dries the substrate W by spin drying. Then, the single wafer processing chamber 48 causes the center robot CR to receive the substrates W after the drying processing without changing the direction of the notches of the received substrates W. The center robot CR conveys the received substrates W to the storage path 24. The subsequent processing is the same as the flow of the substrate processing described in FIG. 19.

Figure 32:
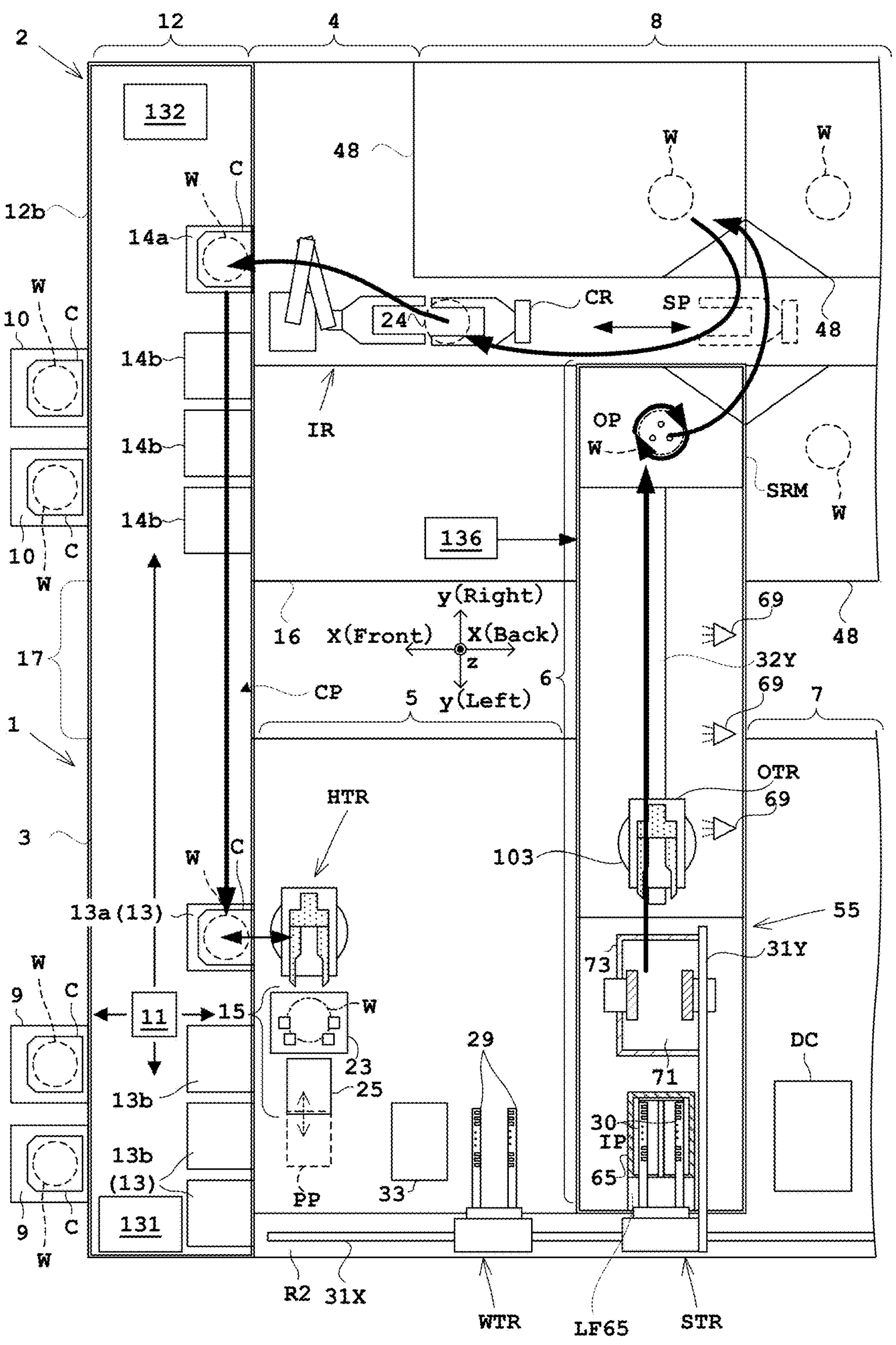
FIG. 32 is a schematic view for describing the flow of substrate processing according to a modification.

FIG. 32 illustrates a flow of the substrate W when the substrate processing system according to the third modification operates.

As described above, according to the configuration of the third modification, the rotation mechanism of the present invention is the half-rotation mechanism SRM provided at the unloading position OP of the relay device, and the half-rotation mechanism SRM half-rotates the substrate W in the horizontal orientation conveyed to the unloading position OP about the vertical axis. With this configuration, the present invention can be implemented without changing the control method of the single wafer processing chamber 48. In addition, such a configuration is suitable for a substrate processing system equipped with a single wafer processing chamber having no spin chuck.

Fourth Modification

The above embodiment includes the single wafer processing chamber 48 having the spin chuck, but the present invention is not limited to this configuration. For example, when a configuration in which half rotation of the substrate W is performed in a place other than the single wafer processing chamber 48 as in the third modification is adopted, the single wafer processing chamber having no spin chuck can be mounted on the substrate processing system of the present invention. As an example of the single wafer processing chamber having no spin chuck, there is a chamber configured to dry a substrate using a supercritical fluid. Such a single wafer processing chamber is referred to as a supercritical fluid chamber.

The supercritical fluid chamber dries the substrate W with, for example, carbon dioxide that has become a supercritical fluid. As the supercritical fluid, a fluid other than carbon dioxide may be used for drying. The supercritical state is obtained by placing carbon dioxide under inherent critical pressure and temperature. The specific pressure is 7.38 MPa, and the temperature is 31° C. In the supercritical state, the surface tension of the fluid becomes zero, and thus the gas-liquid interface does not affect the circuit pattern on the surface of the substrate W. Thus, when the substrate W is dried with the supercritical fluid, it is possible to prevent the occurrence of so-called pattern collapse in which the circuit pattern collapses on the substrate W.

According to the configuration of a fourth modification, the single wafer drying unit of the present invention dries the substrate using a supercritical fluid. With this configuration, since the substrate W can be dried without damaging the circuit formed on the device surface, a substrate processing system capable of generating a high-quality device can be provided.

Fifth Modification

In the above embodiment, the substrate W in the horizontal orientation is vertically inverted during batch processing by half rotating the substrate W, but the present invention is not limited to this configuration. The same operation may be performed by half rotating the substrate W in the vertical orientation.

Figure 33:
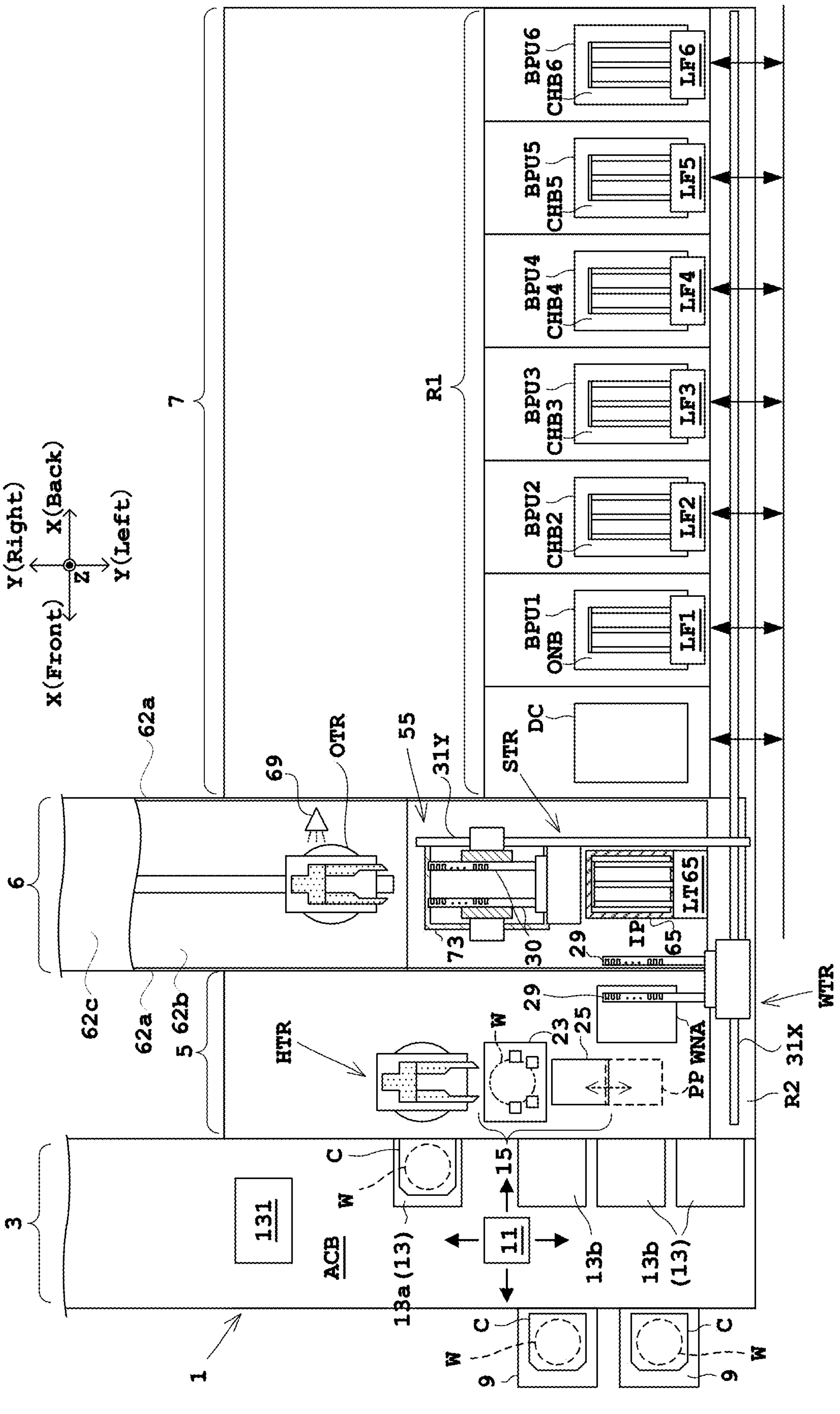
FIG. 33 is a plan view for describing an overall configuration of a batch processing device according to a modification.

FIG. 33 is a plan view of a substrate processing system according to a fifth modification. As illustrated in the drawing, the batch processing device 1 of the fifth modification is provided with a notch-array mechanism WNA. The notch-array mechanism WNA also has a function of supporting a plurality of substrates W in the vertical orientation. Thus, the dry lot support unit 33 of the embodiment is replaced with the notch-array mechanism WNA in the fifth modification. The notch-array mechanism WNA is configured to rotate the plurality of substrates W in the vertical orientation about the horizontal axis to match the positions of the notches of the substrates W. In addition to this, the notch-array mechanism WNA in the fifth modification also has a function of collectively rotating the substrates W by 180°. The rotation mechanism in the present invention corresponds to the notch-array mechanism WNA provided in the batch processing device 1 of the fifth modification. The notch-array mechanism WNA half-rotates the plurality of substrates W in the vertical orientation about the normal line and vertically inverts the plurality of substrates W. In the batch processing device 1 of the fifth modification, the carrier placement shelf 13*a*, the notch-array mechanism WNA, and the batch chemical liquid processing tank CHB2 are arrayed in the front-back direction.

Figure 34A:
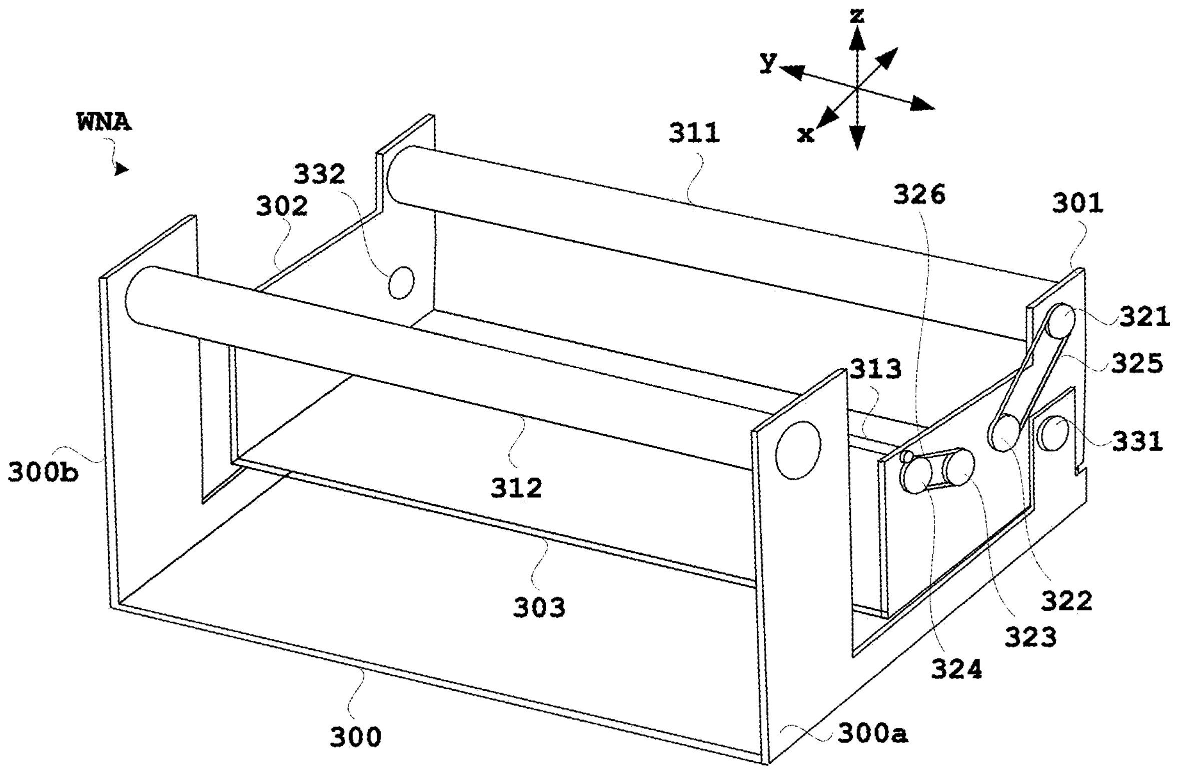
FIG. 34A is a perspective view for describing a configuration of a notch-array mechanism according to a modification of the present invention, and is also a right-side view for describing the notch-array mechanism according to a modification of the present invention.

FIG. 34A is a perspective view for describing the notch-array mechanism WNA according to the fifth modification. The notch-array mechanism WNA includes a flat plate 300 forming a bottom surface, a first side plate 301 provided at one end of the flat plate, and a second side plate 302 provided at the other end. Between the first side plate 301 and the second side plate 302, there is provided a driving roller 311 with which an end portion (bevel portion) of the substrate W in a vertical orientation can come into contact. The driving roller 311 is elongated in the direction from the first side plate 301 toward the second side plate 302, and can rotate about an axis parallel to the extending direction. As will be described later, the first side plate 301 and the second side plate 302 can rotate and move in synchronization with respect to the flat plate 300. The first side plate 301 and the second side plate 302 are configured to rotatably hold the driving roller 311, a driven roller 312, and an auxiliary roller 313 to be described later.

Protruding plates 300*a* and 300*b* extending in the vertical direction are provided at both ends of the flat plate 300. The protruding plate 300*a*, the protruding plate 300*b*, the first side plate 301, and the second side plate 302 are parallel to each other. Between the protruding plate 300*a* and the protruding plate 300*b*, there is provided the driven roller 312 with which an end portion (bevel portion) of the substrate W in the vertical orientation can come into contact. The driven roller 312 is elongated in the direction from the protruding plate 300*a* toward the protruding plate 300*b*, and can rotate about an axis parallel to the extending direction. The driving roller 311 and the driven roller 312 are parallel to each other, and the substrate W in the vertical orientation is sandwiched and held by the two rollers.

Figure 34B:
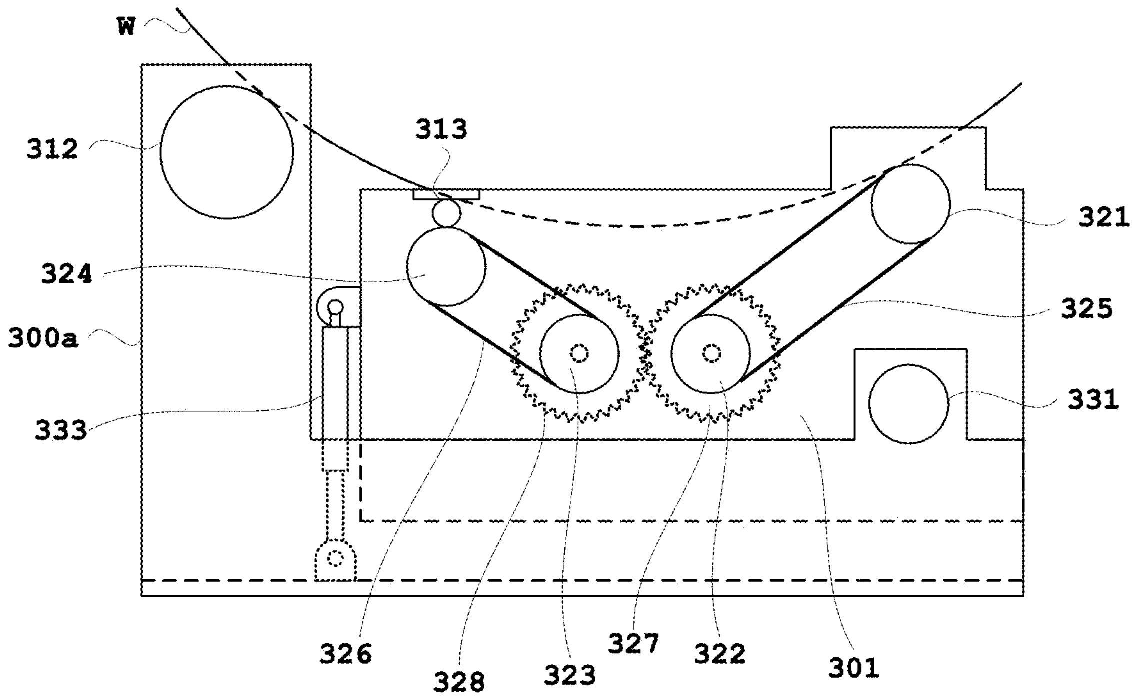
FIG. 34B is a perspective view for describing a configuration of the notch-array mechanism according to a modification of the present invention, and is also a right-side view for describing the notch-array mechanism according to a modification of the present invention.

As illustrated in FIG. 34B, the first side plate 301 has a front side and a back side, and the side of the first side plate 301 facing the second side plate 302 is the back side. Each member related to the driving roller 311 is attached to the front side. The central axis of the first pulley 321 is coupled to the central axis of the driving roller 311, and the driving roller 311 rotates according to the driving of the first pulley 321. The second pulley 322 communicates with the first pulley 321 by a first belt 325. The second pulley 322 can be rotated by a drive motor provided on the back side of the first side plate 301.

A third pulley 323 is provided on the front side of the first side plate 301. The third pulley 323 rotates in conjunction with the second pulley 322. That is, the third pulley 323 has a configuration in which the rotation axis rotates together with a common second gear 328. The second pulley 322 has a configuration in which the rotation axis rotates together with a common first gear 327. Since the first gear 327 and the second gear 328 are meshed with each other, when the drive motor provided on the first side plate 301 is operated, the rotational force transmits the first gear 327 and the second gear 328 and reaches the third pulley 323.

A fourth pulley 324 is provided on the front side of the first side plate 301. The fourth pulley 324 communicates with the third pulley 323 by a second belt 326. The auxiliary roller 313 is a friction wheel whose tip is in contact with the fourth pulley 324. The auxiliary roller 313 is a member parallel to the driving roller 311 and the driven roller 312 extending in the left-right direction.

Thus, when the drive motor provided on the first side plate 301 is operated, the first pulley 321, the second pulley 322, the third pulley 323, and the fourth pulley 324 start to rotate all at once. Accordingly, the driving roller 311 and the auxiliary roller 313 start to rotate at the same time.

A joint 331 is provided at a portion connecting the protruding plate 300*a* and the first side plate 301. The joint 331 holds the first side plate 301 such that the first side plate 301 is rotatable about the left-right axis (about an axis parallel to the direction from the first side plate 301 toward the second side plate 302) with respect to the protruding plate 300*a*.

A joint 332 is provided at a portion connecting the protruding plate 300*b* and the second side plate 302. The joint 332 holds the second side plate 302 such that the second side plate 302 is rotatable about the left-right axis (about an axis parallel to the direction from the first side plate 301 toward the second side plate 302) with respect to the protruding plate 300*b*.

The first side plate 301 and the second side plate 302 are integrated by a coupling plate 303 parallel to the flat plate 300. Thus, the first side plate 301 and the second side plate 302 can rotate about the joint 331 and the joint 332 synchronously about the left-right axis.

An extensible rod 333 is a member that couples the first side plate 301 and the flat plate 300. The extensible rod 333 includes a hydraulic cylinder, and it can extend and contract under the control of the controller. The initial state of the extensible rod 333 is a contracted state, which brings the coupling plate 303 and the flat plate 300 in a parallel positional relationship. When the extensible rod 333 is extended from this state, the coupling plate 303 and the flat plate 300 are in an inclined positional relationship. The notch-array mechanism WNA delivers and receives the substrate to and from the second substrate conveyance mechanism WTR when the coupling plate 303 is in the initial state parallel to the flat plate 300.

The operation of the notch-array mechanism WNA will be described. FIG. 34B illustrates the notch-array mechanism WNA in the initial state in which the extensible rod 333 is in the contracted state. When the second substrate conveyance mechanism WTR has delivered the lot to the notch-array mechanism WNA, the substrate W is sandwiched between the driving roller 311 and the driven roller 312 as illustrated in FIG. 34B. In this state, the auxiliary roller 313 is not in contact with the end portion (bevel portion) of the substrate W.

Figure 35:
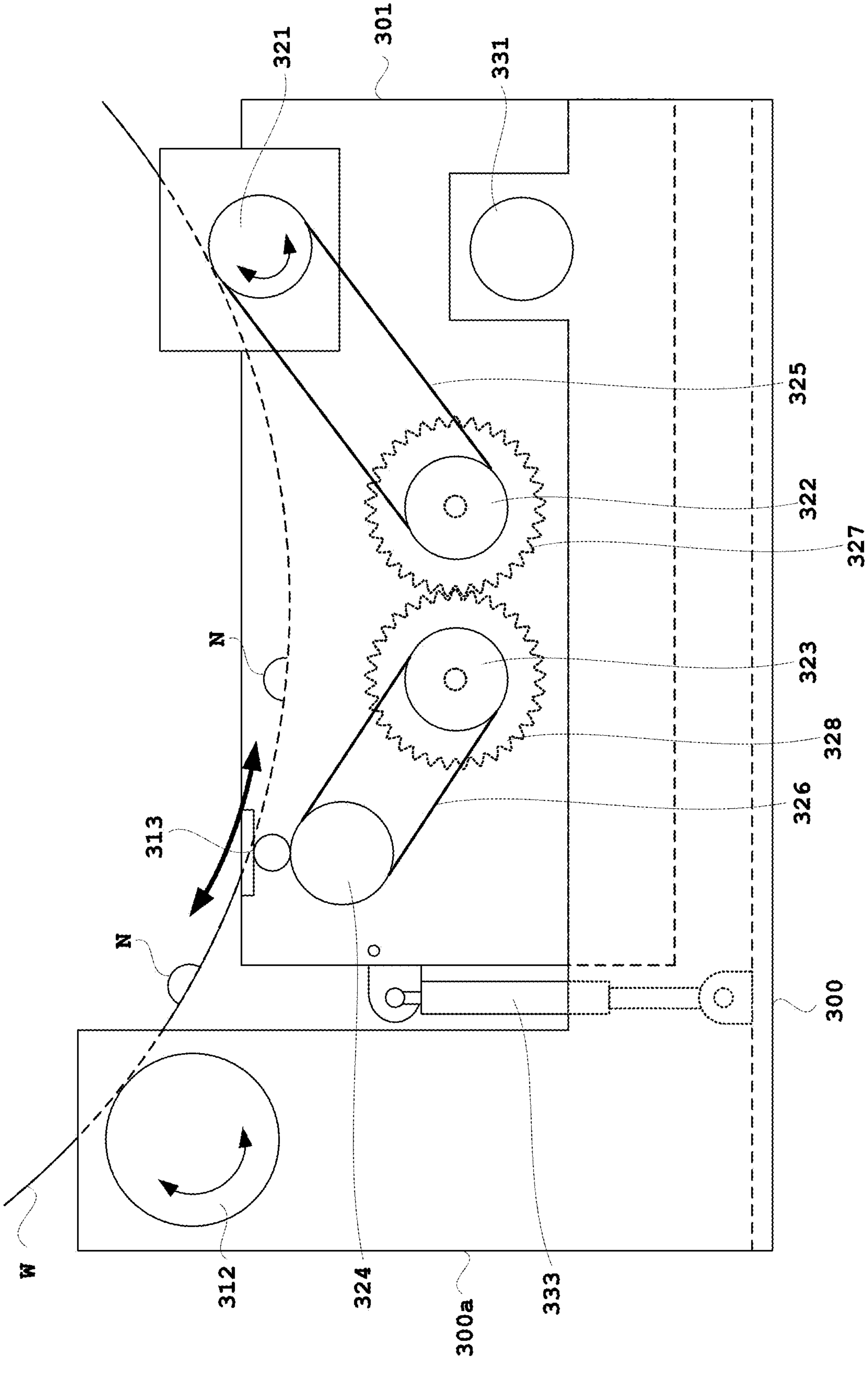
FIG. 35 is a right-side view illustrating an initial state of the notch-array mechanism according to a modification of the present invention.

FIG. 35 illustrates a state in which the driving roller 311 rotates in the initial state. It is assumed that the driving roller 311 rotates after the substrate W is delivered to the notch-array mechanism WNA. Then, the end portion (bevel portion) of the substrate W in contact with the driving roller 311 is guided by the driving roller 311, and the substrate W rotates about the central axis (about the normal line: about the horizontal axis). Then, with the rotation of the substrate W, the driven roller 312 in contact with the end portion (bevel portion) of the substrate W also starts to rotate. In this manner, the driven roller 312 can hold one end of the rotating substrate W.

At this time, the notch N provided in the substrate W can freely move around the auxiliary roller 313. This is because the auxiliary roller 313 is not in contact with the end portion (bevel portion) of the substrate W.

Figure 36:
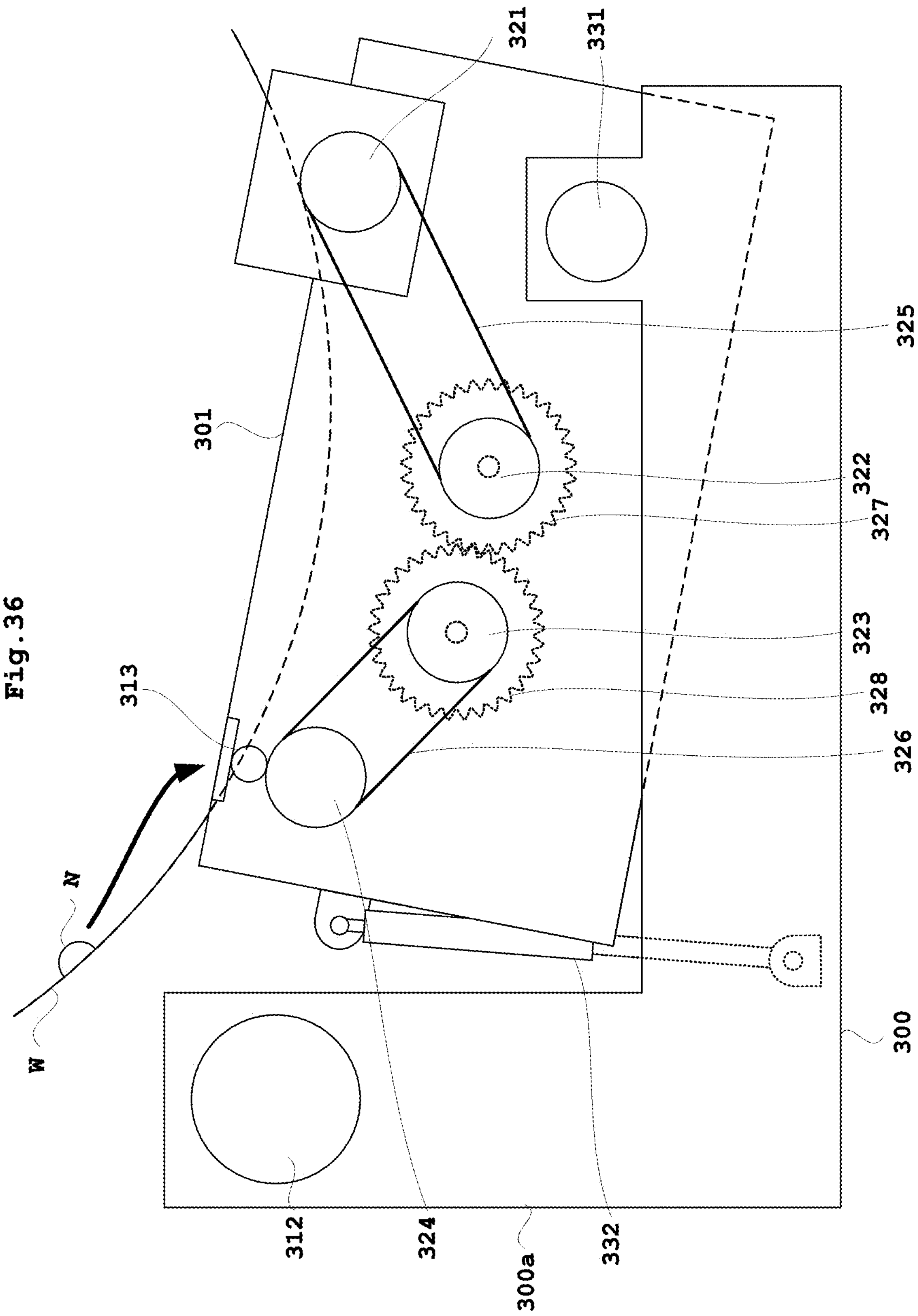
FIG. 36 is a right-side view for describing an operation of the notch-array mechanism according to a modification of the present invention.

FIG. 36 illustrates the notch-array mechanism WNA when notch-array processing of matching the positions of the notches N in the substrates W is executed. To match the positions of the notches N, first, the extensible rod 333 is extended, and the first side plate 301 is inclined with respect to the flat plate 300. Then, the substrate W is separated from the driven roller 312 and comes into contact with the auxiliary roller 313. When the drive motor is operated in this state, the substrate W rotates about the central axis as described with reference to FIG. 35.

Figure 37A:
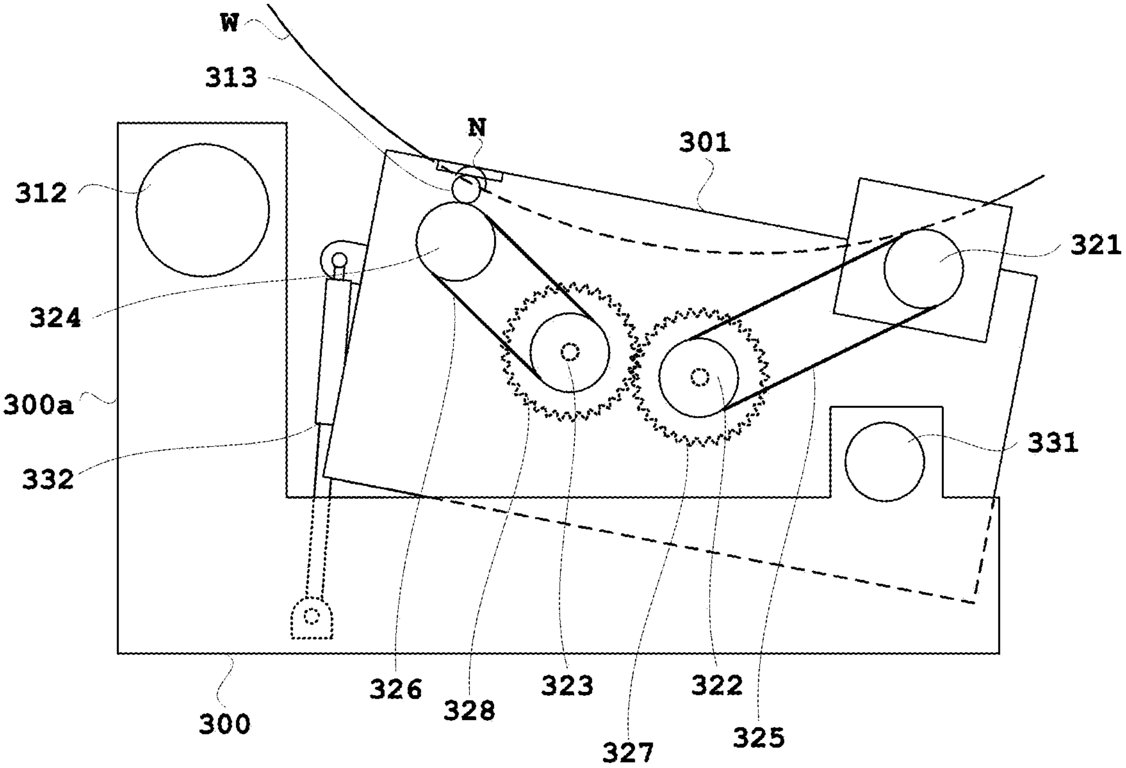
FIG. 37A is a right-side view for describing an operation of the notch-array mechanism according to a modification of the present invention.

However, as illustrated in FIG. 37A, since the auxiliary roller 313 is designed to be sufficiently small, the notch N that tries to pass the auxiliary roller 313 cannot pass the auxiliary roller 313, and further rotation of the substrate W is prohibited. That is, the auxiliary roller 313 is caught in the notch N, and the substrate W cannot rotate. While doing so, the driving roller 311 tries to rotate the substrate W, but the substrate W slips with respect to the driving roller 311 and does not rotate after all.

Under such circumstances, when the driving roller 311 is rotated, all of the substrates W constituting the lot stop the rotation. This is because the notch N of each substrate W is captured by the auxiliary roller 313 and cannot move freely. In this manner, the direction of the notch of each substrate W becomes constant. That is, the position of the notch N of each substrate W coincides with the position of the auxiliary roller 313.

Figure 37B:
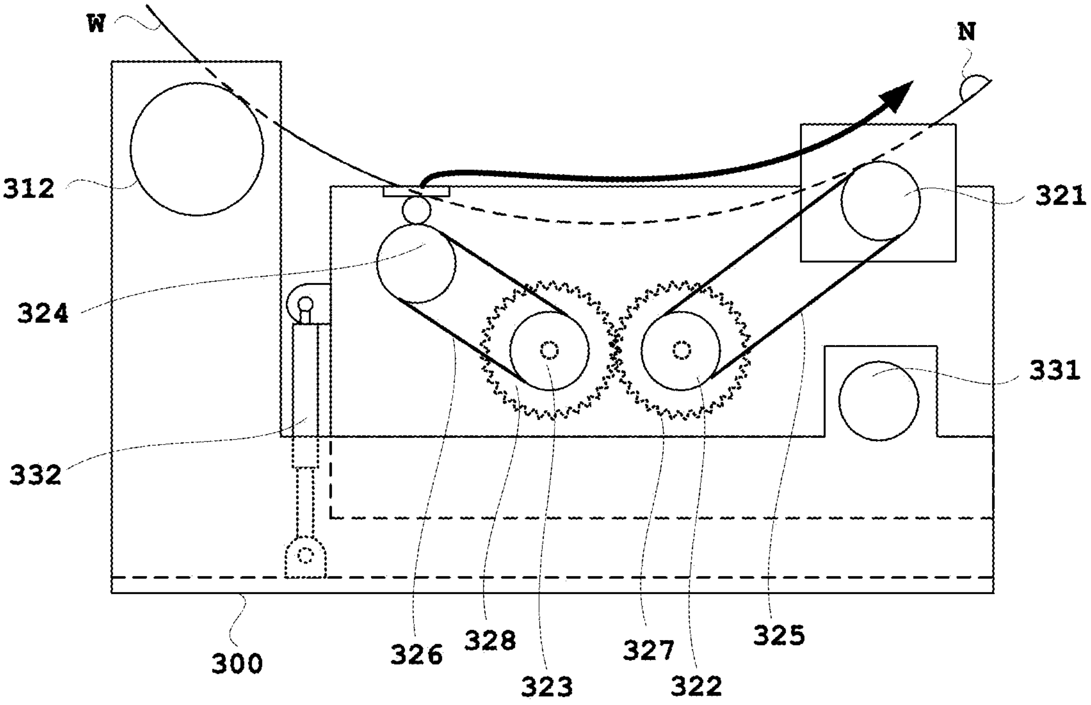
FIG. 37B is a right-side view for describing an operation of the notch-array mechanism according to a modification of the present invention.

FIG. 37B illustrates the operation of half-rotating the substrates W constituting the lot. To half-rotate the substrates W, it is sufficient to place the lot on the notch-array mechanism WNA in the initial state and rotate the driving roller 311 a predetermined number of times. With this operation, the substrate W is guided by the driving roller 311 to half rotate. It is preferable to perform the operation according to FIGS. 35, 36, and 37A in advance when the substrate W is half-rotated, but this pre-operation is not necessarily performed.

Figure 38:
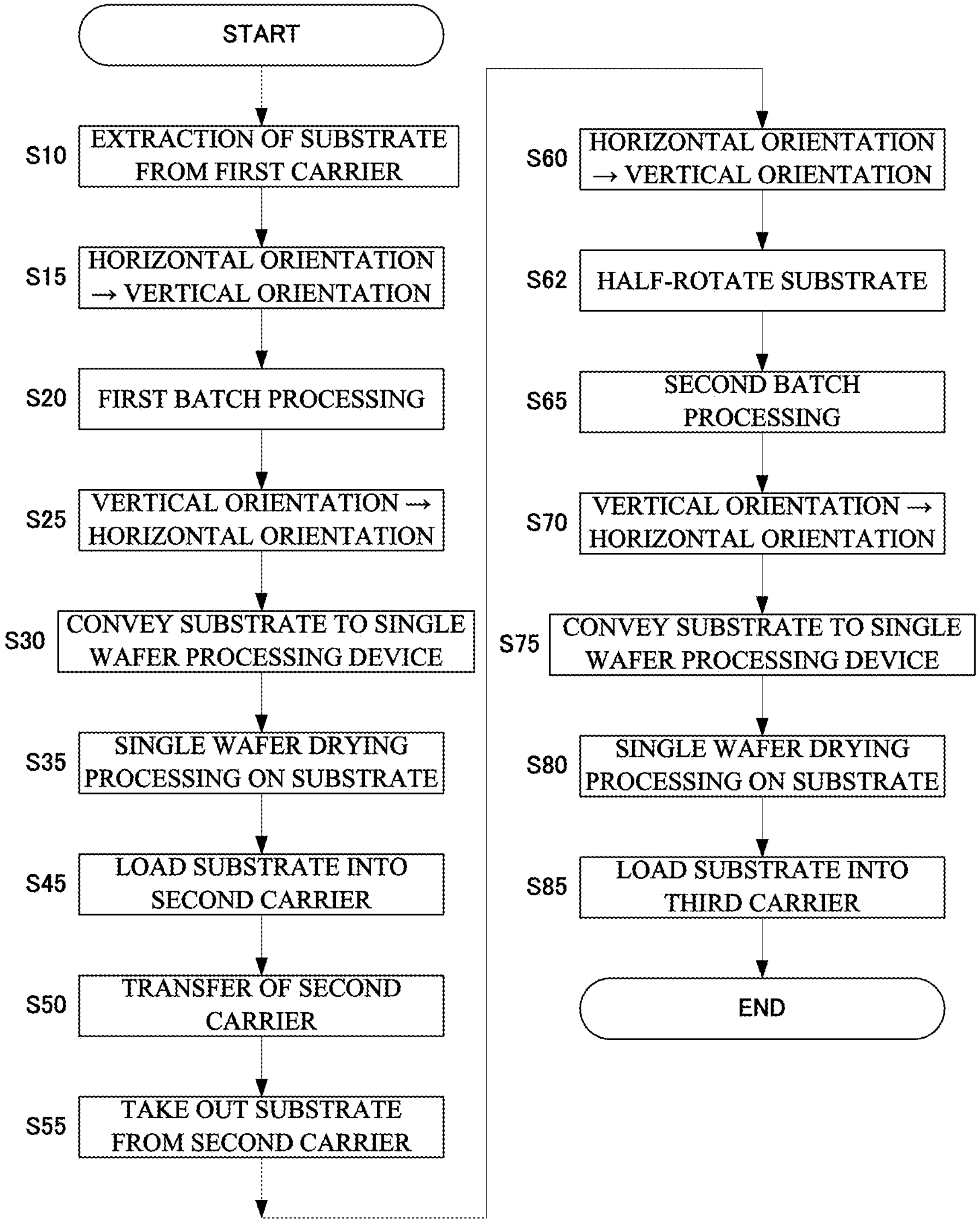
FIG. 38 is a flowchart for describing a flow of substrate processing according to a modification of the present invention.

FIG. 38 is a flowchart illustrating a flow of substrate processing according to the fifth modification. The flowchart is substantially along the flow of the substrate processing described in FIG. 19. However, the flow is different from the flow of the substrate processing of the embodiment in that step S62 related to half-rotation of the substrate W is positioned between step S60, and step S65 and step S40 of FIG. 19 is omitted. The fifth modification has a configuration in which half rotation is performed on the substrate W acquired from the second carrier C2. Thus, it is not necessary to perform half rotation of the substrate W using the single wafer processing chamber 48 before the substrate is conveyed to the second carried C2. Hereinafter, step S62 will be described.

Step S62: The second substrate conveyance mechanism WTR delivers the plurality of substrates W (lot) in the vertical orientation to the notch-array mechanism WNA. The notch-array mechanism WNA half-rotates the substrates W to adjust the position of the notches. The second substrate conveyance mechanism WTR receives the plurality of substrates W (lot) for which the half-rotation processing has been completed, from the notch-array mechanism WNA, and conveys the substrates W to the lifter LF2.

Since the subsequent processing is slightly different from that of the embodiment, this point will be described. The single wafer processing chamber 48 dries the substrates W by spin drying in step S80. Then, the single wafer processing chamber 48 causes the center robot CR to receive the substrates W after the drying processing without changing the direction of the notches of the received substrates W. The center robot CR conveys the received substrates W to the storage path 24. The subsequent processing is the same as the flow of the substrate processing described in FIG. 19.

Figure 39:
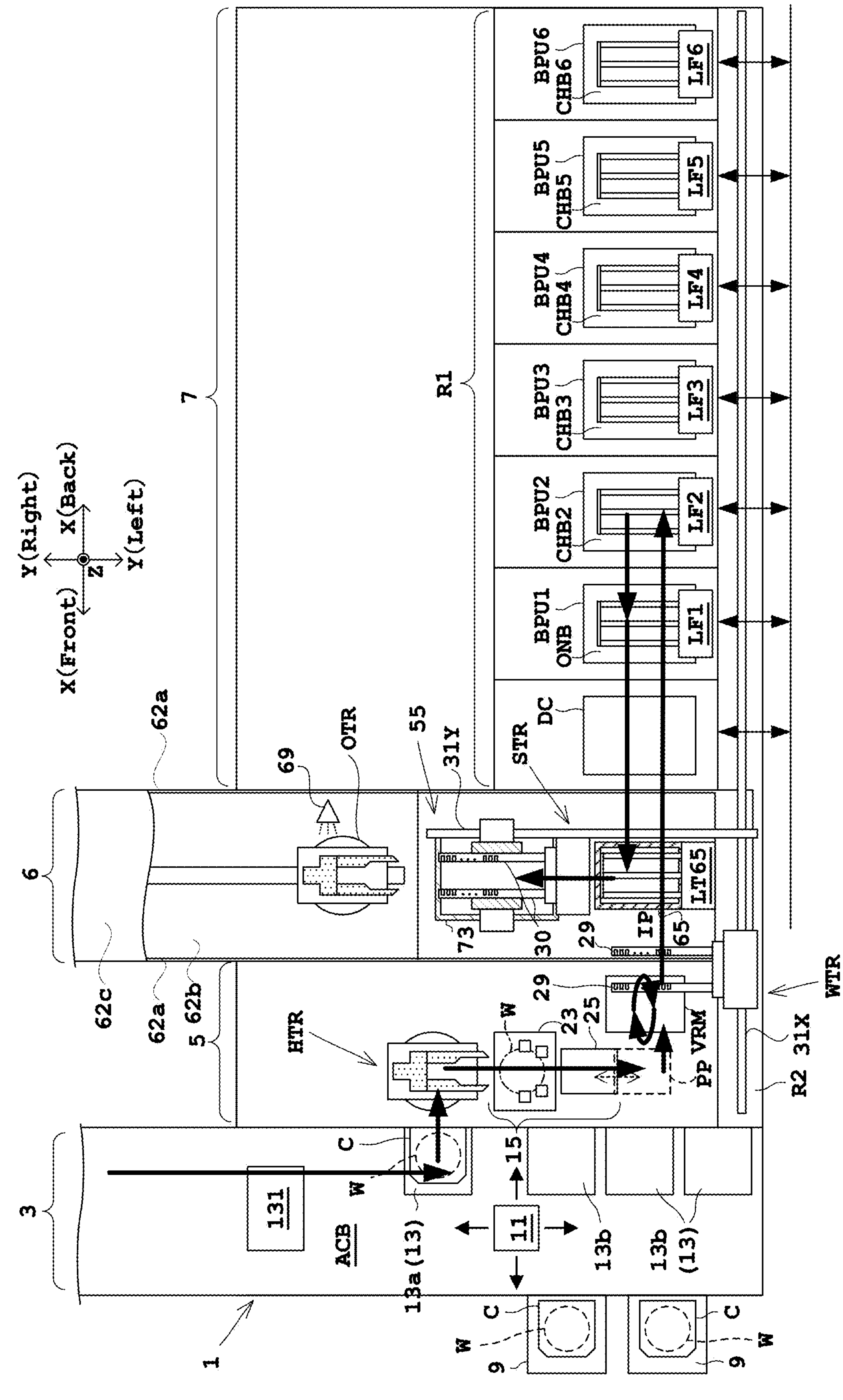
FIG. 39 is a schematic view for describing a flow of substrate processing according to a modification of the present invention.

FIG. 39 illustrates a flow of the substrate W when the substrate processing system according to the fifth modification operates.

In this manner, according to the configuration of the fifth modification, the notch-array mechanism WNA is provided in the batch processing device 1, and the notch-array mechanism WNA half-rotates the plurality of substrates W in the vertical orientation about the horizontal axis to vertically invert the plurality of substrates W. With this configuration, the time required to half-rotate the substrate W can be shortened, and thus a substrate processing system with improved throughput can be provided.

Sixth Modification

Figure 40:
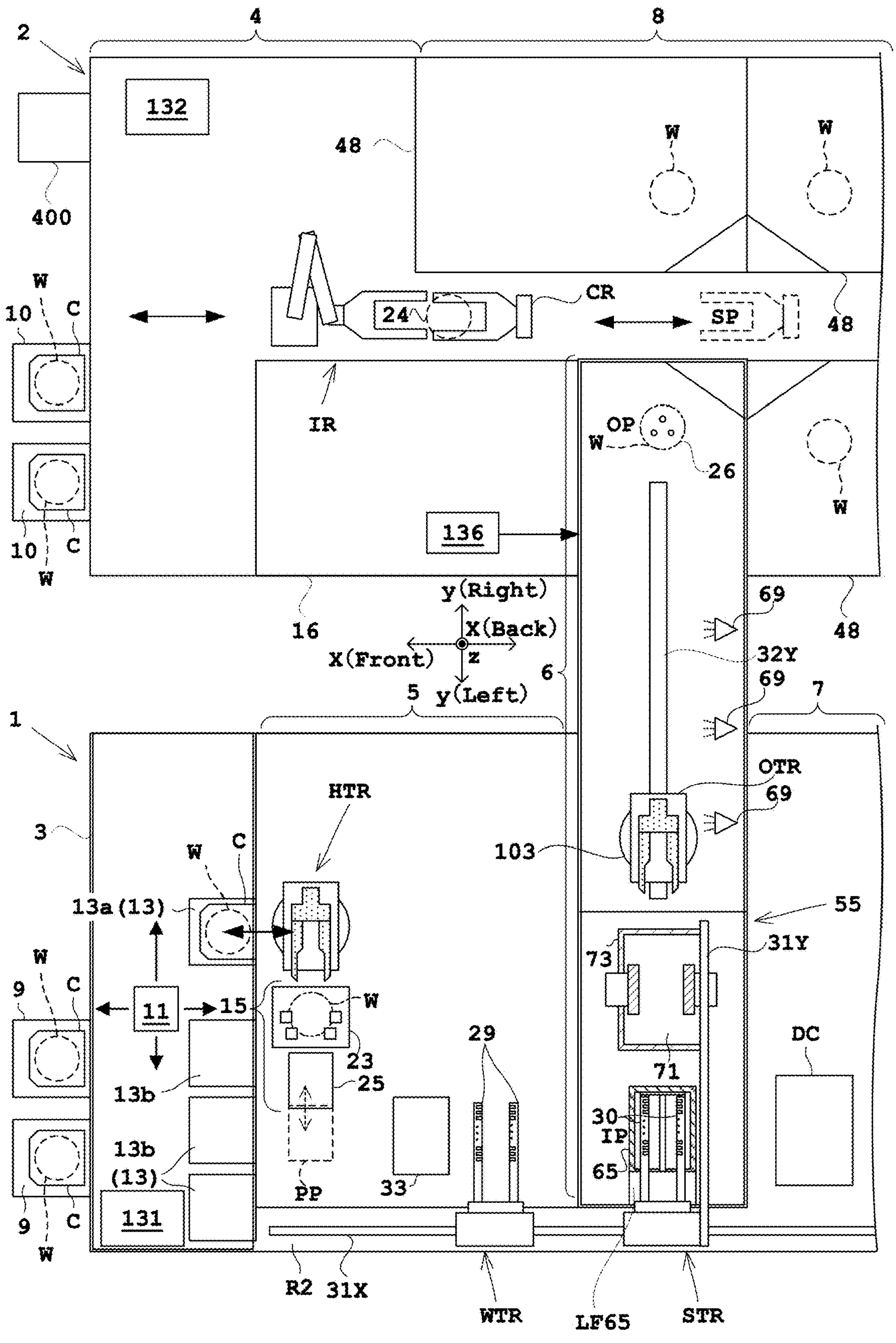
FIG. 40 is a plan view for describing an overall configuration of a substrate processing system according to a modification of the present invention.

In the above embodiment, the carrier C is transferred between the carrier placement shelf 13*a* and the carrier placement shelf 14*a* built in the substrate processing system, but the present invention is not limited to this configuration. As illustrated in FIG. 40, the single wafer processing device 2 does not have to include the carrier block 12. According to this configuration, the indexer robot IR can move forward and backward in the front-back direction. The substrate W for which the single wafer processing has been completed is stored in an empty carrier C placed in the second load port 10 by the indexer robot IR. The transfer of the second carrier C2 described in step S50 of FIG. 19 is realized by receiving the second carrier C2 from the second load port 10 and placing the second carrier C2 onto the first load port 9. Thus, the second load port 10 in a sixth modification corresponds to a second placement unit of the present invention.

The transfer of the second carrier C2 is performed by the carrier transfer mechanism 400 illustrated in FIG. 40. The carrier transfer mechanism 400 is a crane mechanism capable of moving the carrier C in the left-right direction, and it is controlled by the controller described in the embodiment. Instead of the carrier transfer mechanism 400, the second carrier C2 may be transferred by a carrier transfer robot installed in the plant, or the second carrier C2 may be manually transferred.

What is claimed is:

1. A substrate processing system that performs substrate processing, the substrate processing system comprising:

a batch processing device that performs batch processing of collectively processing a plurality of substrates;

a single wafer processing device that performs single wafer processing of processing the substrates one by one;

a relay device that conveys the substrates for which the batch processing has been completed from the batch processing device to the single wafer processing device; and a controller that controls the batch processing device, the single wafer processing device, and the relay device, wherein the batch processing device includes:

at least one batch processing tank;

a first placement unit capable of placing a carrier that stores the plurality of substrates in a horizontal orientation at predetermined intervals in a vertical direction;

a substrate acquisition and conveyance mechanism that takes out the substrates from the carrier placed on the first placement unit;

a first orientation changing mechanism that changes an orientation of the substrates taken out from the carrier by the substrate acquisition and conveyance mechanism from the horizontal orientation to a vertical orientation; and a lifter that can collectively immerse, in the batch processing tank, the plurality of substrates whose orientation has been changed into the vertical orientation by the first orientation changing mechanism, the single wafer processing device includes:

a single wafer drying unit that can dry, one by one, the substrates in the horizontal orientation for which the batch processing has been completed;

a second placement unit on which the carrier can be placed; and a storage and conveyance mechanism that loads the substrates in the horizontal orientation into the carrier placed on the second placement unit, the relay device includes:

a second orientation changing mechanism that changes the orientation of the substrates received from the batch processing device from the vertical orientation to the horizontal orientation; and a relay conveyance mechanism capable of conveying the substrates whose orientation has been changed into the horizontal orientation by the second orientation changing mechanism to the single wafer processing device one by one, the controller:

controls the substrate acquisition and conveyance mechanism to take out the substrates from the first carrier placed on the first placement unit;

controls the first orientation changing mechanism to change the orientation of the substrates taken out from the first carrier from the horizontal orientation to the vertical orientation;

controls the lifter to collectively immerse, in the batch processing tank, the plurality of substrates whose orientation has been changed into the vertical orientation and perform first batch processing;

controls the second orientation changing mechanism to change the orientation of the substrates for which the first batch processing has been performed from the vertical orientation to the horizontal orientation;

controls the relay conveyance mechanism to convey the substrates whose orientation has been changed into the horizontal orientation from the batch processing device to the single wafer processing device;

controls the storage and conveyance mechanism to load the substrates in the horizontal orientation conveyed to the single wafer processing device into a second carrier placed on the second placement unit;

when the second carrier storing the substrates for which the first batch processing has been performed is placed on the first placement unit of the batch processing device, controls the substrate acquisition and conveyance mechanism to take out the substrates from the second carrier placed on the first placement unit;

controls the first orientation changing mechanism to change the orientation of the substrates taken out from the second carrier from the horizontal orientation to the vertical orientation;

controls the lifter to collectively immerse, in the batch processing tank, the plurality of substrates whose orientation has been changed into the vertical orientation and perform second batch processing;

controls the second orientation changing mechanism to change the orientation of the substrates for which the second batch processing has been performed from the vertical orientation to the horizontal orientation;

controls the relay conveyance mechanism to convey the substrates whose orientation has been changed into the horizontal orientation from the batch processing device to the single wafer processing device;

controls the single wafer drying unit to dry, one by one, the substrates in the horizontal orientation conveyed to the single wafer processing device; and controls the storage and conveyance mechanism to perform a series of operations of loading the substrates in the horizontal orientation for which the drying processing has been performed into a third carrier placed on the second placement unit, the substrate processing system further comprises a rotation mechanism that rotates the substrates around a normal line of the substrates, and the controller controls, after the first batch processing and before the second batch processing, the rotation mechanism to perform the second batch processing with the orientation of the substrates being vertically inverted with respect to the orientation of the substrates in the first batch processing.

2. The substrate processing system according to claim 1, wherein the batch processing tank includes a jetting port that jets a fluid at a bottom, and in the first batch processing and the second batch processing, the controller controls the batch processing tank to jet the fluid from the bottom and stir a processing liquid held in the batch processing tank up and down.

3. The substrate processing system according to claim 1, further comprising a carrier conveyance mechanism that conveys the second carrier from the second placement unit to the first placement unit.

4. The substrate processing system according to claim 1, wherein the controller controls the single wafer drying unit to dry, one by one, the substrates whose orientation has been changed into the horizontal orientation after the first batch processing, the substrates having been conveyed to the single wafer processing device.

5. The substrate processing system according to claim 1, wherein the batch processing device includes a batch drying unit that collectively dries the substrates for which the first batch processing has been completed, and the controller:

controls the batch drying unit to collectively dry the substrates after the first batch processing; and controls the second orientation changing mechanism to change the orientation of the substrates that have been collectively subjected to the drying processing from the vertical orientation to the horizontal orientation.

6. The substrate processing system according to claim 5, wherein the relay conveyance mechanism includes a first hand that acquires a dried substrate and a second hand that acquires a substrate before drying.

7. The substrate processing system according to claim 1, wherein the rotation mechanism is configured by a spin chuck of a single wafer processing chamber provided in the single wafer processing device, and the spin chuck delivers the substrates in the horizontal orientation that have been received by the spin chuck to the storage and conveyance mechanism by half-rotating the substrates in the horizontal orientation about a vertical axis.

8. The substrate processing system according to claim 1, wherein the single wafer drying unit is configured by a single wafer processing chamber provided in the single wafer processing device, and the single wafer processing chamber dries the substrates by spin drying.

9. The substrate processing system according to claim 1, wherein the rotation mechanism is provided at an unloading position of the relay device, and the rotation mechanism half-rotates the substrates in the horizontal orientation conveyed to the unloading position about a vertical axis.

10. The substrate processing system according to claim 9, wherein the single wafer drying unit dries the substrates using a supercritical fluid.

11. The substrate processing system according to claim 1, wherein the rotation mechanism is provided at the batch processing device, and the rotation mechanism vertically inverts the plurality of substrates in the vertical orientation by half-rotating the plurality of the substrates about a horizontal axis.

12. The substrate processing system according to claim 1, wherein the single wafer processing device includes a path on which the substrates in the horizontal orientation can be placed, the storage and conveyance mechanism includes:

a first robot capable of accessing an unloading position of the relay device, the single wafer drying unit, and the path; and a second robot capable of accessing the path and the second placement unit, and the first robot is provided at a position surrounded by the substrate drying unit.

13. The substrate processing system according to claim 1, wherein the first placement unit and the batch processing tank in the batch processing device are disposed in a front-back direction, a loading position in the relay device and an unloading position in the relay device are disposed in a left-right direction orthogonal to the front-back direction, and the second placement unit and the single wafer drying unit in the single wafer processing device are disposed in the front-back direction.

14. The substrate processing system according to claim 5, wherein the first placement unit, the batch drying unit, and the batch processing tank in the batch processing device are disposed in a front-back direction, a loading position in the relay device and an unloading position in the relay device are disposed in a left-right direction orthogonal to the front-back direction, and the second placement unit and the single wafer drying unit in the single wafer processing device are disposed in the front-back direction.

15. The substrate processing system according to claim 11, wherein the first placement unit, the rotation mechanism, and the batch processing tank in the batch processing device are disposed in a front-back direction, a loading position in the relay device and an unloading position in the relay device are disposed in a left-right direction orthogonal to the front-back direction, and the second placement unit and the single wafer drying unit in the single wafer processing device are disposed in the front-back direction.

* * * * *